US008493400B2

(12) United States Patent
Sato

(10) Patent No.: US 8,493,400 B2
(45) Date of Patent: Jul. 23, 2013

(54) MEMORY DEVICE AND MEMORY CONTROL FOR CONTROLLING THE SAME

(75) Inventor: Takahiko Sato, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 187 days.

(21) Appl. No.: 12/981,075

(22) Filed: Dec. 29, 2010

(65) Prior Publication Data

US 2011/0128810 A1   Jun. 2, 2011

Related U.S. Application Data

(63) Continuation of application No. PCT/JP2008/001702, filed on Jun. 30, 2008.

(51) Int. Cl.
*G06F 12/06* (2006.01)
*G06F 12/02* (2006.01)

(52) U.S. Cl.
USPC .......................... 345/573; 345/567; 345/572

(58) Field of Classification Search
USPC ................. 345/530, 531, 533, 534, 564, 567, 345/570–573
See application file for complete search history.

(56) References Cited

U.S. PATENT DOCUMENTS

| 4,387,370 A * | 6/1983 | Katagi ............................. 345/12 |
| 5,142,637 A | 8/1992 | Harlin et al. |
| 5,214,611 A * | 5/1993 | Shigehara et al. ....... 365/189.12 |
| 5,293,540 A * | 3/1994 | Trani et al. .................... 348/584 |
| 5,706,243 A | 1/1998 | Mori |
| 5,815,136 A * | 9/1998 | Ikeda et al. ..................... 345/98 |
| 5,973,993 A * | 10/1999 | Morgan ......................... 365/236 |
| 6,543,027 B1 * | 4/2003 | Hughes et al. ................ 714/799 |
| 7,002,587 B2 * | 2/2006 | Kondo et al. .................. 345/531 |
| 7,525,577 B2 * | 4/2009 | Nakazono et al. ......... 348/231.3 |
| 8,098,313 B2 * | 1/2012 | Asahi ............................. 348/308 |
| 2004/0164322 A1 | 8/2004 | Kondo et al. |
| 2006/0290983 A1 | 12/2006 | Takeda et al. |

FOREIGN PATENT DOCUMENTS

| JP | 02-250132 A | 10/1990 |
| JP | 05-054657 A | 3/1993 |
| JP | 05-334426 A | 12/1993 |
| JP | 06-243675 A | 9/1994 |
| JP | 08-96572 A | 4/1996 |
| JP | 08-190372 A | 7/1996 |
| JP | 2004-192110 A | 7/2004 |
| JP | 2005-116128 A | 4/2005 |
| JP | 2006-323604 A | 11/2006 |
| JP | 2007-251865 A | 9/2007 |
| JP | 2008-048178 A | 2/2008 |

* cited by examiner

*Primary Examiner* — Joni Richer
(74) *Attorney, Agent, or Firm* — Arent Fox LLP

(57) ABSTRACT

A memory device includes: a memory cell array which stores two-dimensionally arranged data in a plurality of memory unit regions selected by an address; an internal address control unit which generates an internal address which selects a memory unit region according to an external address; and a decoder which decodes the internal address and selects a memory unit region. The plurality of memory unit regions store data arranged in a first direction from among two-dimensionally arranged data according to a least-significant bit group of the internal address and store data arranged in a second direction from among the two-dimensionally arranged data according to a most-significant bit group of the address. The internal address control unit successively generates an internal address corresponding to the scan direction according to a scan direction control signal which controls a plurality of scan directions including at least an oblique direction of the two-dimensionally arranged data.

15 Claims, 42 Drawing Sheets

FIG. 7

CA:8bit

| | CA-U | | | | | | | | |
|---|---|---|---|---|---|---|---|---|---|
| A07 | | | 0 | | | | | 1 | |
| A06 | | 0 | | | 1 | | 0 | | 1 |
| A05 | 0 | | 1 | | 0 | | 1 | | 0 | | 1 |
| A04 | 0 | 1 | 0 | 1 | 0 | 1 | 0 | 1 | 0 | 1 | 0 | 1 | 0 | 1 | 0 | 1 |

| | A00 | A01 | A02 | A03 |
|---|---|---|---|---|
| | 0 | 0 | 0 | 0 |
| | 1 | 0 | 0 | 0 |
| | 0 | 1 | 0 | 0 |
| | 1 | 1 | 0 | 0 |
| | 0 | 0 | 1 | 0 |
| | 1 | 0 | 1 | 0 |
| | 0 | 1 | 1 | 0 |
| | 1 | 1 | 1 | 0 |
| | 0 | 0 | 0 | 1 |
| | 1 | 0 | 0 | 1 |
| | 0 | 1 | 0 | 1 |
| | 1 | 1 | 0 | 1 |
| | 0 | 0 | 1 | 1 |
| | 1 | 0 | 1 | 1 |
| | 0 | 1 | 1 | 1 |
| | 1 | 1 | 1 | 1 |

CA-L

MU — Page

| | 0 | 1 | 2 | 3 | 4 | 5 | 6 | 7 | 8 | 9 | a | b | c | d | e | f |
|---|---|---|---|---|---|---|---|---|---|---|---|---|---|---|---|---|
| 0 | CA00 | CA01 | CA02 | CA03 | CA04 | CA05 | CA06 | CA07 | CA08 | CA09 | CA0a | CA0b | CA0c | CA0d | CA0e | CA0f |
| 1 | CA10 | CA11 | CA12 | CA13 | CA14 | CA15 | CA16 | CA17 | CA18 | CA19 | CA1a | CA1b | CA1c | CA1d | CA1e | CA1f |
| 2 | CA20 | CA21 | CA22 | CA23 | CA24 | CA25 | CA26 | CA27 | CA28 | CA29 | CA2a | CA2b | CA2c | CA2d | CA2e | CA2f |
| 3 | CA30 | CA31 | CA32 | CA33 | CA34 | CA35 | CA36 | CA37 | CA38 | CA39 | CA3a | CA3b | CA3c | CA3d | CA3e | CA3f |
| 4 | CA40 | CA41 | CA42 | CA43 | CA44 | CA45 | CA46 | CA47 | CA48 | CA49 | CA4a | CA4b | CA4c | CA4d | CA4e | CA4f |
| 5 | CA50 | CA51 | CA52 | CA53 | CA54 | CA55 | CA56 | CA57 | CA58 | CA59 | CA5a | CA5b | CA5c | CA5d | CA5e | CA5f |
| 6 | CA60 | CA61 | CA62 | CA63 | CA64 | CA65 | CA66 | CA67 | CA68 | CA69 | CA6a | CA6b | CA6c | CA6d | CA6e | CA6f |
| 7 | CA70 | CA71 | CA72 | CA73 | CA74 | CA75 | CA76 | CA77 | CA78 | CA79 | CA7a | CA7b | CA7c | CA7d | CA7e | CA7f |
| 8 | CA80 | CA81 | CA82 | CA83 | CA84 | CA85 | CA86 | CA87 | CA88 | CA89 | CA8a | CA8b | CA8c | CA8d | CA8e | CA8f |
| 9 | CA90 | CA91 | CA92 | CA93 | CA94 | CA95 | CA96 | CA97 | CA98 | CA99 | CA9a | CA9b | CA9c | CA9d | CA9e | CA9f |
| A | CAa0 | CAa1 | CAa2 | CAa3 | CAa4 | CAa5 | CAa6 | CAa7 | CAa8 | CAa9 | CAaa | CAab | CAac | CAad | CAae | CAaf |
| B | CAb0 | CAb1 | CAb2 | CAb3 | CAb4 | CAb5 | CAb6 | CAb7 | CAb8 | CAb9 | CAba | CAbb | CAbc | CAbd | CAbe | CAbf |
| C | CAc0 | CAc1 | CAc2 | CAc3 | CAc4 | CAc5 | CAc6 | CAc7 | CAc8 | CAc9 | CAca | CAcb | CAcc | CAcd | CAce | CAcf |
| D | CAd0 | CAd1 | CAd2 | CAd3 | CAd4 | CAd5 | CAd6 | CAd7 | CAd8 | CAd9 | CAda | CAdb | CAdc | CAdd | CAde | CAdf |
| E | CAe0 | CAe1 | CAe2 | CAe3 | CAe4 | CAe5 | CAe6 | CAe7 | CAe8 | CAe9 | CAea | CAeb | CAec | CAed | CAee | CAef |
| F | CAf0 | CAf1 | CAf2 | CAf3 | CAf4 | CAf5 | CAf6 | CAf7 | CAf8 | CAf9 | CAfa | CAfb | CAfc | CAfd | CAfe | CAff |

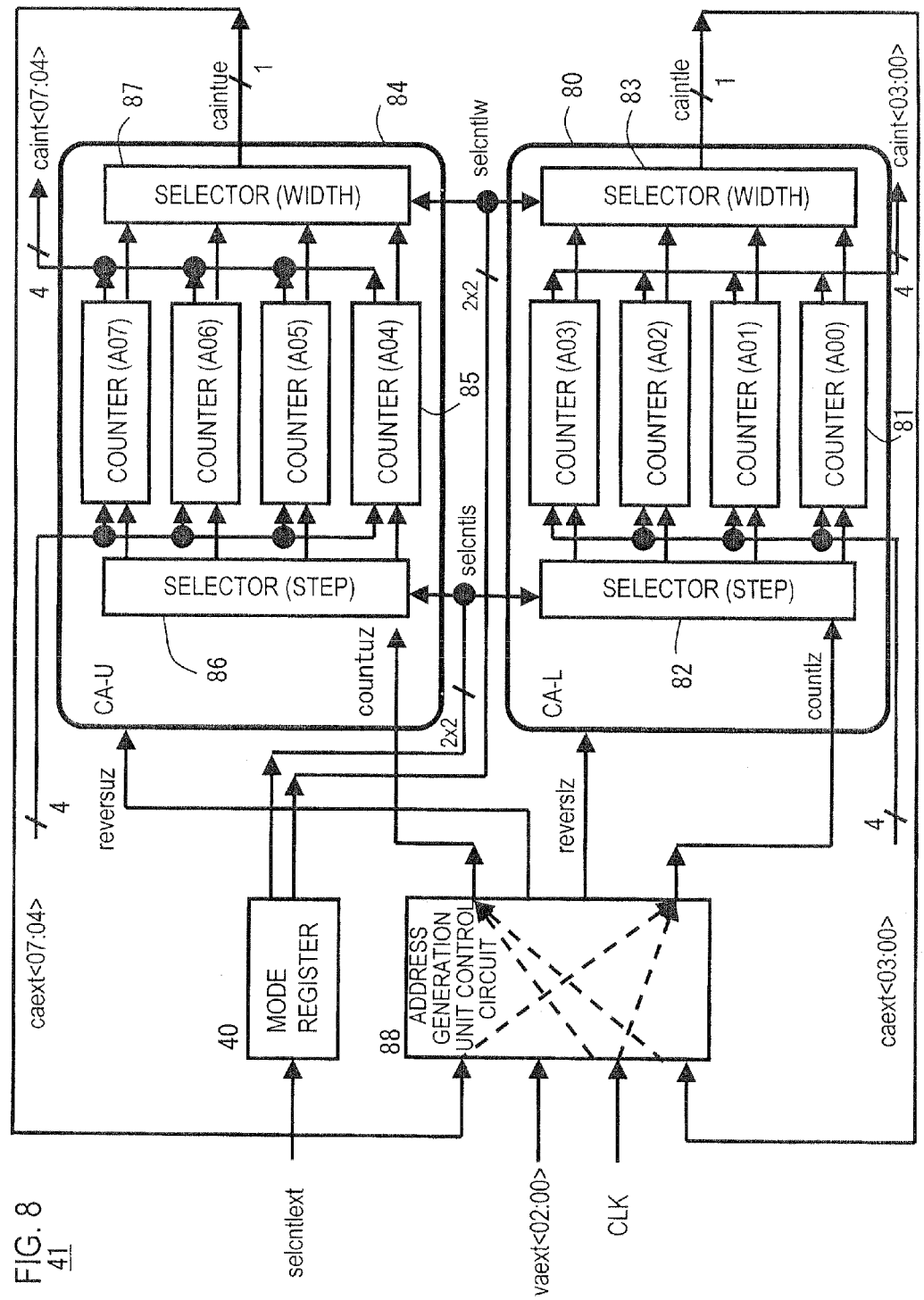

FIG. 9

Table 90: VA (vaext<02:00>)

| "100" | "110" | "101" |
|---|---|---|
| "111" | CPX | "000" |
| "010" | "001" | "011" |

Table 92:

| Command | A11 | A10 | A09 | A08 | A07 | A06 | A05 | A04 | A03 | A02 | A01 | A00 |
|---|---|---|---|---|---|---|---|---|---|---|---|---|
| ACT | RA11 | RA10 | RA09 | RA08 | RA07 | RA06 | RA05 | RA04 | RA03 | RA02 | RA01 | RA00 |
| WR/RD | VA2 | AP | VA1 | VA0 | CA07 | CA06 | CA05 | CA04 | CA03 | CA02 | CA01 | CA00 |

FIG. 11A

| | 00 | 04 | 08 | 0C | 10 | 14 | 18 | 1C | 20 | 24 | 28 | 2C | 30 | 34 | 38 | 3C | Byte |
|---|---|---|---|---|---|---|---|---|---|---|---|---|---|---|---|---|---|
| 0 | CA00 | CA01 | CA02 | CA03 | CA04 | CA05 | CA06 | CA07 | CA08 | CA09 | CA0a | CA0b | CA0c | CA0d | CA0e | CA0f | |
| 1 | CA10 | CA11 | CA12 | CA13 | CA14 | CA15 | CA16 | CA17 | CA18 | CA19 | CA1a | CA1b | CA1c | CA1d | CA1e | CA1f | Page |
| 2 | CA20 | CA21 | CA22 | CA23 | CA24 | CA25 | CA26 | CA27 | CA28 | CA29 | CA2a | CA2b | CA2c | CA2d | CA2e | CA2f | |
| 3 | CA30 | CA31 | CA32 | CA33 | CA34 | CA35 | CA36 | CA37 | CA38 | CA39 | CA3a | CA3b | CA3c | CA3d | CA3e | CA3f | |
| 4 | CA40 | CA41 | CA42 | CA43 | CA44 | CA45 | CA46 | CA47 | CA48 | CA49 | CA4a | CA4b | CA4c | CA4d | CA4e | CA4f | |
| 5 | CA50 | CA51 | CA52 | CA53 | CA54 | CA55 | CA56 | CA57 | CA58 | CA59 | CA5a | CA5b | CA5c | CA5d | CA5e | CA5f | |
| 6 | CA60 | CA61 | CA62 | CA63 | CA64 | CA65 | CA66 | CA67 | CA68 | CA69 | CA6a | CA6b | CA6c | CA6d | CA6e | CA6f | |
| 7 | CA70 | CA71 | CA72 | CA73 | CA74 | CA75 | CA76 | CA77 | CA78 | CA79 | CA7a | CA7b | CA7c | CA7d | CA7e | CA7f | |
| 8 | CA80 | CA81 | CA82 | CA83 | CA84 | CA85 | CA86 | CA87 | CA88 | CA89 | CA8a | CA8b | CA8c | CA8d | CA8e | CA8f | |
| 9 | CA90 | CA91 | CA92 | CA93 | CA94 | CA95 | CA96 | CA97 | CA98 | CA99 | CA9a | CA9b | CA9c | CA9d | CA9e | CA9f | |
| A | CAa0 | CAa1 | CAa2 | CAa3 | CAa4 | CAa5 | CAa6 | CAa7 | CAa8 | CAa9 | CAaa | CAab | CAac | CAad | CAae | CAaf | |
| B | CAb0 | CAb1 | CAb2 | CAb3 | CAb4 | CAb5 | CAb6 | CAb7 | CAb8 | CAb9 | CAba | CAbb | CAbc | CAbd | CAbe | CAbf | |
| C | CAc0 | CAc1 | CAc2 | CAc3 | CAc4 | CAc5 | CAc6 | CAc7 | CAc8 | CAc9 | CAca | CAcb | CAcc | CAcd | CAce | CAcf | |
| D | CAd0 | CAd1 | CAd2 | CAd3 | CAd4 | CAd5 | CAd6 | CAd7 | CAd8 | CAd9 | CAda | CAdb | CAdc | CAdd | CAde | CAdf | |
| E | CAe0 | CAe1 | CAe2 | CAe3 | CAe4 | CAe5 | CAe6 | CAe7 | CAe8 | CAe9 | CAea | CAeb | CAec | CAed | CAee | CAef | |
| F | CAf0 | CAf1 | CAf2 | CAf3 | CAf4 | CAf5 | CAf6 | CAf7 | CAf8 | CAf9 | CAfa | CAfb | CAfc | CAfd | CAfe | CAff | |

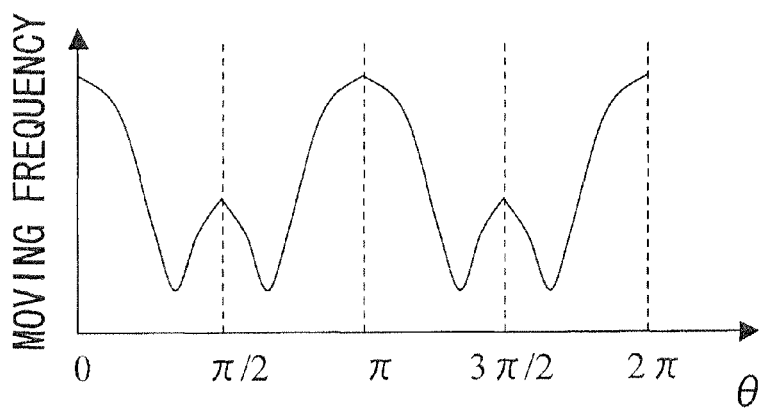

| | 00 | 04 | 08 | 0C | 10 | 14 | 18 | 1C | 20 | 24 | 28 | 2C | 30 | 34 | 38 | 3C | Byte |
|---|---|---|---|---|---|---|---|---|---|---|---|---|---|---|---|---|---|
| 0 | CA00 | CA01 | CA02 | CA03 | CA04 | CA05 | CA06 | CA07 | CA08 | CA09 | CA0a | CA0b | CA0c | CA0d | CA0e | CA0f | |
| 1 | CA10 | CA11 | CA12 | CA13 | CA14 | CA15 | CA16 | CA17 | CA18 | CA19 | CA1a | CA1b | CA1c | CA1d | CA1e | CA1f | |
| 2 | CA20 | CA21 | CA22 | CA23 | CA24 | CA25 | CA26 | CA27 | CA28 | CA29 | CA2a | CA2b | CA2c | CA2d | CA2e | CA2f | |
| 3 | CA30 | CA31 | CA32 | CA33 | CA34 | CA35 | CA36 | CA37 | CA38 | CA39 | CA3a | CA3b | CA3c | CA3d | CA3e | CA3f | |
| 4 | CA40 | CA41 | CA42 | CA43 | CA44 | CA45 | CA46 | CA47 | CA48 | CA49 | CA4a | CA4b | CA4c | CA4d | CA4e | CA4f | |
| 5 | CA50 | CA51 | CA52 | CA53 | CA54 | CA55 | CA56 | CA57 | CA58 | CA59 | CA5a | CA5b | CA5c | CA5d | CA5e | CA5f | |
| 6 | CA60 | CA61 | CA62 | CA63 | CA64 | CA65 | CA66 | CA67 | CA68 | CA69 | CA6a | CA6b | CA6c | CA6d | CA6e | CA6f | |
| 7 | CA70 | CA71 | CA72 | CA73 | CA74 | CA75 | CA76 | CA77 | CA78 | CA79 | CA7a | CA7b | CA7c | CA7d | CA7e | CA7f | |
| 8 | CA80 | CA81 | CA82 | CA83 | CA84 | CA85 | CA86 | CA87 | CA88 | CA89 | CA8a | CA8b | CA8c | CA8d | CA8e | CA8f | |
| 9 | CA90 | CA91 | CA92 | CA93 | CA94 | CA95 | CA96 | CA97 | CA98 | CA99 | CA9a | CA9b | CA9c | CA9d | CA9e | CA9f | |
| A | CAa0 | CAa1 | CAa2 | CAa3 | CAa4 | CAa5 | CAa6 | CAa7 | CAa8 | CAa9 | CAaa | CAab | CAac | CAad | CAae | CAaf | |
| B | CAb0 | CAb1 | CAb2 | CAb3 | CAb4 | CAb5 | CAb6 | CAb7 | CAb8 | CAb9 | CAba | CAbb | CAbc | CAbd | CAbe | CAbf | |
| C | CAc0 | CAc1 | CAc2 | CAc3 | CAc4 | CAc5 | CAc6 | CAc7 | CAc8 | CAc9 | CAca | CAcb | CAcc | CAcd | CAce | CAcf | |
| D | CAd0 | CAd1 | CAd2 | CAd3 | CAd4 | CAd5 | CAd6 | CAd7 | CAd8 | CAd9 | CAda | CAdb | CAdc | CAdd | CAde | CAdf | |
| E | CAe0 | CAe1 | CAe2 | CAe3 | CAe4 | CAe5 | CAe6 | CAe7 | CAe8 | CAe9 | CAea | CAeb | CAec | CAed | CAee | CAef | |
| F | CAf0 | CAf1 | CAf2 | CAf3 | CAf4 | CAf5 | CAf6 | CAf7 | CAf8 | CAf9 | CAfa | CAfb | CAfc | CAfd | CAfe | CAff | Page |

FIG. 30

| Byte\Page | 00 | 04 | 08 | 0C | 10 | 14 | 18 | 1C | 20 | 24 | 28 | 2C | 30 | 34 | 38 | 3C |
|---|---|---|---|---|---|---|---|---|---|---|---|---|---|---|---|---|
| 0 | CA00 | CA01 | CA02 | CA03 | CA04 | CA05 | CA06 | CA07 | CA08 | CA09 | CA0a | CA0b | CA0c | CA0d | CA0e | CA0f |
| 1 | CA10 | CA11 | CA12 | CA13 | CA14 | CA15 | CA16 | CA17 | CA18 | CA19 | CA1a | CA1b | CA1c | CA1d | CA1e | CA1f |
| 2 | CA20 | CA21 | CA22 | CA23 | CA24 | CA25 | CA26 | CA27 | CA28 | CA29 | CA2a | CA2b | CA2c | CA2d | CA2e | CA2f |
| 3 | CA30 | CA31 | CA32 | CA33 | CA34 | CA35 | CA36 | CA37 | CA38 | CA39 | CA3a | CA3b | CA3c | CA3d | CA3e | CA3f |
| 4 | CA40 | CA41 | CA42 | CA43 | CA44 | CA45 | CA46 | CA47 | CA48 | CA49 | CA4a | CA4b | CA4c | CA4d | CA4e | CA4f |
| 5 | CA50 | CA51 | CA52 | CA53 | CA54 | CA55 | CA56 | CA57 | CA58 | CA59 | CA5a | CA5b | CA5c | CA5d | CA5e | CA5f |
| 6 | CA60 | CA61 | CA62 | CA63 | CA64 | CA65 | CA66 | CA67 | CA68 | CA69 | CA6a | CA6b | CA6c | CA6d | CA6e | CA6f |
| 7 | CA70 | CA71 | CA72 | CA73 | CA74 | CA75 | CA76 | CA77 | CA78 | CA79 | CA7a | CA7b | CA7c | CA7d | CA7e | CA7f |
| 8 | CA80 | CA81 | CA82 | CA83 | CA84 | CA85 | CA86 | CA87 | CA88 | CA89 | CA8a | CA8b | CA8c | CA8d | CA8e | CA8f |
| 9 | CA90 | CA91 | CA92 | CA93 | CA94 | CA95 | CA96 | CA97 | CA98 | CA99 | CA9a | CA9b | CA9c | CA9d | CA9e | CA9f |
| A | CAa0 | CAa1 | CAa2 | CAa3 | CAa4 | CAa5 | CAa6 | CAa7 | CAa8 | CAa9 | CAaa | CAab | CAac | CAad | CAae | CAaf |
| B | CAb0 | CAb1 | CAb2 | CAb3 | CAb4 | CAb5 | CAb6 | CAb7 | CAb8 | CAb9 | CAba | CAbb | CAbc | CAbd | CAbe | CAbf |
| C | CAc0 | CAc1 | CAc2 | CAc3 | CAc4 | CAc5 | CAc6 | CAc7 | CAc8 | CAc9 | CAca | CAcb | CAcc | CAcd | CAce | CAcf |
| D | CAd0 | CAd1 | CAd2 | CAd3 | CAd4 | CAd5 | CAd6 | CAd7 | CAd8 | CAd9 | CAda | CAdb | CAdc | CAdd | CAde | CAdf |
| E | CAE0 | CAe1 | CAe2 | CAe3 | CAe4 | CAe5 | CAe6 | CAe7 | CAe8 | CAe9 | CAea | CAeb | CAec | CAed | CAee | CAef |
| F | CAF0 | CAf1 | CAf2 | CAf3 | CAf4 | CAf5 | CAf6 | CAf7 | CAf8 | CAf9 | CAfa | CAfb | CAfc | CAfd | CAfe | CAff |

MEMORY DEVICE AND MEMORY CONTROL FOR CONTROLLING THE SAME

CROSS REFERENCE TO RELATED APPLICATIONS

This application is a continuation of International Application No. PCT/JP2008/001702, filed on Jun. 30, 2008, now pending, herein incorporated by reference.

FIELD

The present invention relates to a memory device, and a memory controller for controlling the memory device.

BACKGROUND

A memory device, particularly an SDRAM which has large capacity among semiconductor memory devices, is widely used as a frame memory in an image processing device. For a frame memory which stores image data, a larger capacity is strongly demanded to support a full high vision screen. On the other hand, high-speed accessing to image data in an arbitrary area, in addition to normal memory access based on raster scan, is demanded to support the MPEG standard, having compression and decompression processing of moving pictures. For example, the MPEG standard includes processing to search an image that matches an image in a predetermined rectangular area in order to detect a motion vector. For this motion vector search processing, a frequent and large capacity read operation to a frame memory is required.

The present applicant applied for patents for a memory device which has access function to support various image processings. Japanese Patent Application No. 2006-345415 (filed on Dec. 22, 2006, Japanese laid-open Patent 2008-159131), is an example. According to this application, a memory device has a plurality of memory unit areas which are selected by an input address, image data is stored in the plurality of memory unit areas according to a predetermined memory map, and output data is read from adjacent memory unit areas, and input data is written to the adjacent memory unit areas by providing the input address once.

An SDRAM has burst read and burst write functions, and can efficiently access the storage areas within continuous addresses. Therefore in the case of a memory map for storing two-dimensional image data in the raster scan direction in continuous address areas, access for raster scanning the two-dimensional image data becomes very efficient, and the bandwidth of the memory, which indicates a number of data that can be processed in a unit time, becomes very wide. However accessing memory in a direction or in an area that is different from the raster scan drops memory access efficiency, and decreases the bandwidth of the memory.

In order to solve this problem of an SDRAM, various proposals have been made. Patent Documents 1 to 5 are examples thereof.

Patent Document 1 discloses that a plurality of rows of image data are simultaneously accessed by storing image data on a two-dimensional image in a vertical direction in an area having a same row address and column address in a plurality of bank areas in a memory, and activating the plurality of bank areas simultaneously. In other words, efficiency to access a plurality of rows of image data is increased by storing image data on a two-dimensional image based on a special memory map.

Patent Document 2 discloses that a video RAM (VRAM) has a DRAM for storing image data on a two-dimensional image, and a serial access memory SAM which cache-controls the data in the DRAM, the serial access memory SAM has a serial address counter which can count addresses in ascending order or descending order, and a horizontally reversed image is written in the DRAM by the serial address counter counting in descending order.

Patent Document 3 discloses that a video RAM (VRAM) has a DRAM for storing image data on a two-dimensional image and a serial access memory SAM which cache-controls the data in the DRAM, an address counter of the serial access memory can be changed to addition mode or subtraction mode, and an addition value of the address counter can be set from the outside as an arbitrary number.

Patent Document 4 discloses that image data read by an image reading device is written to an image memory, so that the addresses of image data, which are next to each other in the secondary scanning direction, are to be continuous addresses, and for the image data which is read in a vertically and horizontally reversed manner, page mode read processing is performed.

Patent Document 5 discloses a video RAM similar to Patent Document 2.

Patent Document 1: Japanese Patent Application Laid-Open No. 2005-116128

Patent Document 2: Japanese Patent Application Laid-Open No. H8-190372

Patent Document 3: Japanese Patent Application Laid-Open No. H6-243675

Patent Document 4: Japanese Patent Application Laid-Open No. H5-334426

Patent Document 5: Japanese Patent Application Laid-Open No. H5-54657

SUMMARY

All of the above mentioned Patent Documents 1 to 5 disclose a configuration of a system having a DRAM, and none relate to an internal configuration of a DRAM for storing image data. Therefore these prior arts cannot increase the bandwidth of the DRAM for storing image data. On the other hand, a memory device which can efficiently perform special access corresponding to various image processings is expected.

According to an aspect of the invention, a memory device has a memory cell array which has a plurality of memory unit areas selected by an address, and stores two-dimensional array data in the plurality of memory unit areas; an internal address control unit which inputs an external address, and generates an internal address for selecting the memory unit area based on the external address; and a decoder which decodes the internal address to select the memory unit area. The plurality of memory unit areas store data arrayed in a first direction out of the matrix of the two-dimensional array data, based on a lower bit group of the internal address, and store data arrayed in a second direction out of the matrix of the two-dimensional array data, based on an upper bit group of the internal address, and, based on a scanning direction control signal for controlling a plurality of scanning directions including at least a diagonal direction of the two-dimensional array data, the internal address control unit sequentially generates internal addresses corresponding to the scanning directions.

The object and advantages of the invention will be realized and attained by means of the elements and combinations particularly pointed out in the claims.

BRIEF DESCRIPTION OF DRAWINGS

FIG. 7 is a diagram depicting a memory map in a page area.

FIG. 8 is a diagram depicting a configuration of generating column addresses in the column address control unit 41 according to the present embodiment.

FIG. 9 shows a concrete example of the scanning direction control signal vaext.

FIGS. 11A and 11B are diagrams showing the movement direction of a moving picture and the distribution of the moving distance.

FIG. 12 shows an example of the motion vector search range.

FIG. 20 is a diagram depicting a horizontal scanning access in the page area.

FIG. 21 is a diagram depicting a vertical scanning access in the page area.

FIG. 24 is a diagram depicting an example of performing scanning access (burst access) in the vertical direction.

FIG. 28 shows another example of performing scanning access (burst access) in the vertical direction.

FIG. 29 is a diagram depicting an access when motion prediction is performed.

FIG. 30 is a diagram depicting other accesses when motion prediction is performed.

FIG. 35 is a diagram depicting a burst access to a rectangular area according to the present embodiment.

FIG. 41 is a diagram depicting an example of a memory map having a time axis.

DESCRIPTION OF EMBODIMENTS

[Overview of Image Encoding System, Memory Controller and Memory Device]

Figure 1:
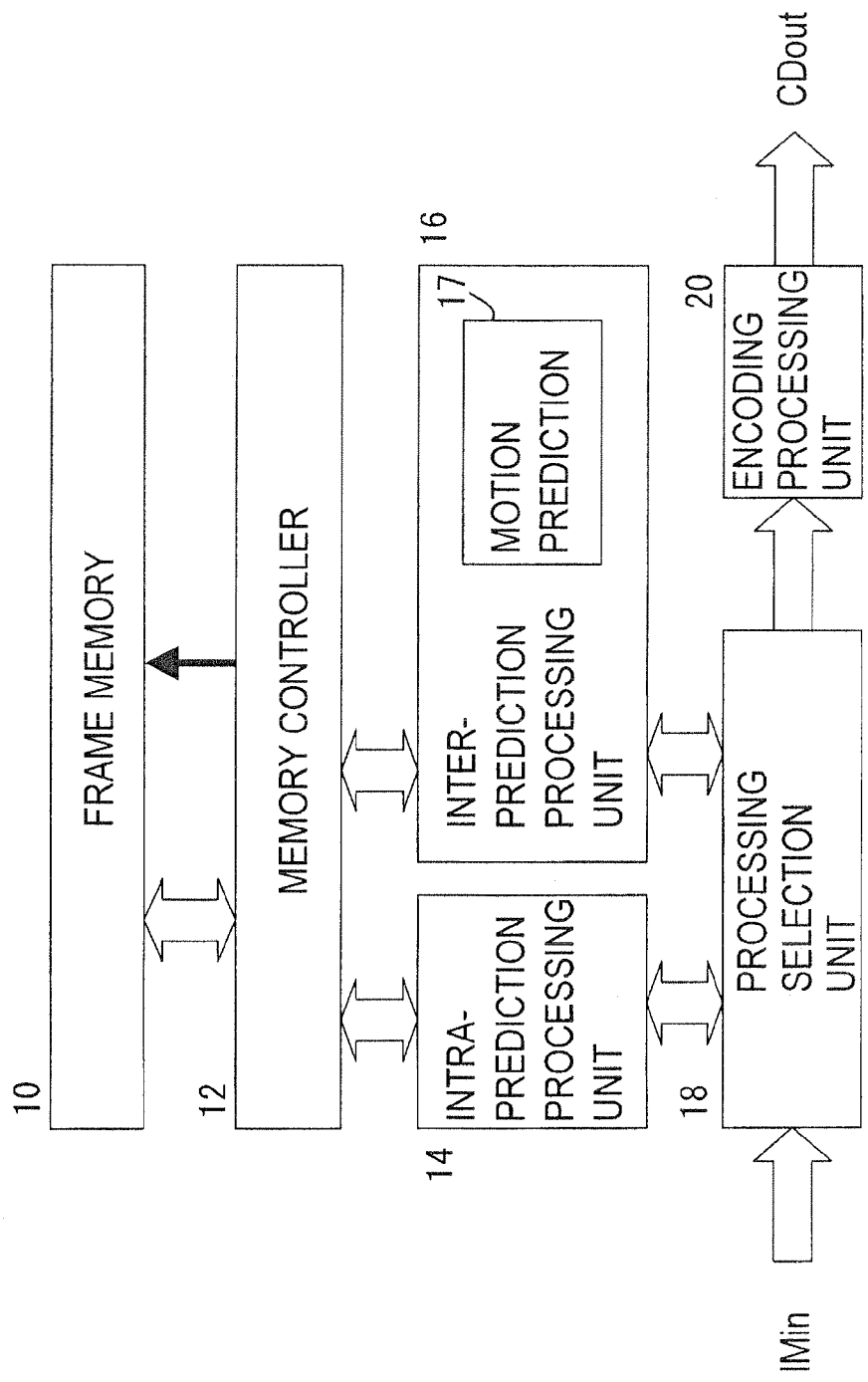
FIG. 1 is a block diagram of an image encoding system.

FIG. 1 is a block diagram of an image encoding system. A memory device according to the present embodiment corresponds to a frame memory 10 for storing two-dimensional array data, such as image data. The image encoding system has a processing selection unit 18 which selects either intra-prediction processing which compresses input image data IMin within a same frame, or inter-prediction processing which compresses the input image data IMin in a time axis direction, and an encoding processing unit 20 which encodes the input image data IMin based on the selected processing, and outputs the encoded output image data CDout. The image encoding system also has an intra-prediction processing unit 14 and an inter-prediction processing unit 16 which includes a motion prediction processing unit 17. The intra-prediction processing unit 14 and the inter-prediction processing unit 16 access the frame memory 10 via a memory controller 12 respectively, and read or write the image data in a desired area out of the image data stored in the frame memory. The processing selection unit 18 selects a more appropriate processing based on the result of the intra-prediction processing and the result of the inter-prediction processing. The intra-prediction processing unit 14 and the inter-prediction processing unit 16 frequently access the frame memory 10 via the memory controller 12. Therefore the frame memory 10 must efficiently access the image data in the desired area using the intra-prediction processing unit 14 and the inter-prediction processing unit 16.

The above mentioned intra-prediction processing and the inter-prediction processing are processings performed using compression technology conforming to the MPEG standard. In these processings, writing image data to the frame memory 10 and reading image data from the frame memory 10 are executed very frequently. For example, in inter-prediction processing, motion prediction processing is performed, where a motion vector is determined by detecting a same movement direction of images among frame images having different time axis directions. In this motion prediction processing, processing to search a position in images in different frames, where an image of 16×16 pixels of a small rectangular area moved, is required, and a read operation to the frame memory 10 is repeated.

Figure 2A:
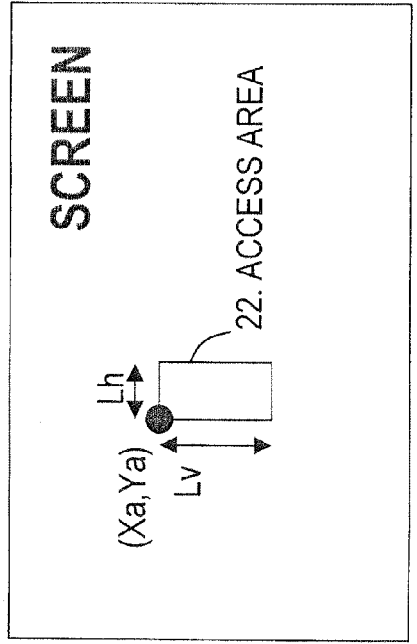
FIGS. 2A and 2B are diagrams depicting an access area specification for image data in the image encoding system.
Figure 2B:
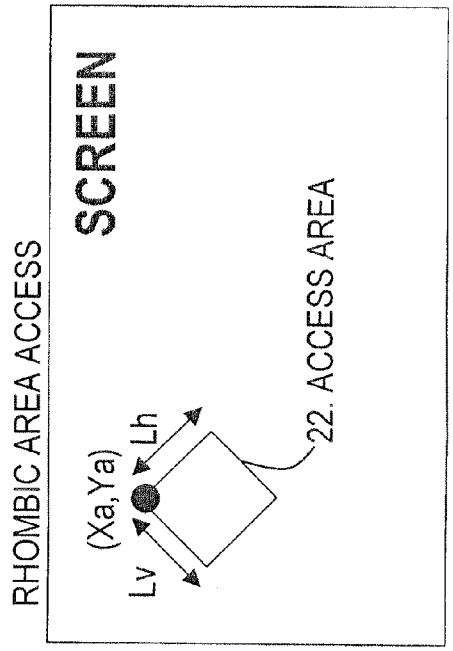

FIGS. 2A and 2B are diagrams depicting an access area specification for image data in the image encoding system. In the case of rectangular area access in FIG. 2A, the processing units 14 and 16 provide information on the coordinates of a starting point (Xa, Ya) of the access area 22, length in the horizontal direction Lh, length in the vertical direction Lv, and inclination 0° to the memory controller 12. In the case of rhombic area access in FIG. 2B, the processing units 14 and 16 provide information on the coordinates of a starting point (Xa, Ya) of the access area 22, length in a first direction Lh, length in a second direction Lv, and inclination 45° to the memory controller 12.

The memory device according to the present embodiment is constructed so that various access areas mentioned above can be accessed at higher efficiency (wider bandwidth). The memory device can, for example, perform burst read and burst write of image data in the row direction or in the column direction according to the shape of the access area. Furthermore, the memory device can perform burst read and burst write of image data in a diagonal direction at a desired inclination according to the inclination of the access area. The memory device can also switch the burst direction between forward and reverse. And the memory device can perform burst read or burst write of image data in a two-dimensional access area continuously, based on a column system instruction and a column address provided once.

Figure 3:
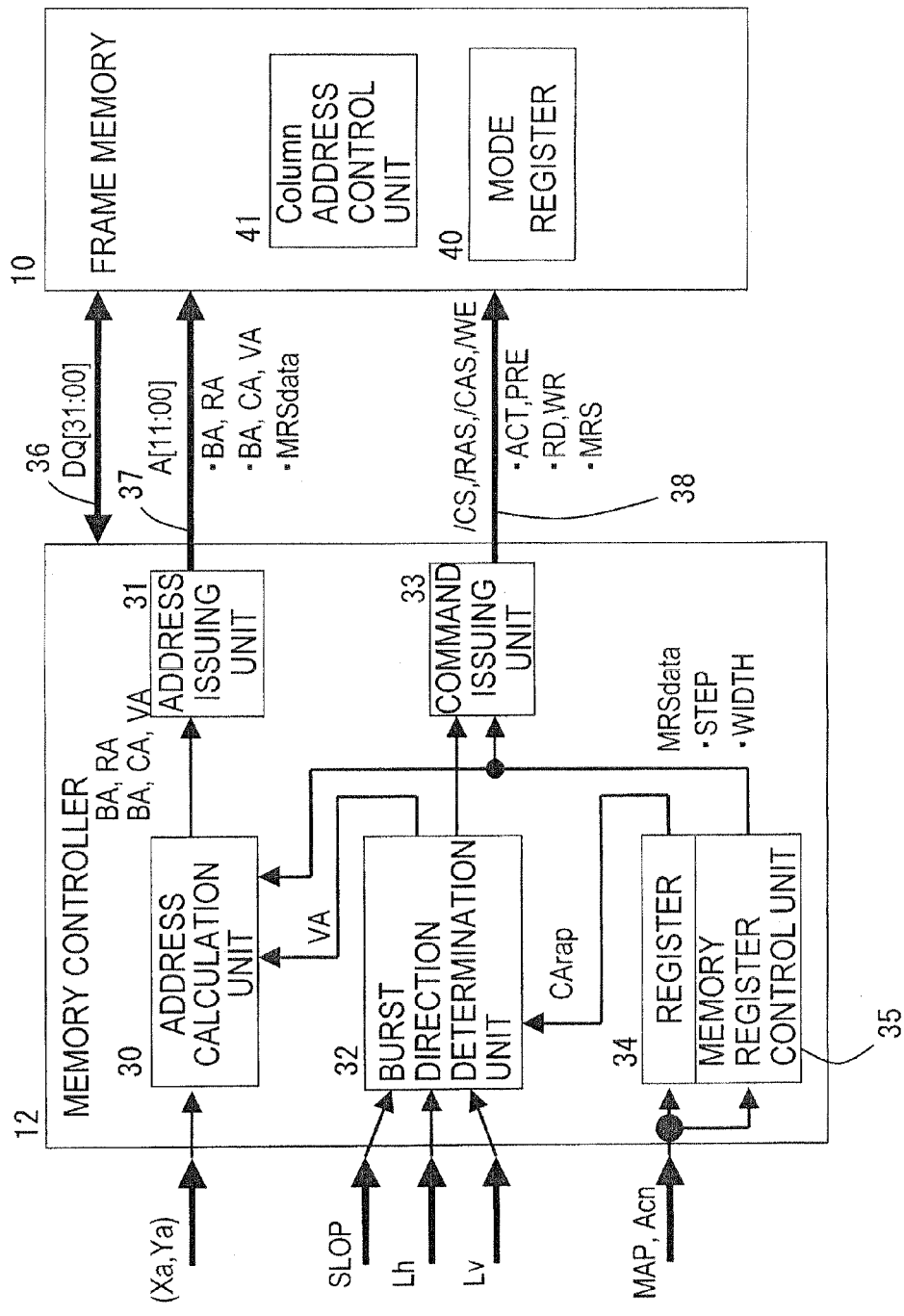
FIG. 3 is a diagram depicting a configuration of the memory controller and a connection configuration with the memory device according to the present embodiment.

FIG. 3 is a diagram depicting a configuration of the memory controller and a connection configuration with the memory device according to the present embodiment. In the memory controller 12, memory map information MAP is supplied from such a host system as processing units 14 and 16 in FIG. 1, and stored in a register 34. The memory map information MAP is information on how to store two-dimensional array data in the memory device 10. Furthermore, in the memory controller 12, access control data Acn is supplied, and a memory register control unit 35 generates mode register setting data MRSdata to be set in a mode register 40 in the memory device 10. The mode register setting data MRSdata includes, for example, step information STEP and width information WIDTH when a column address control unit 41 generates a column address. The step information and width information will be described in detail when the memory device is described.

In the memory controller 12, information on the coordinates of a starting point (Xa, Ya), inclination SLOP and lengths Lh and Lv, for specifying an access area, are input from the host system, and a burst direction determination unit 32 determines an optimum burst direction, and generates burst direction information (corresponds to a later mentioned vector address VA). Furthermore, an address calculation unit 30 calculates an address to be output to the memory device 10, based on the coordinates of the starting point (Xa, Ya) and the burst direction information.

The memory controller 12 is connected with the memory device 10 via a command bus (e.g. 4 bits) 38, address bus (e.g. 12 bits) 37 and data bus (e.g. 32 bits) 36. A command issuing unit 33 generates various commands and four command signals: /CS, /RAS, /CAS and /WE, for specifying active ACT, pre-charge PRE, read RD, write WR and mode register set MRS and the like, and outputs the commands and command signals to the command bus 38 at an appropriate timing. An address issuing unit 31 outputs a bank address BA, row address RA, column address CA, vector address VA and mode register set data MRSdata or the like to the address bus 37, along with the command from the command issuing unit. Then the memory controller 12 outputs write data to the data bus 36, and inputs read data from the data bus 36.

For example, the memory controller 12 controls the memory device 10 as follows: the memory controller 12 outputs the mode register set data MRSdata along with the mode register set command MRS when power is turned ON or at another predetermined timing. In response to this, the memory device 10 stores the mode register set data MRSdata in the mode register 40. To perform a read or write operation, the memory controller 12 outputs the bank address BA and the row address RA along with the active command ACT, and sets the page area, corresponding to the bank address BA and the row address RA, to an active state, in the memory device 10. Then the memory controller 12 outputs the bank address BA, column address CA and vector address VA along with the read command RD or write command RW, and accesses the desired memory unit area in the page area in the active state. Here the memory unit area refers to an area having a memory cell group constituted by a plurality of bytes or a plurality of bits selected by the address.

In burst mode, the column address control unit 41 of the memory device 10 sequentially generates internal column addresses corresponding to the scanning direction in the access area according to the supplied column address CA and the vector address VA, and has a memory core (not illustrated) having a cell array continuously input/output data in a plurality of memory unit areas corresponding to the scanning direction. In other words, in burst mode, the memory device 10 can continuously read or write the two-dimensional array data in an arbitrary scanning direction responding to a column system instruction (read or write) and the column address provided once.

If the scanning direction is a diagonal direction, the memory device inputs the vector address VA along with setting the step information STEP in the mode register, whereby burst access in an arbitrary angle direction is enabled. If the access area is a two-dimensional area, the width information WIDTH is set in the mode register, then the column address control unit 41 can continuously generate column addresses corresponding to the two-dimensional access area responding to the column system instruction (read or write) and the column address provided once, and the memory device 10 can continuously read or write the data in the two-dimensional access area.

The above mentioned bank address BA, row address RA, column address CA or the like may be supplied by the memory controller to the memory device as multiplexed data (time division), or may be supplied by the memory controller to the memory device as non-multiplexed data (in batch without time division).

Figure 4:
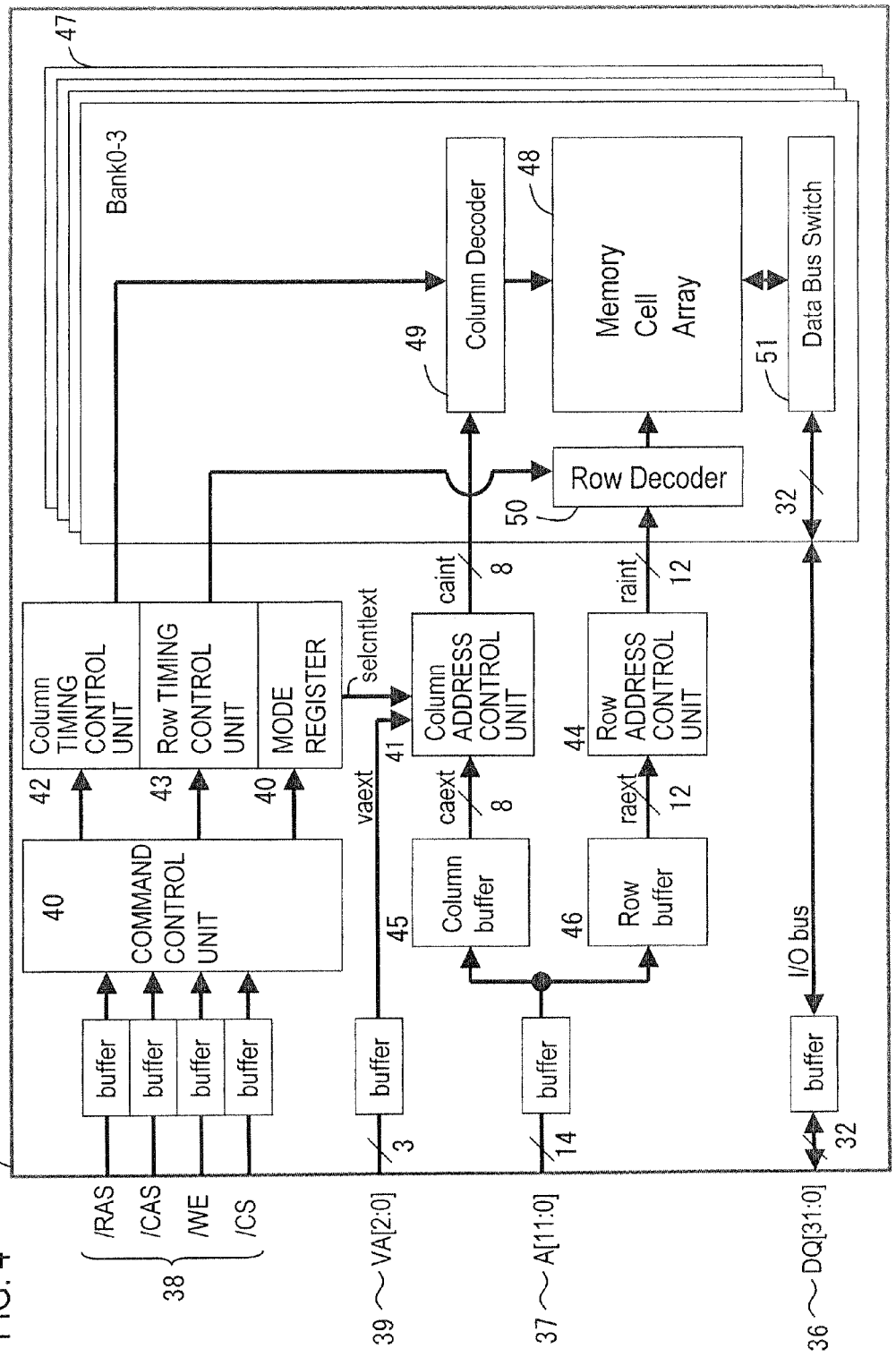
FIG. 4 is a block diagram depicting the memory device according to the present embodiment.

FIG. 4 is a block diagram depicting the memory device according to the present embodiment. As described in FIG. 3, in the memory device 10, command signals: /CS, /RAS, /CAS and /WE, for specifying a command, are input from the memory controller via the command bus 38, and corresponding to this command, the command control unit 40 controls a mode register 40, row timing control unit 43 and column timing control unit 42. For example, responding to the mode register set command MRS, the command control unit 40 sets the mode register set data MRSdata, supplied to the address bus 37, in the mode register 40. Also responding to the active command ACT, the command control unit 40 controls the row timing control unit 43 to perform the active operation. Further, responding to the read or write command RD or WR, the command control unit 40 controls the column timing control unit 42 to perform the read or write operation.

In the memory device 10, an address signal A[11:0] is input from the memory controller via the address bus 37, an external row address raext is supplied to a row address control unit 44 via a row buffer 46, and an external column address caext is supplied to the column address control unit 41 via a column buffer 45. Also in the memory device, a vector address VA[2:0] is input from the memory controller via a dedicated bus 39 or a part of the bits of the address bus 37, and an external vector address vaext is supplied to the column address control unit 41. A control signal selcntext corresponding to the step information and width information, which are set in the mode register 40, is also supplied to the column address control unit 41.

Then the row address control unit 44 generates an internal row address raint from the external row address raext, and supplies it to a row decoder 50. A row address consists of 12 bits, for example. The column address control unit 41 also generates an internal column address caint based on the external column address caext, vector address vaext and control signal selcntext, and supplies it to the column decoder 49. For an address and control signal, which are supplied from the outside to the memory device 10, "ext" is attached to the reference symbol. For an address and control signal generated inside the memory device 10, "int" is attached to the reference symbol.

Figure 5:
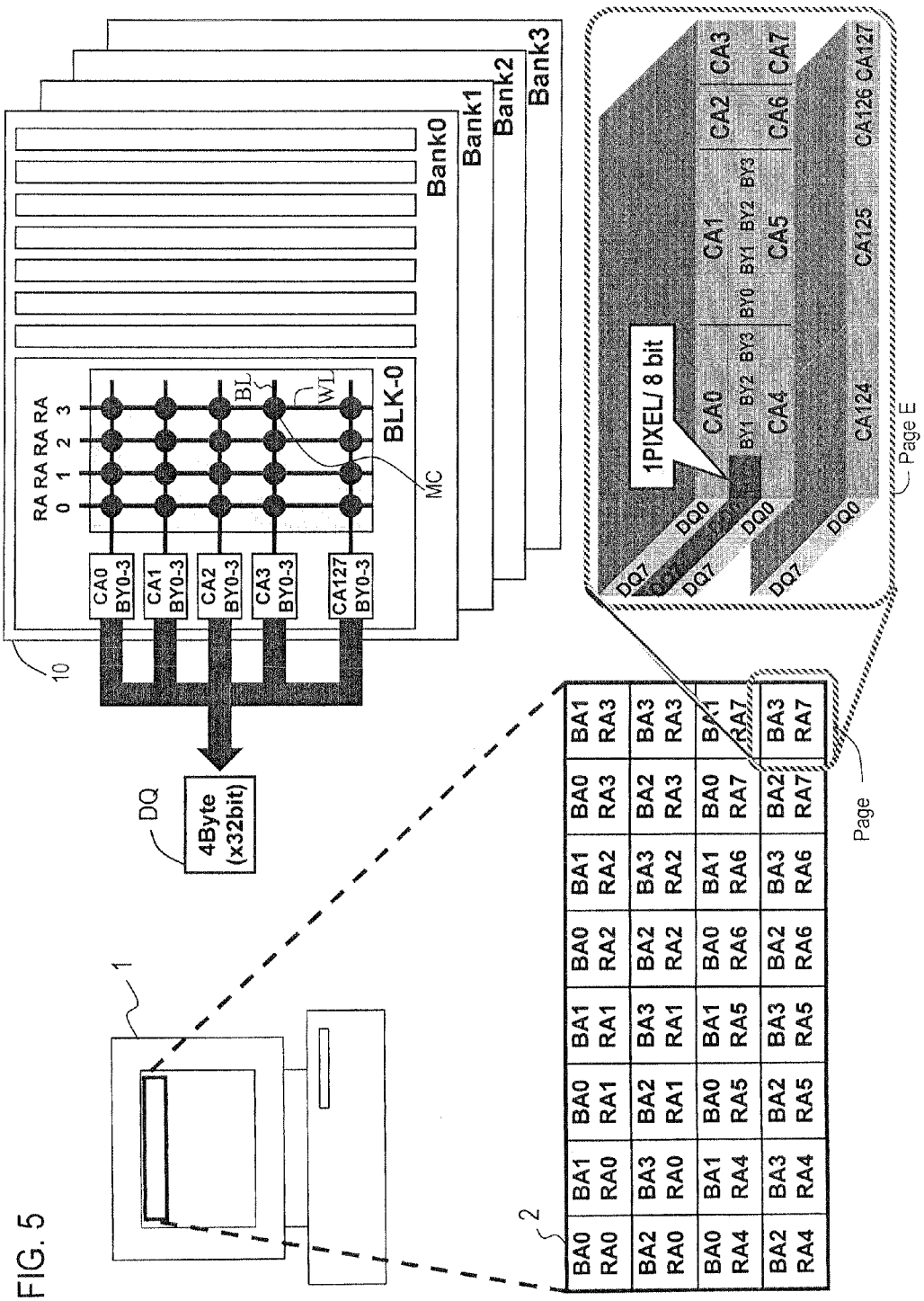
FIG. 5 is a diagram depicting an example of a memory map of the memory device according to the present embodiment.

FIG. 5 is a diagram depicting an example of a memory map of the memory device according to the present embodiment. In FIG. 5, the image data in an image processing system, including a display device 1, is stored in the memory device 10. The image data is constituted by such data as a brightness signal Y and color difference signals Ca, Cb of each pixel, or RGB grayscale signal of each pixel, and each signal is constituted by 8-bit (1 byte) data, for example.

The memory device 10 is normally constituted by a large capacity and high-speed semiconductor memory device, where integrated circuits are formed on a semiconductor substrate, such as an SDRAM. This memory device is comprised of a plurality of banks, four banks Bank0 to 3 in the case of FIG. 1, and the bank Bank 0 has a plurality of blocks BLK-0, and each block has a plurality of word lines WL, bit lines BL and memory cells MC disposed at the intersections thereof. A memory cell is comprised of an MOS transistor of which gate is connected to a word line, and a capacitor is connected to the MOS transistor, which are not illustrated. In the case of the example in FIG. 5, the four banks are corresponded to the bank addresses BA0 to BA3, the word lines WL are corresponded to the row addresses RA0 to RA7, and the bit lines BL are corresponded to the column addresses CA0 to CA127.

A word line WL in a bank is selected by the combination of the bank address BA and the row address RA, and a bit line BL is selected by the column address CA. In other words, 4 bytes BY0 to 3 data are accessed by the combination of the bank address BA, row address RA and column address CA. Since 1 byte consists of 8 bits, 4 bytes, that is 4×8=32 bits of data, are associated with the input/output terminal DQ of the memory, and is read or written by one access. Generally, 1 byte data corresponds to the 8-bit data signal of a pixel.

According to the memory map 2 shown in FIG. 5, page areas Page each specified by a bank address BA and a row address RA are disposed on a matrix of two-dimensional array data, which is image data. One page area Page has 128 memory unit areas specified by the column addresses CA0 to 127, as shown in the enlarged area page E, and each memory unit area stores 4 byte data BY0 to 3. This 4 byte data BY0 to 3 is input/output via the 32-bit input/output terminals DQ0 to 31.

The memory map 2 is suitable for operating a memory device 10, such as a SDRAM comprised of a plurality of banks, at high-speed. As mentioned above, SDRAM driving performs an active operation by a selected word line in a selected bank responding to an active command, which is provided with a bank address BA and a row address RA, outputting the data in the memory cells to bit lines, and activating sense amplifiers corresponded to the bit lines, so as to amplify the potential of the bit lines. Then responding to a read command provided with a column address CA, the SDRAM performs a read operation to read data from the selected bit line. Otherwise responding to a write command, which is provided along with a column address CA and write data, the SDRAM performs a write operation to write the write data to the selected bit line. After the read operation or the write operation, a pre-charge operation, based on a pre-charge command, is performed, then an active operation and a read or write operation are executed again. In this way, in the SDRAM, each bank can independently perform the active operation, read operation and write operation.

According to the memory map 2 in FIG. 5, different bank addresses BA0 to 3 are corresponded in vertically and horizontally adjacent page areas Page. In other words, the bank addresses BA0 and 1 are alternately disposed on odd rows of the memory map 2, and the bank addresses BA2 and 3 are alternately disposed on even rows thereof. Furthermore, in the raster direction (row direction) on the memory map 2, row addresses RA0 to 7 are disposed so that a same address repeats twice and the addresses increment sequentially, and each row of the memory map 2 returns with four row addresses: RA0 to 3 or RA4 to 7.

Figure 6:
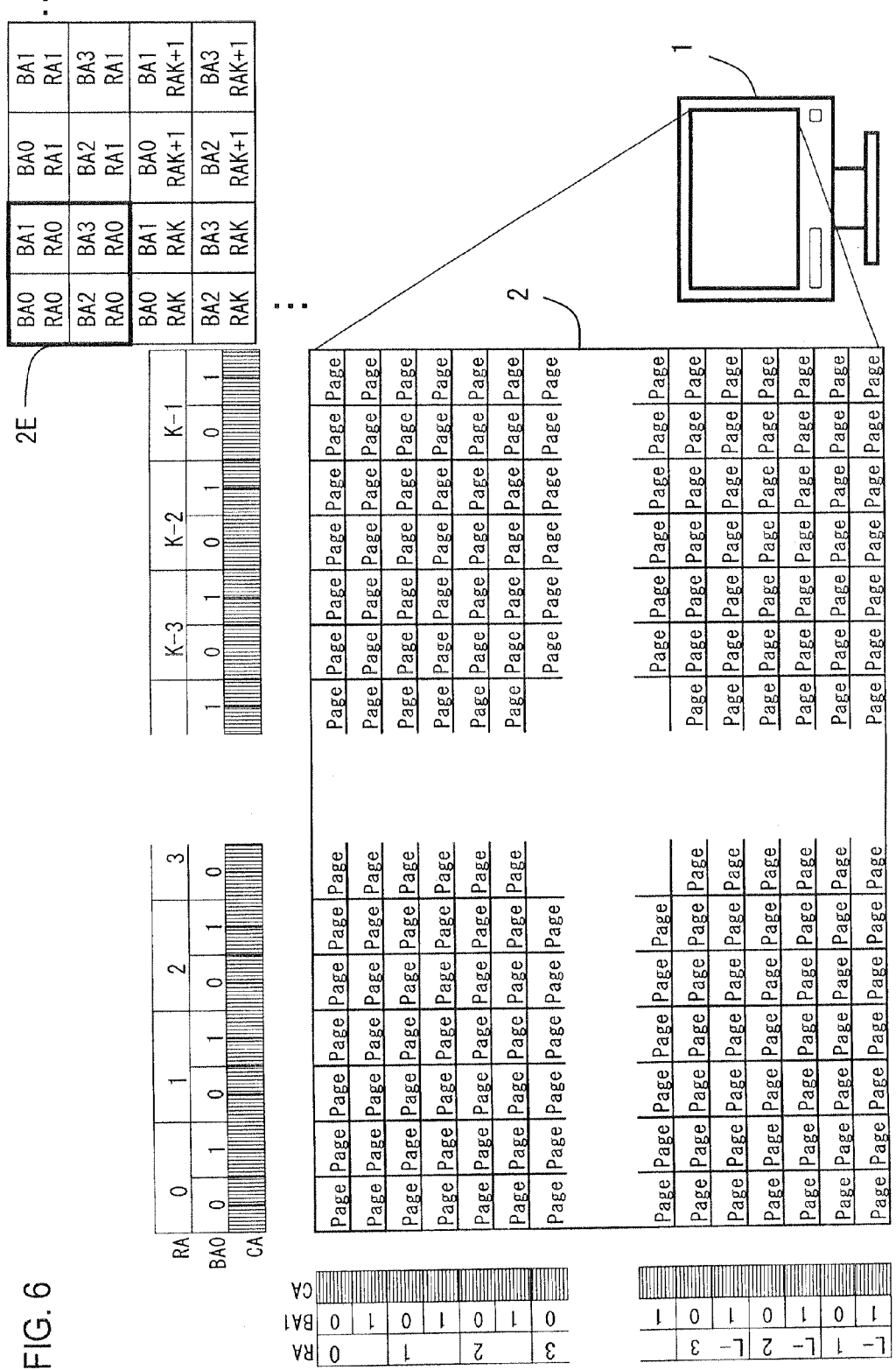
FIG. 6 is a diagram depicting details of the memory map in FIG. 5.

FIG. 6 is a diagram depicting details of the memory map in FIG. 5. FIG. 6 shows the memory map 2 and the relationship between the bank addresses BA0, BA1, row addresses RA and column addresses CA. The bank addresses BA0 and BA1 are binary numerals "0, 1", and the row addresses RA are decimal numerals "0 to K-1, 0 to L-1". As shown in FIG. 6, in the memory map 2, a plurality of page areas Page corresponding to the matrix directions of the two-dimensional array data, which is image data, are corresponded based on the bank address BA and the row address RA. In other words, the lower bank address BA0 and the lower row address RA correspond to the page areas Page in the row direction, and the upper bank address BA1 and the upper row address RA correspond to the page areas Page in the column direction.

FIG. 6 shows a part of the enlarged memory map 2E. Just like FIG. 5, the adjacent page areas in two rows and two columns enclosed by the bold line correspond to the bank and row addresses "BA0, RA0", "BA1, RA0", "BA2, RA0", and "BA3, RA0". The row is returned or folded at the row address RAK-1. Each page area has a plurality of memory unit areas corresponded to the column addresses CA. In FIG. 6, concrete values of the column addresses CA are omitted.

For example, in the case of allocating 1920×1080 sized image data in full high vision to memory, the data volume in one screen is about 64 Mbits, if the information of one pixel is assumed to be 8 bits*4 (RGBα). In an MPEG encoder and decoder, the image data in a rectangular area is frequently processed, as mentioned above. Therefore as shown in FIG. 6, mapping a plurality of page areas in rectangular shape as the reference 2 contributes to improving access efficiency. Since adjacent page areas are allocated to different bank addresses, and a same row address is allocated to four page areas enclosed by the bold line, therefore, the four bank areas are simultaneously activated by an active operation which takes a long time, then the bank addresses and column addresses are changed along with the column system command, whereby the data of the memory cell in the active state can be quickly accessed.

FIG. 7 is a diagram depicting a memory map in a page area. In the example in FIG. 7, one page area Page has a 16 row by 16 column memory unit areas MU (256 memory unit areas) selected by the column addresses A00 to A07. In FIG. 7, column addresses CA00 to CAff in hexadecimal notation are shown in each memory unit area MU. The memory unit area MU stores 4 bytes (32 bits) of data corresponding to 32 bits of the DQ interface. According to the memory map in FIG. 7, a plurality of memory unit areas MU store data arrayed in the row direction of the two-dimensional array data based on the lower bit group CA-L (A00 to A03) out of the column addresses, and stores data arrayed in the column direction of the two-dimensional array data based on the upper bit group CA-U (A04 to A07) out of the column address.

Therefore if one pixel of data (RGBα, 8 bits×4=32 bits) is stored together, one pixel of image data (RGBα) is stored in one memory unit area MU. In this case, 16×16 pixels of image data are stored in one page area Page.

If each data (8 bits), out of one pixel of data (RGBα), is separately stored, then four pixels of image data are stored in one memory unit area MU. In this case, if the image data of pixels in 1 row×4 columns is stored in one memory unit area MU, then 64×16 pixels of image data are stored in one page area Page. If the image data of the pixels in 2 rows×2 columns is stored in one memory unit area MU, then 32×32 pixels of image data are stored in one page area. If the image data of the pixels of 4 rows×1 column are stored in one memory unit area MU, then 16×64 pixels of image data are stored in one page area. This choice is controlled by the memory controller based on the memory map.

In the memory unit area MU in FIG. 7, the column addresses are written in hexadecimal notation (CA00 to CAff). In the lower bit group CA-L and upper bit group CA-U, each 4-bit column address A00 to A03 and A04 to A07 are written in binary notation (0, 1).

[Column Address Control Unit]

FIG. 8 is a diagram depicting a configuration of generating column addresses in the column address control unit 41 according to the present embodiment. The column address control unit 41 inputs 8 bits of external column addresses caext <07:04> and caext <03:00>, and generates 8 bits of internal column addresses caint <07:04> and caint <03:00>, and supplies these addresses to a column decoder in the memory core. If burst mode is set in the mode register 40, the column address control unit 41 sequentially generates and outputs the internal column addresses for a number of the burst length.

The column address control unit 41 has a lower address generation unit 80 which generates a lower bit group caint <03:00> of the internal column address, and upper address generation unit 84 which generates an upper bit group caint <07:04> of the internal address, and an address generation unit control circuit 88 which controls operation of the lower address generation unit 80 and the upper address generation unit 84 based on the scanning direction control signal vaext <03:00> of the two-dimensional array data, and sequentially generates internal column addresses which correspond to the scanning direction of a scanning direction control signal vaext <02:00>. In this example, the lower bit group and the upper bit group are parted to have 4 bits each, but the lower bit group and the upper bit group may be parted to have 2 bits and 6 bits respectively, or 3 bits and 5 bits respectively. In this case, the ratio of the matrix of the memory unit area in the page area shown in FIG. 7 changes depending on the number of upper bits and the number of lower bits.

The lower address generation unit 80 has a 4-bit counter 81, a step setting circuit 82 which sets a step of the counter (number of increase/decrease per clock), and a return width setting circuit 83 which sets a maximum count value of the counter (corresponds to the return width). The step setting circuit 82 is a selector circuit to select a bit of the counter to which a count control signal countlz is input, and selects the bit of the counter according to a step control signal selcntls (2 bits) which is set in the mode register 40. The return width setting circuit 83 is a selector circuit to select a bit of which counter output is output as a count end signal (a kind of carry signal) caintle, and selects the bit of the counter according to the return width control signal selcntlw (2 bits) which is set in the mode register 40.

Just like the lower address generation unit 80, the upper address generation unit 84 has a 4-bit counter 85, a step setting circuit 86 which sets a step of the counter (number of increase/decrease per clock), and a return width setting circuit 87 which sets a maximum count value of the counter (corresponds to the return width). The step setting circuit 86 and the return width setting circuit 87 are the same as the circuits 82 and 83 of the lower address generation unit 80.

In the mode register 40, an address computing control signal selcntlext, which is supplied along with a mode register set command from the memory controller, is set. This address computing control signal selcntlext has a step control signal selcntls (lower 2 bits and upper 2 bits) and a return width control signal selcntlw (lower 2 bits and upper 2 bits).

The address generation unit control circuit 88 controls the operation of the lower and upper address generation units 80 and 84 according to a scanning direction control signal vaext, which is supplied from the memory controller. The scanning direction control signal vaext is a 3-bit signal, and specifies a total of eight scanning directions: up, down, left, right, and four diagonal directions.

FIG. 9 shows a concrete example of the scanning direction control signal vaext. In FIG. 9, 90 shows a concrete example of the scanning direction control signal vaext, and a 3-bit scanning direction control signal vaext is allocated corresponding to the up and down column directions, left and right row directions, and the four diagonal directions from a current pixel CPX.

A method for supplying this scanning direction control signal includes, a method for the memory controller to set this signal in the mode register along with the mode register setting command, and a method for the memory controller to supply the scan direction control signal along with a column system command, are possible. 92 in FIG. 9 shows the allocation of the address terminals A00 to A11 in the case of supplying the scanning direction control signal along with the column system command. Along with issuing an active command ACT which is a row system command, 12 bits of row addresses RA00 to RA11 are input to the 12 bits of address terminals A00 to A11. Along with issuing of a write or read command WR/RD, which is a column system command, 8 bits of column addresses CA00 to CA07 are input to the address terminals A00 to A07, and an auto pre-charge sign AP is input to the address terminal A10, and 3 bits of the scanning direction control signals VA0 to VA2 are input to the rest of the address terminals A08, A09 and A11. The scanning direction control signal vaext, which is input to the address terminal, is also called a "vector address".

Referring to FIG. 8 again, the address generation unit control circuit 88 controls whether the clock CLK, which controls counter, is output as a count control signal countlz of the lower address generation unit 80 or as a count control signal countuz of the upper address generation unit 84, or as both the count control signals countlz and countuz, according to the scanning direction control signal vaext. Furthermore, the address generation unit control circuit 88 controls whether the count end signal (carry signal) caintle of the lower address generation unit 80 is output as a count control signal countuz to the upper address generation unit or the count end signal (carry signal) caintue of the upper address generation unit 84 is output to a count control signal countlz to the lower address generation unit, according to the scanning direction control signal vaext. Then the address generation unit control circuit 88 outputs reverse control signals reverslz and reversuz to the lower and upper address generation units 80 and 84 according to the scanning direction control signal vaext.

In other words, if the scanning direction is the row direction, the clock CLK is output as the count control signal countlz of the lower address generation unit 80, and the count end signal caintle of the lower address generation unit 80 is supplied as the count control signal of the upper address generation unit 84. If the scanning direction is the column direction, the clock CLK is output as the count control signal countuz of the upper address generation unit 84, and the count end signal caintue of the upper address generation unit 84 is supplied as the count control signal of the lower address generation unit 80. If the scanning direction is a diagonal direction, the clock is output as the count control signal of the lower and upper address generation units.

Now how the address generation unit control circuit 88 controls the lower and upper address generation units 80 and 84, according to the scanning direction control signal vaext, will be described.

(1) Scanning Direction Control Signal vaext=000: Forward in the Row Direction

The clock CLK is connected to the lower count control signal countlz;

the lower count end signal (carry signal) caintle is connected to the upper count control signal countuz;

the reverse control signals reverselz and reversuz are both set to forward.

As a result, the lower to upper clock control circuits 80 and 84 are connected in series, and the 8-bit internal column addresses caint <07:00> are sequentially counted up synchronizing with the clock CLK. In other words, the upper address generation unit 84 performs count operation synchronizing with the count end signal caintle of the lower address generation unit 80.

(2) Scanning Direction Control Signal vaext=111: Reverse in the Row Direction

The clock CLK is connected to the lower count control signal countlz;

the low count end signal (carry signal) caintle is connected to the upper count control signal countuz;

the reverse signals reverselz and reversuz are both set to reverse.

As a result, the lower and upper clock control circuits 80 and 84 are connected in series, and the 8-bit internal column addresses caint <07:00> are sequentially counted down synchronizing with the clock CLK. In other words, the upper address generation unit 84 performs count operation synchronizing with the count end signal caintle of the lower address generation unit 80. The count down operation by reverse is described in detail later. The reverse control signal reversuz may be set to forward.

(3) Scanning Direction Control Signal vaext=001: Forward in Column Direction

The clock CLK is connected to the upper count control signal countuz;

the upper count end signal (carry signal) caintue is connected to the lower count control signal countlz;

the reverse control signals reverselz and reversuz are both set to forward.

As a result, the upper to lower clock control circuits 84 and 80 are connected in series, the 4-bit upper internal column addresses caint <07:04> are sequentially counted up, synchronizing with the clock CLK, and the 4-bit lower internal column addresses caint <03:00> are sequentially counted up, synchronizing with the upper count end signal cainteue.

(4) Scanning Direction Control Signal vaext=110: Reverse in Column Direction

The clock CLK is connected to the upper count control signal countuz;

the upper count end signal (carry signal) caintue is connected to the lower count control signal countlz;

the reverse control signals reverselz and reversuz are both set to reverse respectively.

As a result, the upper to lower clock control circuits 84 and 80 are connected in series, the 4-bit upper internal column addresses caint <07:04> are sequentially counted down, synchronizing with the clock CLK, and the 4-bit lower internal column addresses caint <03:00> are sequentially counted down, synchronizing with the upper count end signal cainteue. The reverse control signal reverslz may be set to forward respectively.

(5) Scanning Direction Control Signal vaext=011: in Lower Right Direction

The clock CLK is connected to the upper and lower count control signals countuz and countlz;

the reverse control signals reverselz and reversuz are both set to forward.

As a result, the upper and lower clock control circuits 84 and 80 count up in parallel, synchronizing with the clock CLK. In other words, the upper internal column addresses caint <07:04> and the lower internal column addresses caint <03:00> are sequentially counted up in parallel.

(6) Scanning Direction Control Signal vaext=101: in Upper Right Direction

The clock CLK is connected to the upper and lower count control signals countuz and countlz;

the reverse control signals reverselz and reversuz are set to forward and reverse.

As a result, the upper and lower clock control circuits 84 and 80 perform count operation in parallel, synchronizing with the clock CLK, and counts down and counts up respectively. In other words, the upper internal column addresses caint <07:04> are sequentially counted down, and the lower internal column addresses caint <03:00> are sequentially counted up.

(7) Scanning Direction Control Signal vaext=010: in Lower Left Direction

The clock CLK is connected to the upper and lower count control signals countuz and countlz;

the reverse control signals reverselz and reversuz are set to reverse and forward.

As a result, the upper and lower clock control circuits 84 and 80 perform count operation in parallel, synchronizing with the clock CLK, and counts up and counts down respectively. In other words, the upper internal column addresses caint <07:04> are sequentially counted up, and the lower internal column addresses caint <03:00> are sequentially counted down.

(8) Scanning Direction Control Signal vaext=100: in Upper Left Direction

The clock CLK is connected to the upper and lower count control signals countuz and countlz;

the reverse control signals reverselz and reversuz are both set to reverse.

As a result, the upper and lower clock control circuits 84 and 80 perform count operation in parallel, synchronizing with the clock CLK, and count down together. In other words, the upper internal column addresses caint <07:04> are sequentially counted down, and the lower internal column addresses caint <03:00> are also sequentially counted down.

The upper and lower address generation units 80 and 84 count up or count down, with a step which is set according to a step control signal selcntls. By appropriately setting the step value, the diagonal scanning direction can be 45° on the horizontal and vertical axes (in the case when the step count is the same for the lower and upper address generation units), or be at other angles on the horizontal and vertical axis (in the case when the step count is different between the lower and upper address generation units). For example, if the lower step count is set to "1" and the upper step count is set to "2", the data can be scanned in the movement of the "knight" in the chess game.

The upper and lower address generation units 80 and 84 repeat count up or count down with the return width, which is set according to the return width control signal selcntlw. By appropriately setting this return width, an arbitrary rectangular area can be accessed by burst access using a column system command once.

The continuous counting values, by the upper and lower address generation units 80 and 84, are controlled by the clock CLK count based on the above mentioned burst length.

As described above, the scanning direction control signal vaext and the address computing control signal selcntlext are both signals for controlling the address computing method. Therefore both of these control signals may be set in the mode register 40 by a mode register set command, or may be input along with a column system command via the address terminal. In the case of the embodiment in FIG. 8, the scanning direction control signal vaext is input along with the column system command, and the address computing control signal selcntlext is set in the mode register 40 by the mode register set command.

Now the diagonal scanning access, horizontal and vertical scanning access, and special scanning accesses will be described in sequence.

[Diagonal Scanning Access]

Moving picture data is constituted by continuous frame image data. In the case of compression processing conforming to the MPEG standard, the movement direction of a same graphics between frame images is determined as a motion vector, and only the motion vector and the difference of the graphics is used as data of the next frame image. By this, data volume of the next frame image can be compressed. To search this motion vector, a micro-block image in a subsequent frame image, which matches or is similar to the image data in a micro-block which consists of 16×16 pixels, is searched.

Figure 10A:
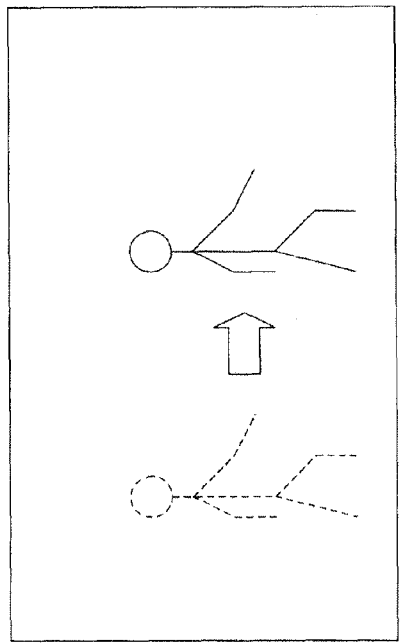
FIGS. 10A and 10B are diagrams showing examples of the movement direction of a moving picture.
Figure 10B:
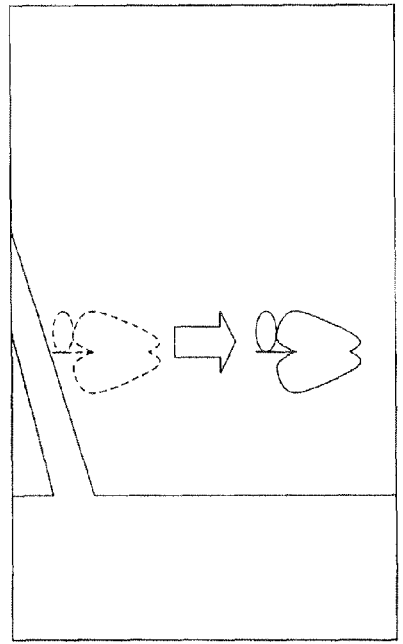

FIGS. 10A and 10B are diagrams showing examples of the movement direction of a moving picture. In the case of a moving picture, motion in the horizontal direction, as shown in FIG. 10A, is most frequent, and motion in the vertical direction, as shown in FIG. 10B, is the next most frequent. In other words, most of the motions of graphics are motions in the horizontal direction and the vertical direction. The probability of a graphic moving in a diagonal direction is relatively low.

Figure 11B:
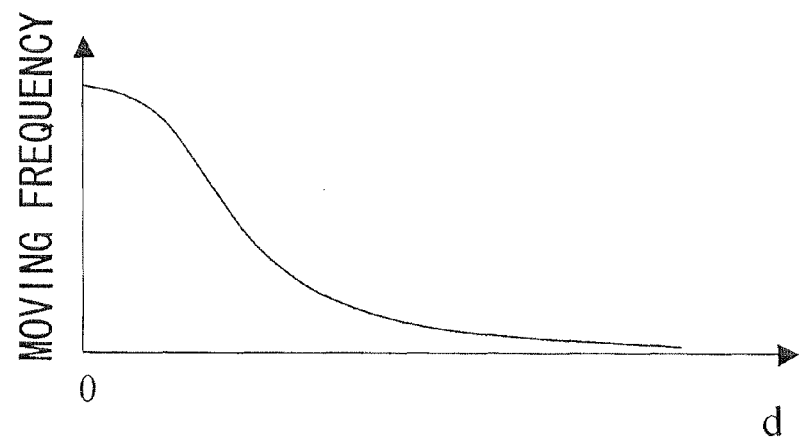

FIGS. 11A and 11B are diagrams showing the movement direction of a moving picture and the distribution of the moving distance. FIG. 11A shows a distribution of the movement direction in a moving picture. It is assumed that one memory unit area (4 bytes) stores four pixels of image data, and four memory unit areas CA67 to CA97 constitute 4×4 pixels of image data. In this case, in the motion vector search, image data in four memory unit areas that match with or is similar to the 4×4 pixels of image data in the memory unit areas CA67 to CA97 is searched. Therefore, setting a search area based on the statistics of the movement direction and the moving distance of the moving picture contribute to making the motion vector search processing efficient.

At the left in FIG. 11A, the relationship between the angle θ of the movement direction and the moving frequency, checked in the moving picture data of the sample, is shown. The moving frequency in the θ=0, π and 2π directions, which correspond to the horizontal direction, is the highest, a moving frequency in the θ=π/2 and 3π/2 directions, which correspond to the vertical direction, is the next highest, and the moving frequency in the other angles is lower. In other words, it is established that the movement directions of the moving picture are most frequent in the horizontal direction, and the next most frequent is in the vertical direction, and the least frequent is in the diagonal directions. At the left side of FIG. 11B, the relationship of the moving distance d and the moving frequency checked on the sample moving picture data is shown. According to this, the moving frequency is higher as the moving distance is shorter.

According to the statistical result, in the search of motion vectors, the probability to detect matching or similar graphics is relatively low in an area where the movement direction is diagonal and the moving distance d is large.

Figure 12:
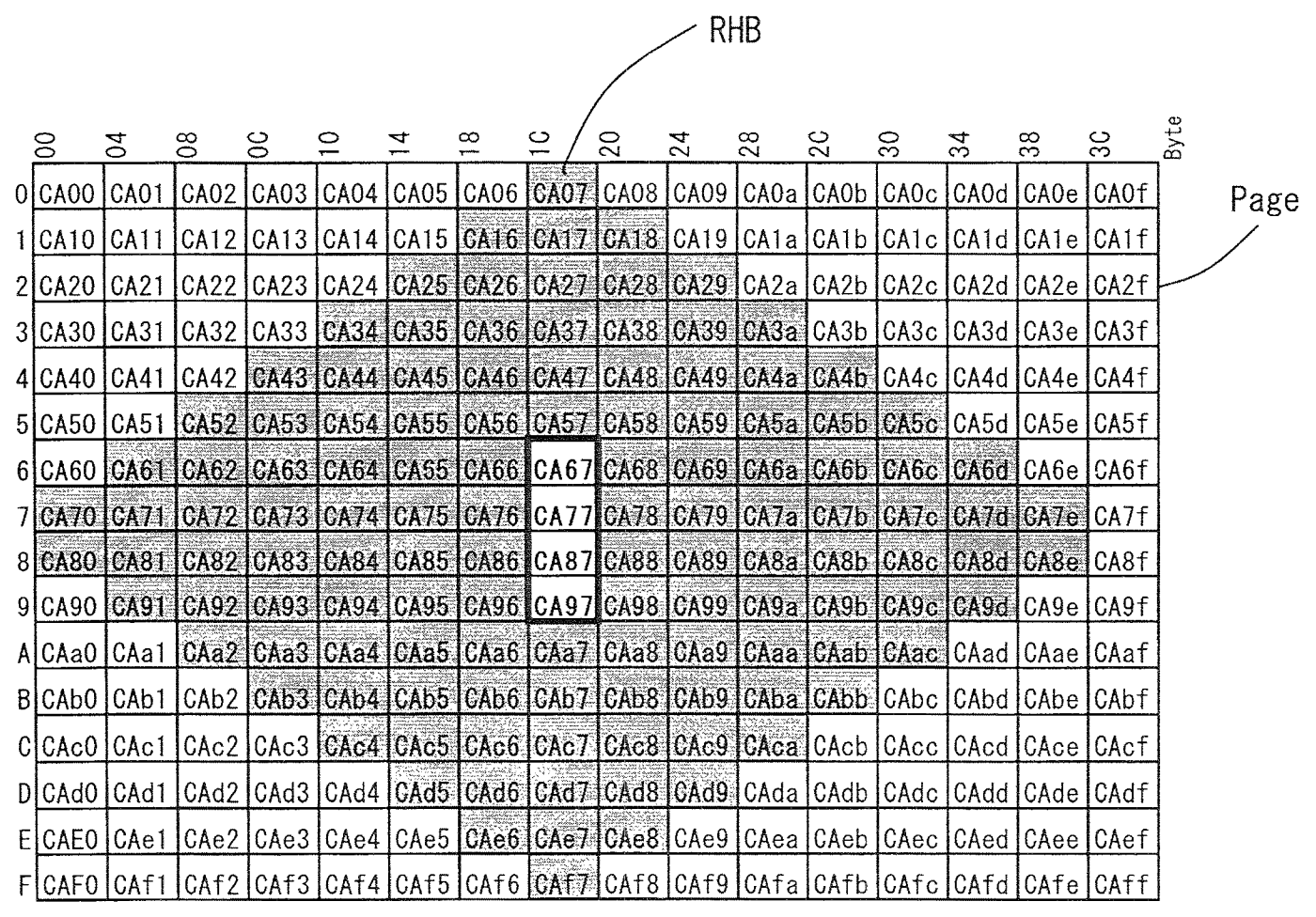

FIG. 12 shows an example of the motion vector search range. The page area Page consists of 16×16 memory unit areas, the matrix of image data, which is two-dimensional array data, is corresponded with the 16×16 memory unit areas. Now it is assumed that the motion vector is searched for a 4×4 pixel block graphic in four memory unit areas CA67 to CA97 at the center. In order to search all the 16×16 memory unit areas in the page area Page, as in the case of prior art, these 256 memory unit areas must be accessed.

However as described in FIGS. 10A and 10B and FIGS. 11A and 11B, according to the statistics of the movement direction and the moving distance of the moving picture, the search efficiency can be increased by searching the rhombic area RHB, which is generated by removing the areas in the four corners from the page area Page. Since the rhombic area RHB has a ½ area of one page area Page, the search area is reduced to half if the search area is the rhombic area RHB. Now an access, when the motion vector is searched in this rhombic area RHB, will be described.

Figure 13:
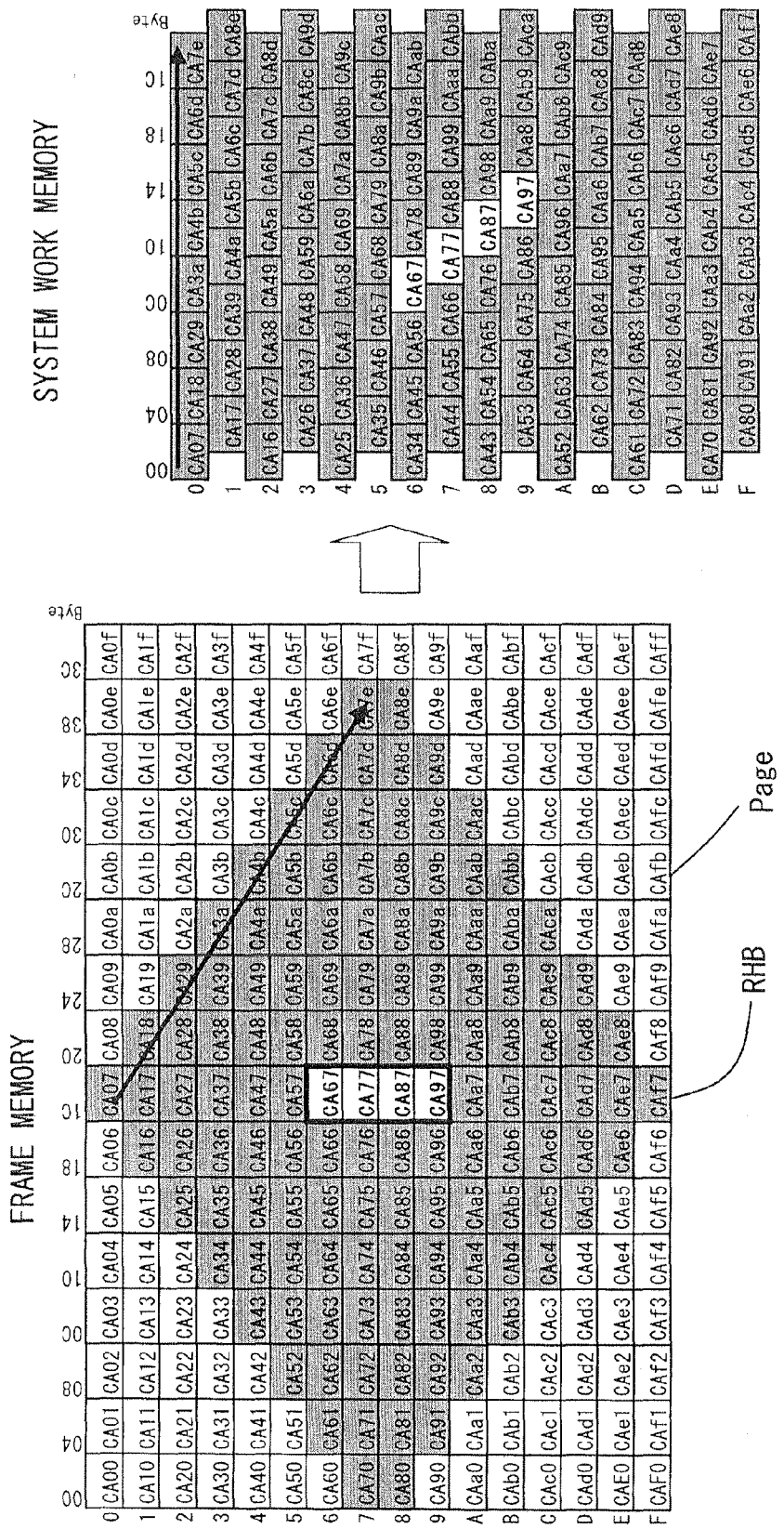
FIGS. 13A and 13B show an example of a method for accessing the rhombic area.

FIGS. 13A and 13B show an example of a method for accessing the rhombic area. In the case of accessing the rhombic area RHB in the page area Page, if the area is accessed by scanning in the row direction while incrementing the column address as in the case of prior art, then burst read or burst write cannot be performed with a same burst length, and access efficiency drops. Therefore as FIG. 13A shows, if the memory device side performs burst read or burst write by scanning in the diagonal direction, as indicated by an arrow, then the access efficiency to the memory device increases since the data can be accessed with a same burst length. In a regular image encoding system, the image data in the frame memory is stored in a work memory (FIG. 13B) in the system.

If the rhombic area RHB in the frame memory (FIG. 13A) is required to be scanned in the diagonal direction indicated by the arrow mark, as shown in FIGS. 13A and 13B, then the image data in the 8×16 memory unit areas is stored in the system work memory (FIG. 13B).

Figure 14:
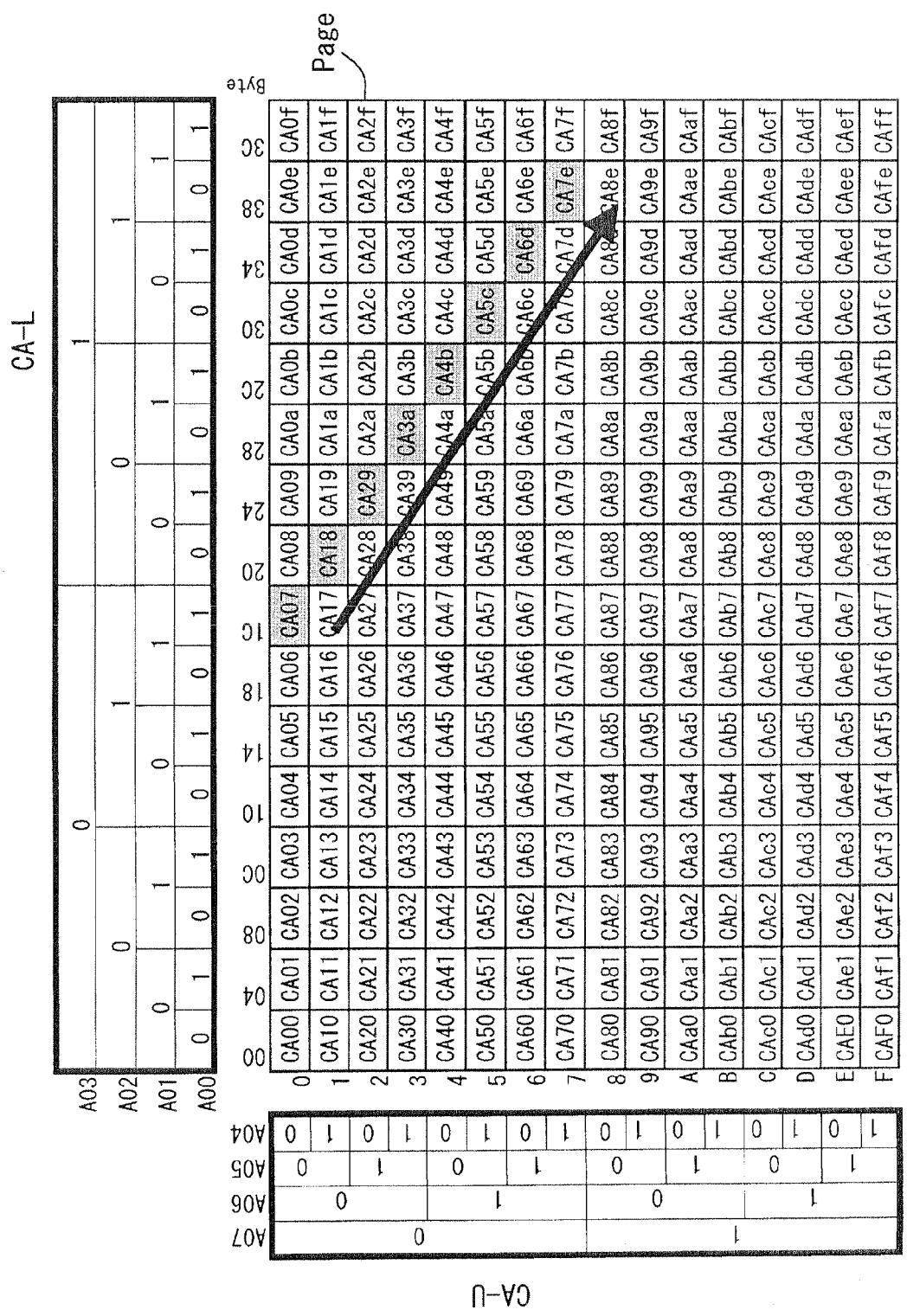
FIG. 14 is a diagram depicting the scanning in the diagonal direction.

FIG. 14 is a diagram depicting the scanning in the diagonal direction. In order to scan the rhombic area in the diagonal direction, the column address control unit in the memory device is demanded to sequentially generate column addresses CA07 to CA7e in the arrow direction in FIG. 14. In other words, in order to scan in the diagonal direction, the lower column address CA-L and the upper column address CA-U must be incremented in parallel. Therefore if the lower address generation unit 80 and the upper address generation unit 84 are controlled to operate in parallel, as described in the column address control unit 41 in FIG. 8, the above mentioned scanning in the diagonal direction can be performed in burst mode.

Figure 15:
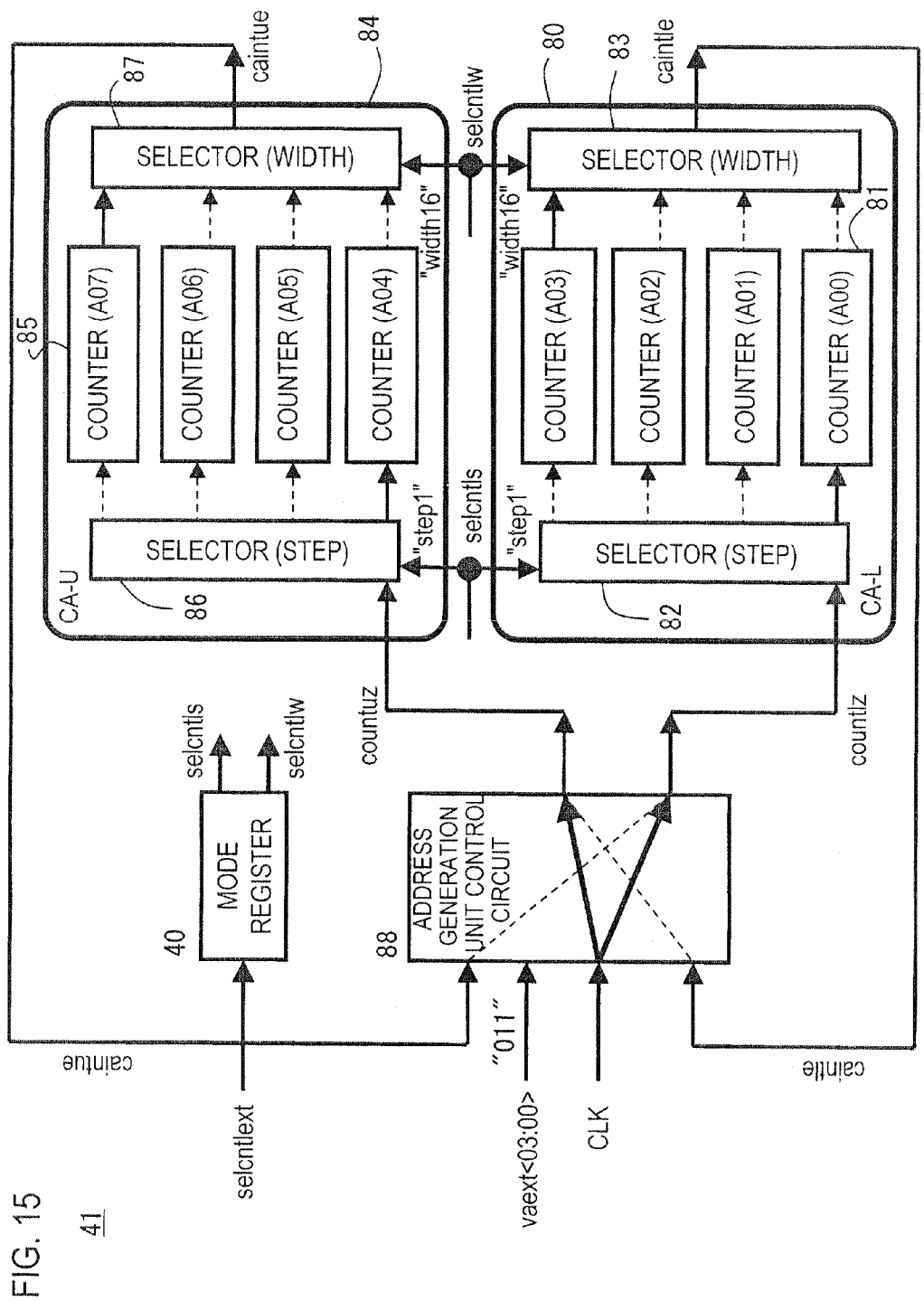
FIG. 15 is a diagram depicting the column address control unit which performs scanning in the diagonal direction.
Figure 16:
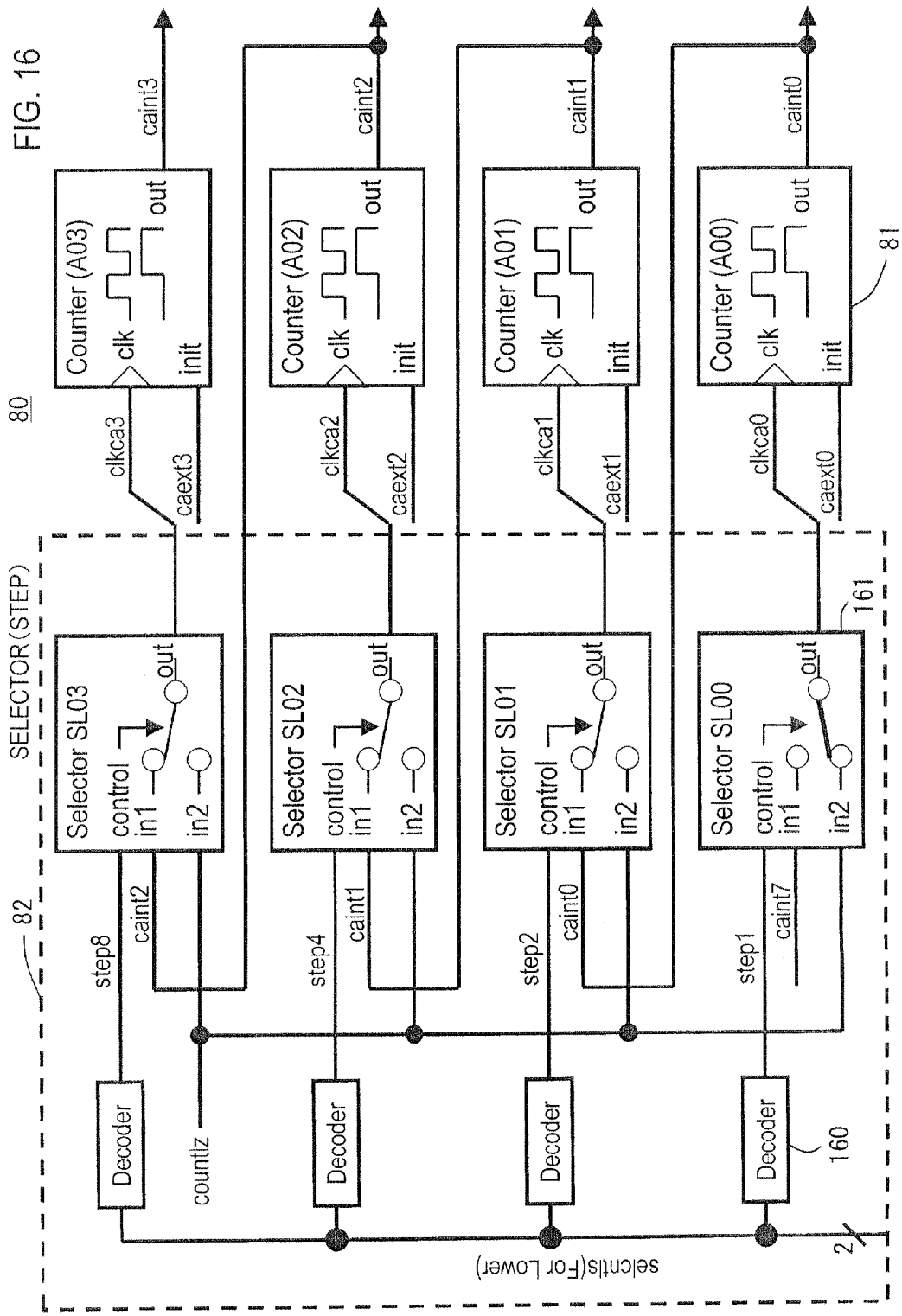
FIG. 16 is a diagram depicting details of the column address control unit which performs scanning in the diagonal direction.
Figure 17:
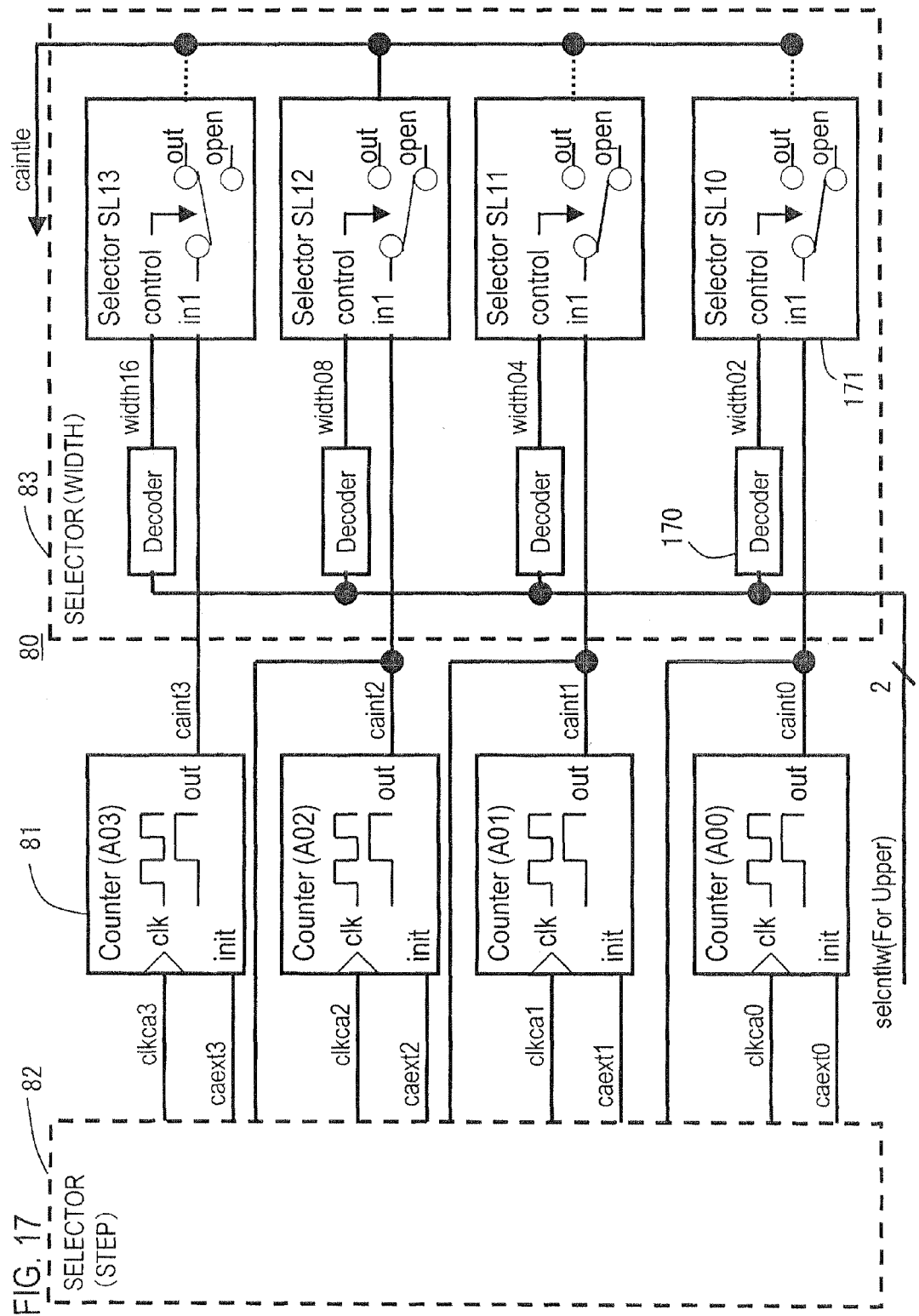
FIG. 17 is a diagram depicting details of the column address control unit which performs scanning in the diagonal direction.

FIG. 15 is a diagram depicting the column address control unit which performs scanning in the diagonal direction. FIG. 16 and FIG. 17 are diagrams depicting details of the column address control unit which performs scanning in the diagonal direction. In FIG. 15, the address generation unit 88 simultaneously supplies the clock CLK to the count control signals countlz and countuxz of the lower and upper address generation units 80 and 84 according to the scanning direction control signal vaext=011. Then the step control signal selcntls is set to step count 1 (step1), and the selectors of the step setting circuits 82 and 86 are set so as to supply count control signals countlz and countuxz to A00 and A04 of the counters 81 and 85 respectively. The return width control signal selcntlw is set to the return width 16 (width16), and the selectors of the return width setting circuits 83 and 87 are set so as to select the outputs of A03 and A07 of the counters 81 and 85. The count end signals caintle and caintue are not connected to anything.

By setting as above, in the column address control unit 41, the lower and upper address generation units 80 and 84 perform the count up operation in parallel, synchronizing with the clock CLK. Therefore if the initial value CA07=00000111 is set to the counters 81 and 85 of both address generation units 80 and 84 (0111 to the lower address generation unit 80, and 0000 to the upper address generation unit 84), and the column address is generated synchronizing with 8 times of clock CLK, then the memory unit areas CA07 to CA7e, shown in FIG. 14, can be accessed in the page mode.

FIG. 16 and FIG. 17 depict details of the lower address generation unit. As shown here in the step setting circuit 82, the four selectors 161 (SL00 to SL03) select one of the count control signal countlz and the outputs caint0 to 3 in the lower digits of the counter 81. The selectors 161 perform this selection based on the control signal control (step1, 2, 4, 8) generated by decoding the 2 bits of the step control signal selcntls by the decoder 160. In the case of the example in FIG. 16, step1 is set, and only the selector SL00 selects the input int, and the other selectors SL01 to 03 select the input in1.

In the 4-bit counter 81, the external column addresses caext0 to 3 are supplied to the initial value terminals init as the initial values, and the count up operation is repeated synchronizing with the clock signal clkca0 to 3 from the selector 161. At the fall edge of the clock clk, each flip-flop of the counter 81 repeats the toggle operation from L level to H level, or H level to L level, of the output out.

By the above setting, the 4-bit counter 81 sequentially counts up the initial value, synchronizing with the count control signal countlz. And as shown in FIG. 16, the internal column addresses caint0 to 3 are output from the output terminals out of the counter 81 respectively. Since the lower and upper address generation units are set to step1 by the step control signal, the scanning direction is 45° from the vertical and horizontal directions. By appropriately setting the step count, the scanning direction can also be set to a direction that is different from 45°. Therefore burst access in which the image data is scanned in an arbitrary angle of the diagonal direction is enabled based on the scanning direction control signal vaext and the step control signal.

On the other hand, as shown in FIG. 17, only the signal selected by the selector 171 in the return width setting circuit 83, out of the internal column addresses caint0 to 3 at the output terminals "out" of the counter 81, are output as the count end signal (carry signal) caintle. The four selectors SL10 to 13 perform the selection operation based on the control signals control (width02, 04, 08, 16) generated by decoding the 2-bit return width control signal selcntlw by the decoder 170 respectively.

Figure 18:
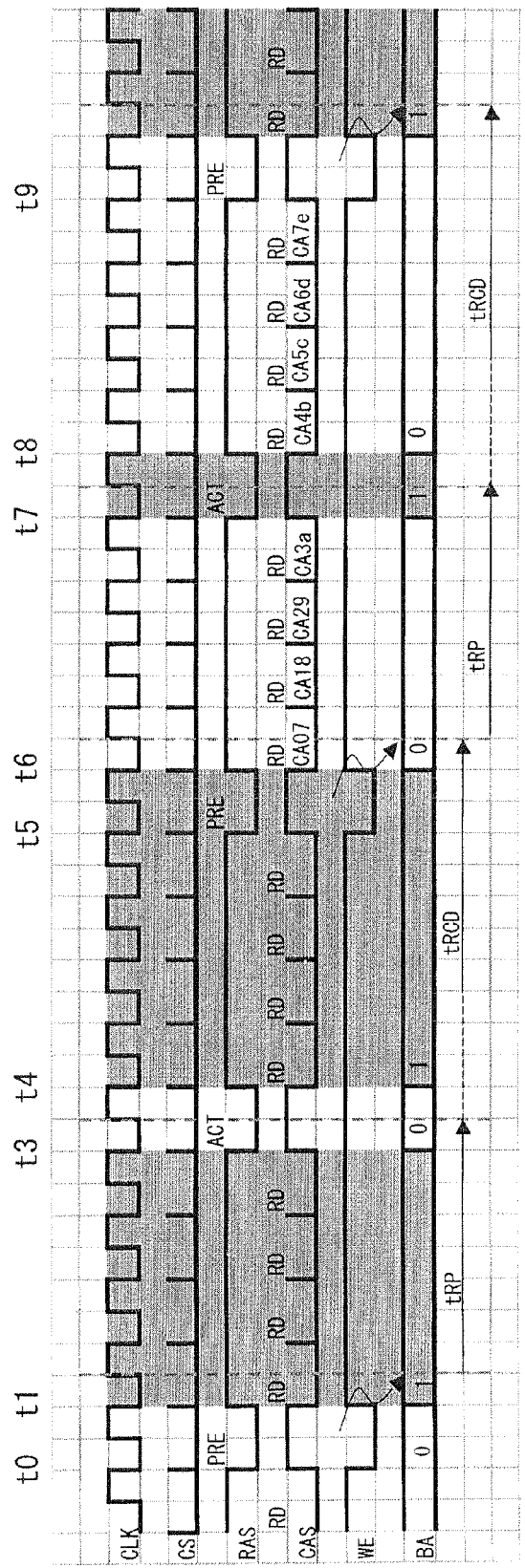
FIG. 18 is a timing chart of the memory device in the case of scanning in a diagonal direction.
Figure 19:
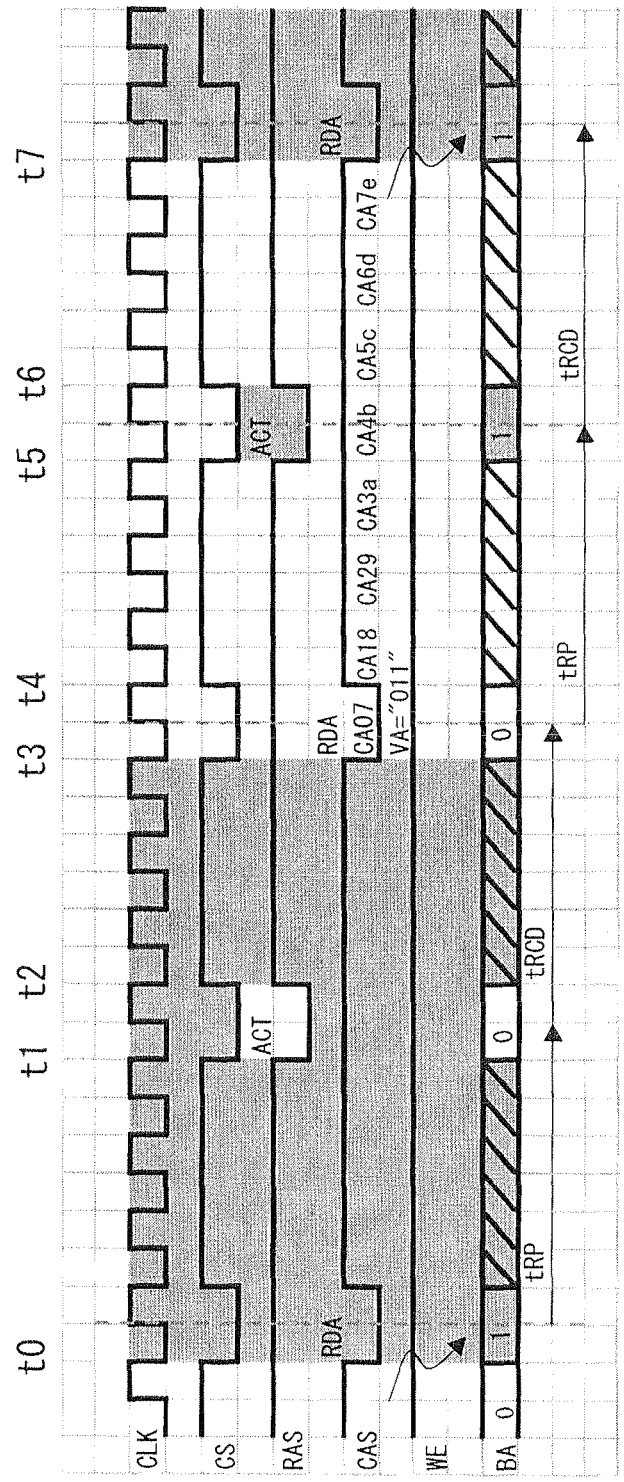
FIG. 19 is a timing chart of the memory device in the case of scanning in a diagonal direction.

FIG. 18 and FIG. 19 are timing charts of the memory device in the case of scanning in a diagonal direction. FIG. 18 depicts an example of a memory device which does not have a burst mode in a diagonal direction, and FIG. 19 depicts an example of a memory device which has a burst mode in a diagonal direction. In FIG. 18 and FIG. 19, clock CLK, command signals CS, RAS, CAS and WE, and bank address BA are shown. A column address CA, which is input along with the read command RD, is also shown. The shaded portions show the operation of the bank BA1, and the other portions show the operation of the bank BA0. In other words, in this example the two banks perform the interleave operation.

In the case of FIG. 18, the memory device does not have the burst mode in a diagonal direction. When the pre-charge command PRE is input to the bank BA0 at time t0, the pre-charge operation is performed in the bank BA0 from time t1. During this time, the read operation is repeated in the bank BA1, responding to the read command RD. At time t3, when the RAS pre-charge time tRP elapsed from 1 clock after time t1, the active command ACT is input to the bank BA0. Therefore a read command is not issued to the bank BA1 during 1 clock period after time t3. Responding to this active command, an active operation is performed in the bank BA0 based on a row address, which is not shown in FIG. 18. During this time, the read operation is repeated in the bank BA1 responding to the read command RD again.

At time t6 when the RASCAS delay time tRCD elapsed, the read command RD and the column address CA are continuously input to the bank BA0. The memory device is not in burst mode, but repeats the read operation to the eight memory unit areas disposed in a diagonal direction, responding to the eight times of read commands RD and the eight types of column addresses CA07 to CA7e, which are continuously input. In the case of the example in FIG. 18, the pre-charge command PRE is issued to the bank BA1 at time t5, and the active command ACT is issued to the bank BA1 at time t7. Therefore the read command RD is not issued to the bank BA0 during 1 clock from time t7.

In this way, in the case of the example in FIG. 18 where the memory controller scans in a diagonal direction, the column system command, read command RD and column address CA must be issued eight times. The memory device cannot operate in burst mode, and continuous input of read commands is interrupted by the bank interleave operation.

In the case of FIG. 19, the memory device has the burst mode function in a diagonal direction. If the read command RD and the first column address CA07 are input once by the operation of the column address control unit, shown in FIGS. 15, 16 and 17, the column control circuit continuously generates the internal column addresses CA18, CA29, CA3*a*, CA4*b*, CA5*c*, CA6*d* and CA7*e*, and performs the read operation for the 32-bit data continuously eight times. In other words, if the active command ACT is input to the bank BA0 at time t1, the read command RDA, the first column address CA07 and the scanning direction control signal VA=011 are input at time t3 when the RASCAS delay time tRCD elapsed. Since the burst length BL is set to BL=8 in advance, the column address control unit continuously generates the internal column addresses CA18, CA29, CA3*a*, CA4*b*, CA5*c*, CA6*d* and CA7*e*, and 32 bit×8 times of read operations are executed. During this time, the active command ACT is issued to the bank BA1 at time t5, but the burst read operation in the bank BA0 is not disturbed. The read command RDA is a read command with auto pre-charge, and can be specified by setting the auto pre-charge bit of the address terminal A10, shown in FIG. 9, to H level.

In this way, since the memory device has the burst mode function in a diagonal direction, the scanning access in a diagonal direction, in the case of accessing a rhombic area, can be performed efficiently. The angle in the diagonal direction can be set to an arbitrary angle by the scanning direction control signal vaext and the step control signal selcntls. An arbitrary angle here means to an arbitrary angle within the restriction range based on the position of the memory unit area on the memory map.

[Horizontal and Vertical Scanning Access]

Figure 20:
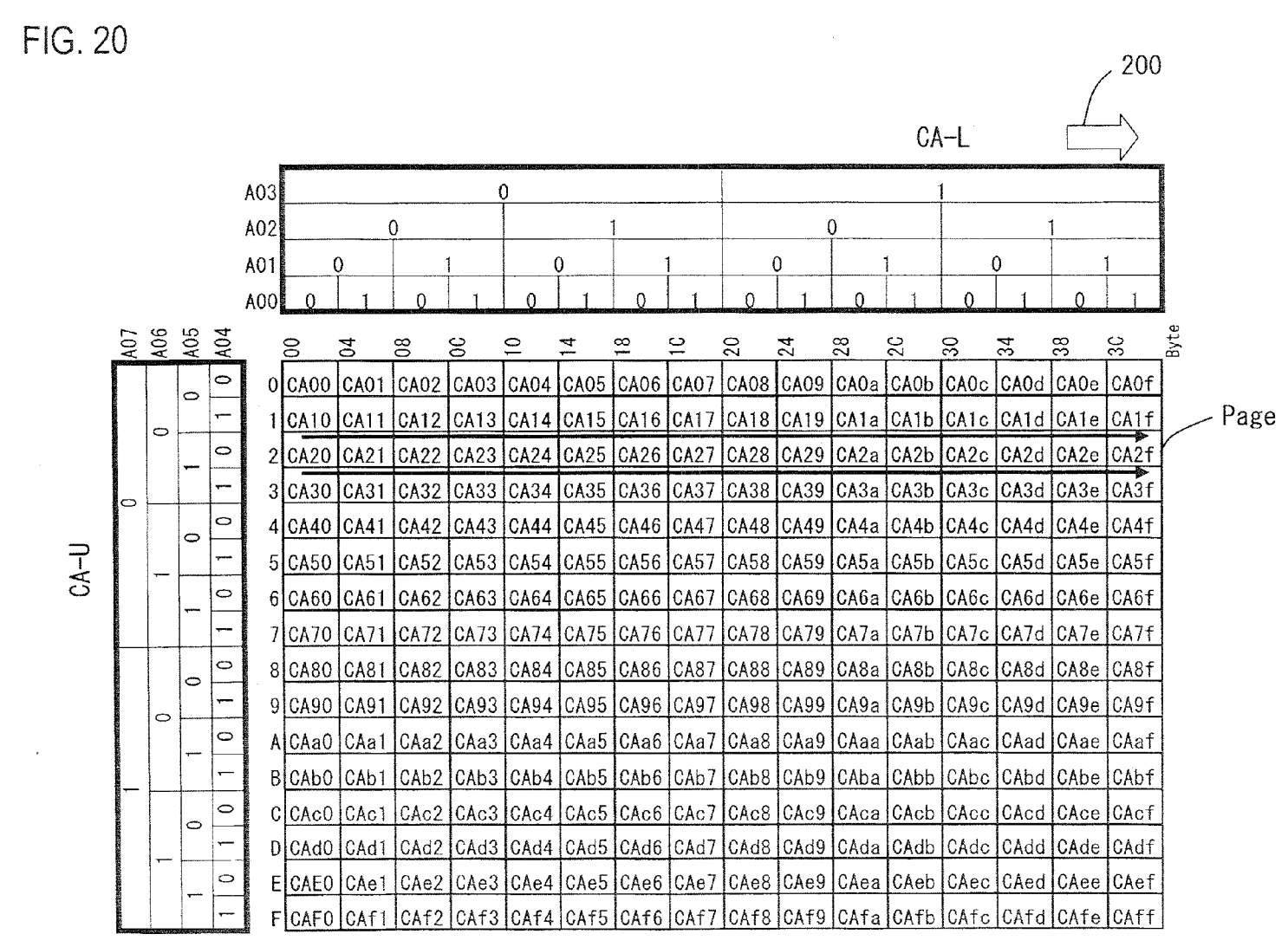

FIG. 20 is a diagram depicting a horizontal scanning access in the page area. In order to access the page area Page while scanning in the horizontal direction (row direction) as indicated by arrows, the column address control unit in the memory device must increment the lower column address CA-L with priority (arrow 200), and increment the upper column address CA-U by a carry signal of the lower column address. Thereby burst read is enabled continuously in the horizontal direction.

Figure 21:
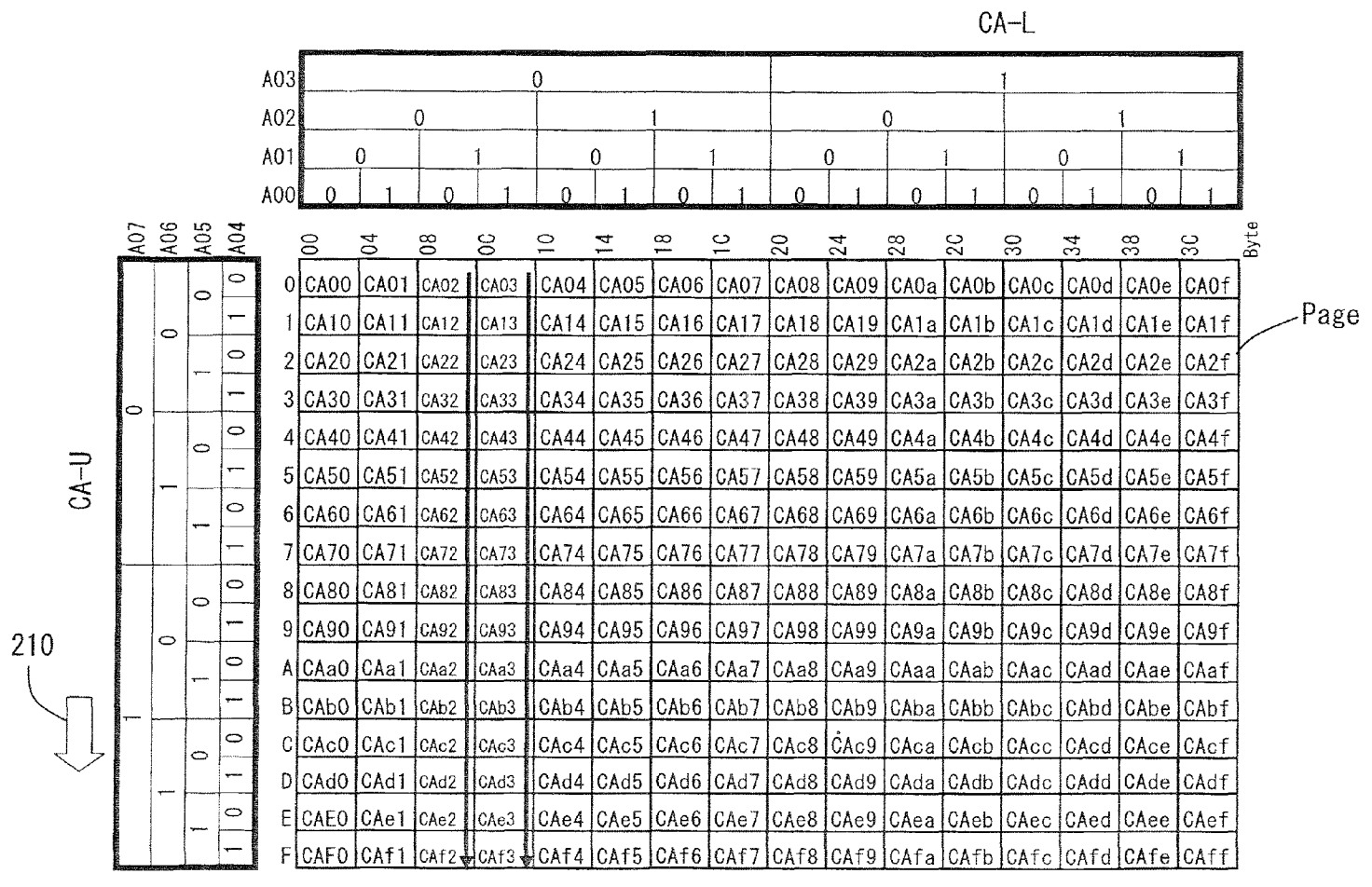

FIG. 21 is a diagram depicting a vertical scanning access in the page area. In order to access the page area Page while scanning in the vertical direction (column direction) as indicated by arrows, the column address control unit in the memory device must increment the upper column address CA-U with priority (arrow 210), and increment the lower column address CA-L by a carry signal of the upper column address. Thereby burst read is enabled continuously in the vertical direction.

Figure 22:
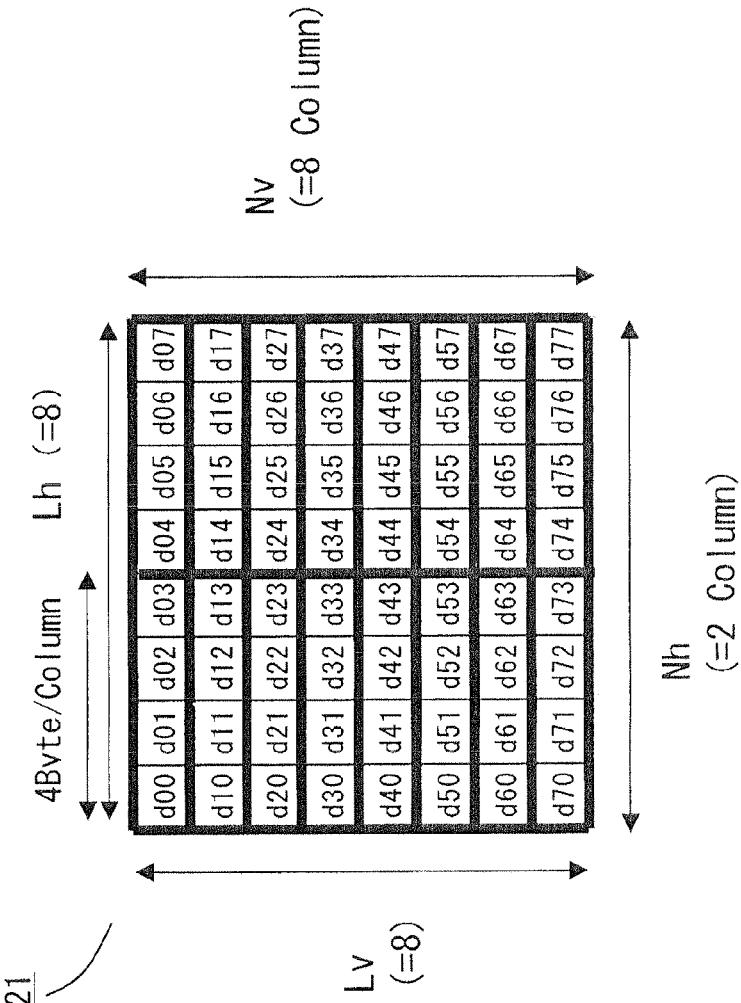
FIG. 22 is a diagram depicting the burst direction determination processing by the memory controller.

FIG. 22 is a diagram depicting the burst direction determination processing by the memory controller. The burst direction determination unit 32 in the memory controller 12 in FIG. 3 performs this determination processing. As 220 in FIG. 22 shows, it is assumed that the input/output terminal DQ of the memory device consists of 32 bits, and the image data of one pixel consists of eight bits. It is also assumed that according to the memory map, pixel data, where the number of pixels in the horizontal direction Dh=4 and the number of pixels in the vertical direction Dv=1, is stored in the memory unit area selected by the column address. And it is assumed that a host system requests access to the access area where inclination=0, a number of pixels in the horizontal direction Lh=8, and a number of pixels in the vertical direction Lv=8, as shown in 221 in FIG. 22. A number of bars and a direction determination processing in this case will be described.

Figure 23:
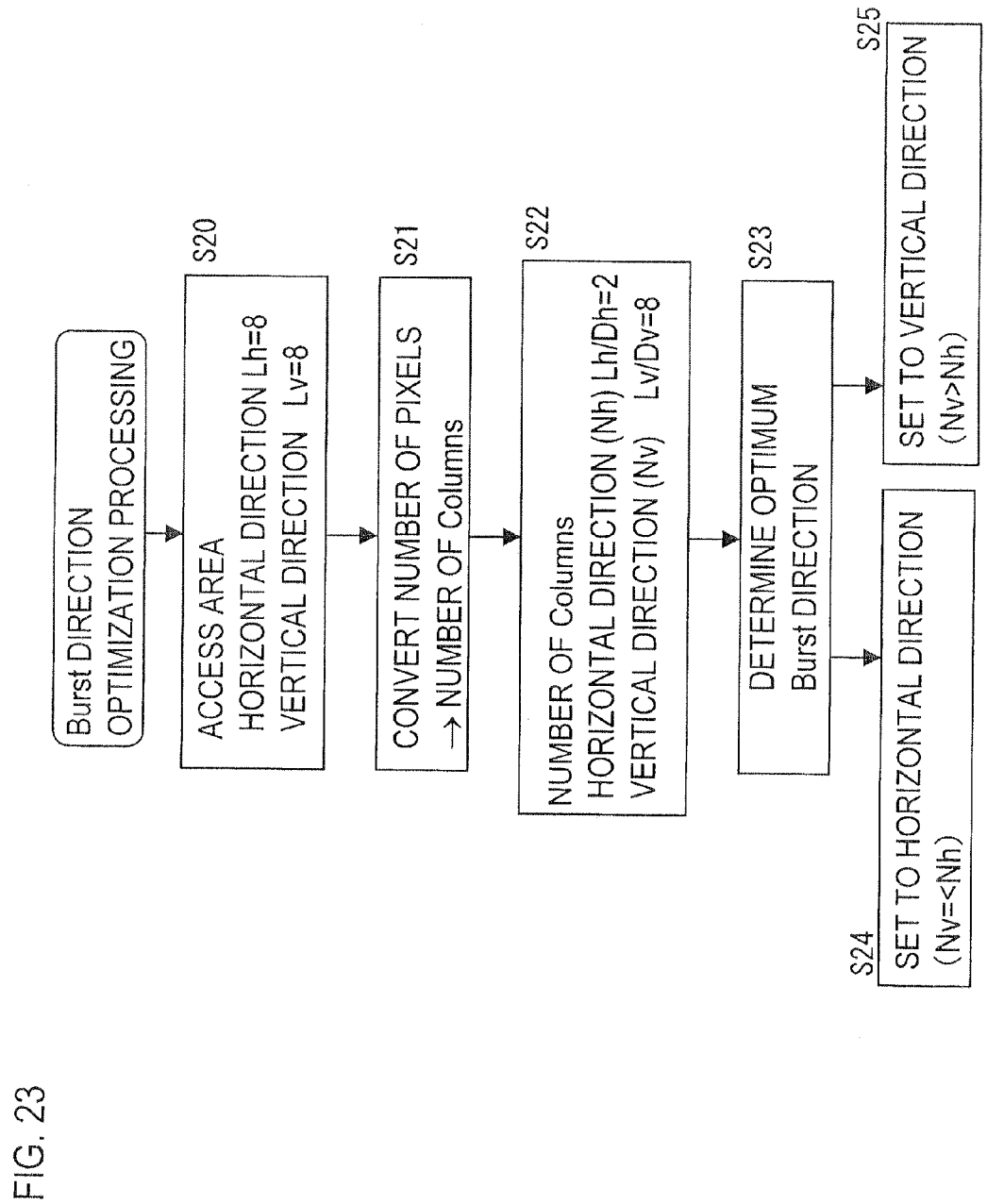
FIG. 23 is a flow chart depicting the burst direction determination processing by the memory controller.

FIG. 23 is a flow chart depicting the burst direction determination processing by the memory controller. The memory controller receives an access request, of which number of pixels in the horizontal direction and the vertical direction of the access area are Lh=8 and Lv=8, from a host system (S20). The burst direction determination circuit in the memory controller converts the number of pixels into a number of columns in the memory device (S21). As a result, as 221 in FIG. 22 shows, the burst direction determination circuit computes the number of columns in the horizontal direction Nh=Lh/Dh=2, and the number of columns in the vertical direction Nv=Lv/Dv=8 (S22). By comparing the number of columns in the horizontal direction Nh and the number of columns in the vertical direction Nv, the burst direction determination circuit determines the optimum burst direction (S23). If Nv≦Nh, the burst direction is set to the horizontal direction (S24). If Nv>Nh, on the other hand, the burst direction is set to the vertical direction. This is because access in the burst mode can be effectively utilized by setting the burst direction to a longer direction.

Figure 24:
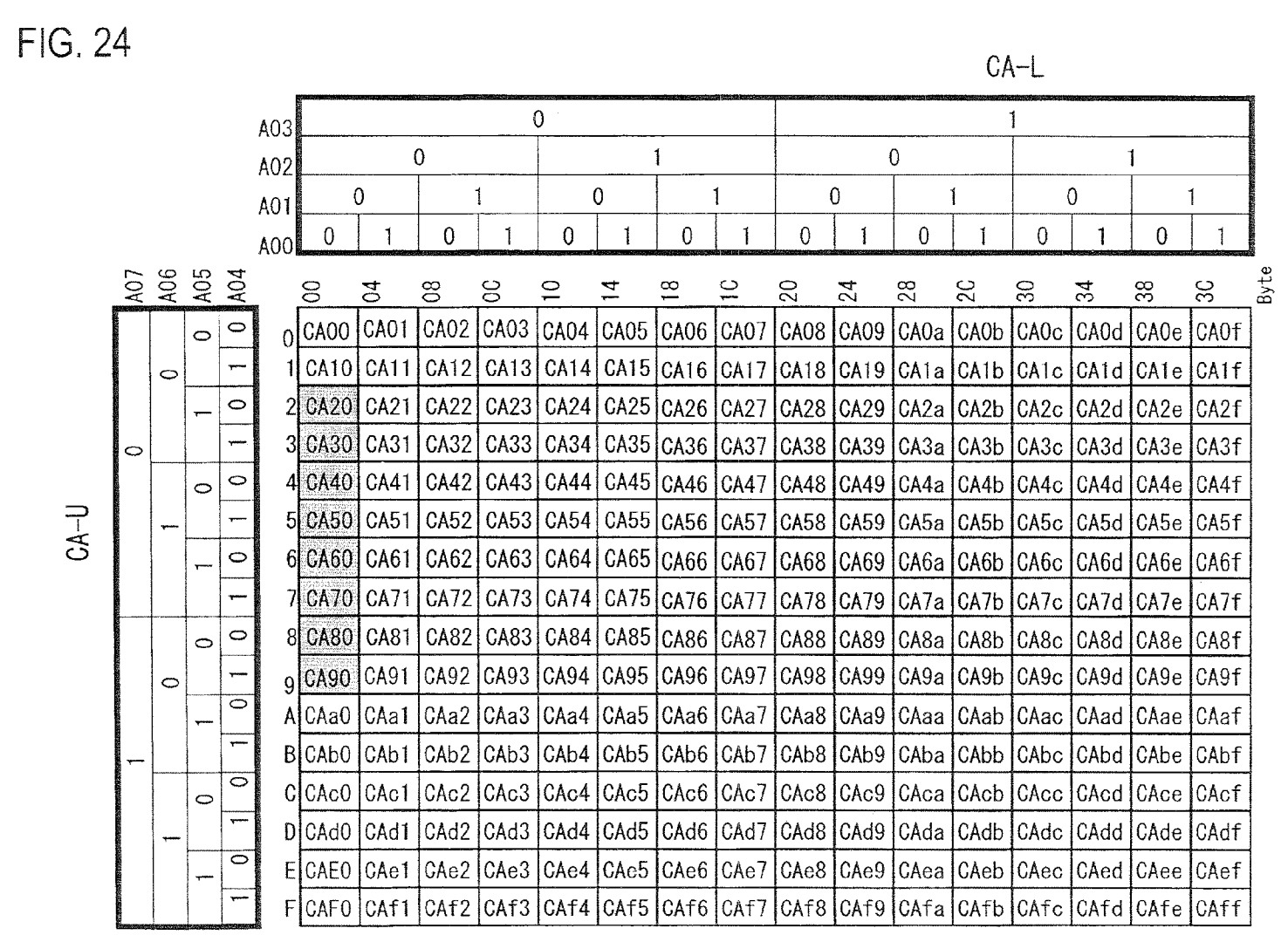

FIG. 24 is a diagram depicting an example of performing scanning access (burst access) in the vertical direction. In this example, four pixels of image data are stored in the memory unit area, and 4×8 pixels of a rectangular area are accessed. Therefore eight memory unit areas in the vertical direction in column addresses CA20 to CA90 must be accessed. In this case, the column address control unit 41 in the memory device increments the upper column address CA-U from the first column address CA20, so as to sequentially generate CA20 to CA90.

Figure 25:
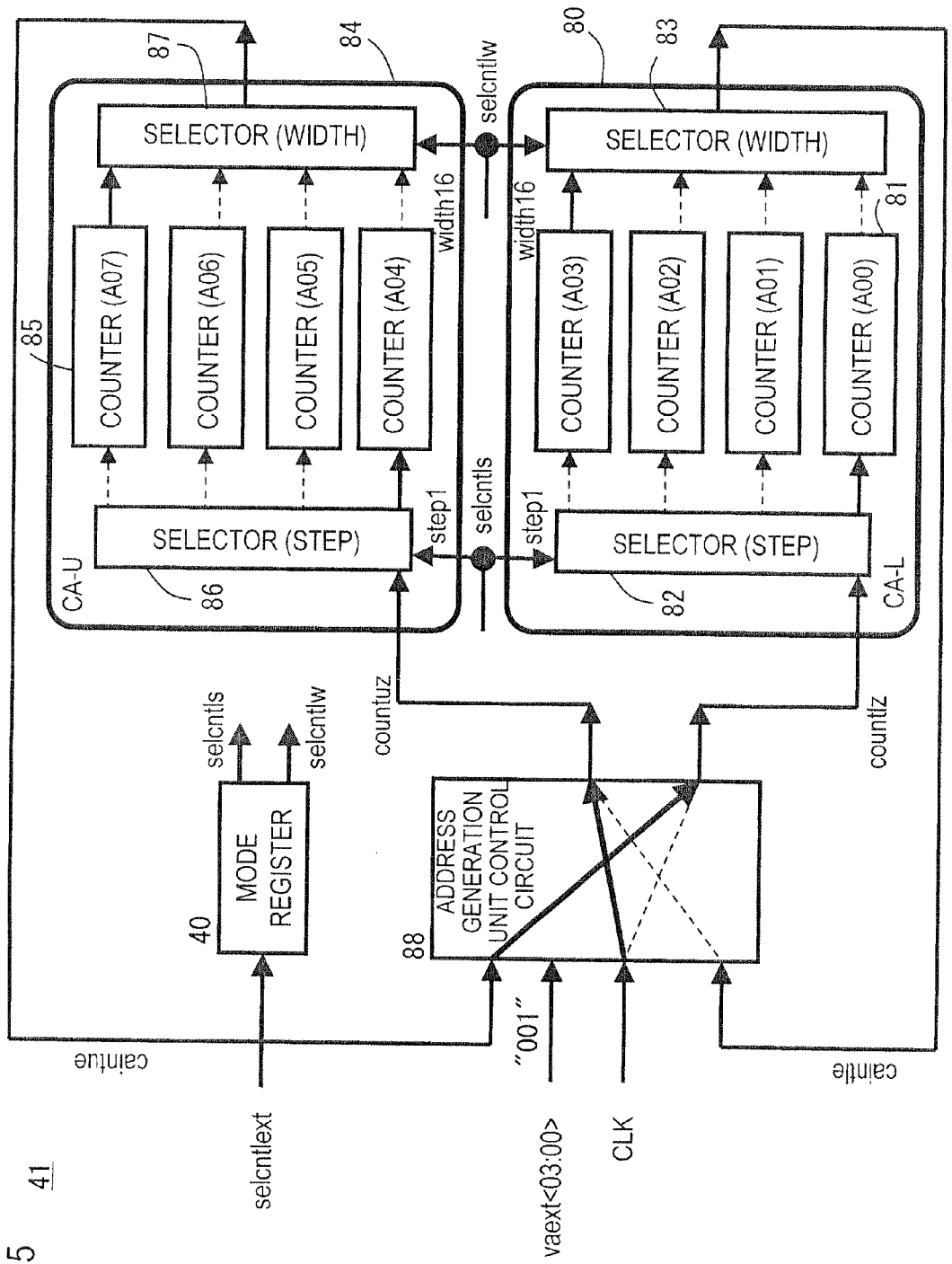
FIG. 25 is a block diagram depicting the column address control unit, which performs scanning access (burst access) in the vertical direction.

FIG. 25 is a block diagram depicting the column address control unit, which performs scanning access (burst access) in the vertical direction. In the column address control unit 41, the lower address generation unit 80 and the upper address generation unit 84 are connected vertically upside down in order to perform burst access in the vertical direction. In other words, the address generation unit control circuit 88 supplies the clock CLK to the upper address generation unit 84 as the count control signal countuz, and supplies the count end signal (carry signal) caintue of the upper address generation unit 84 to the lower address generation unit 80 as the count control signal countlz. The step control signal selcntls is set to the step1 for both the lower and upper address generation units, and the lower counter 81 and the upper counter 85 increment the count value +1 in parallel, responding to the count control signals countlz, countuz respectively. The return width control signal selcntlw is set to the width width16 for both the lower and upper address generation units, and the most significant bits of the lower counter 81 and the upper counter 85 are selected by the selectors 83 and 87.

By the above mentioned setting, first the upper counter 84 increments the count value +1 at a time synchronizing with the clock CLK, then the lower counter 81 increments the count value +1 at a time, synchronizing with the count end signal caintue of the upper counter 84. As a result, the column address control unit 41 sequentially generates addresses from the initial value CA20, which is column address caext0 to 7, supplied from the outside, to the final value CA90, as internal column addresses caint0 to 7.

Figure 26:
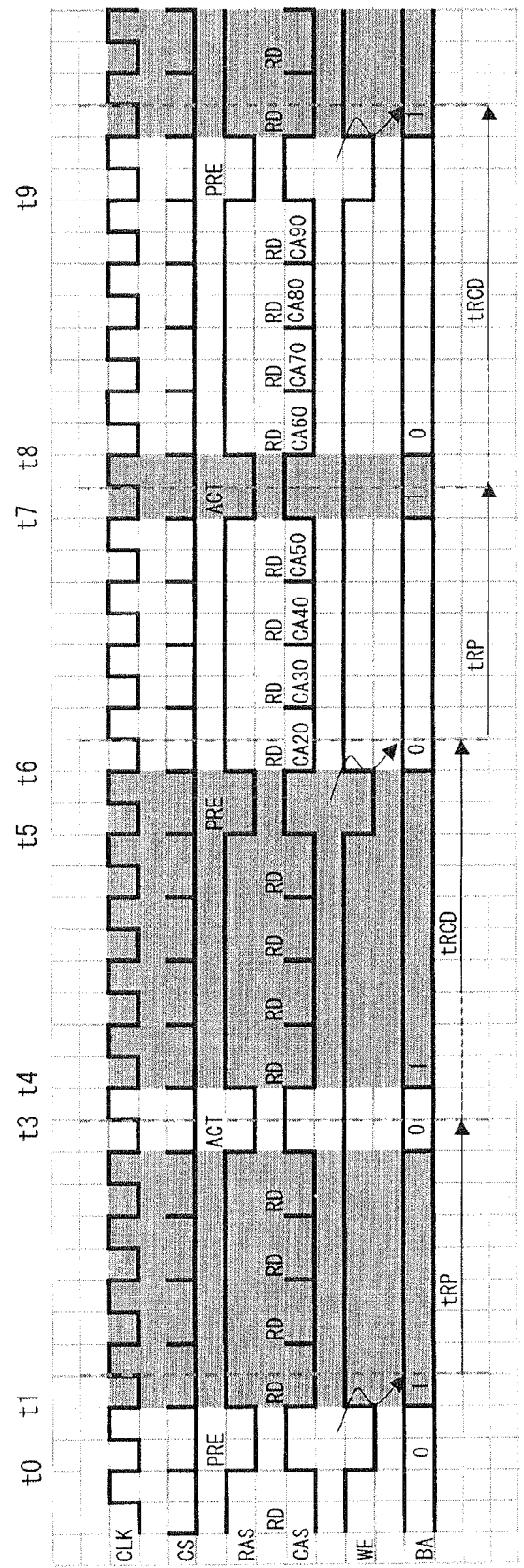
FIG. 26 is a timing chart in the case of scanning in the vertical direction for accessing.
Figure 27:
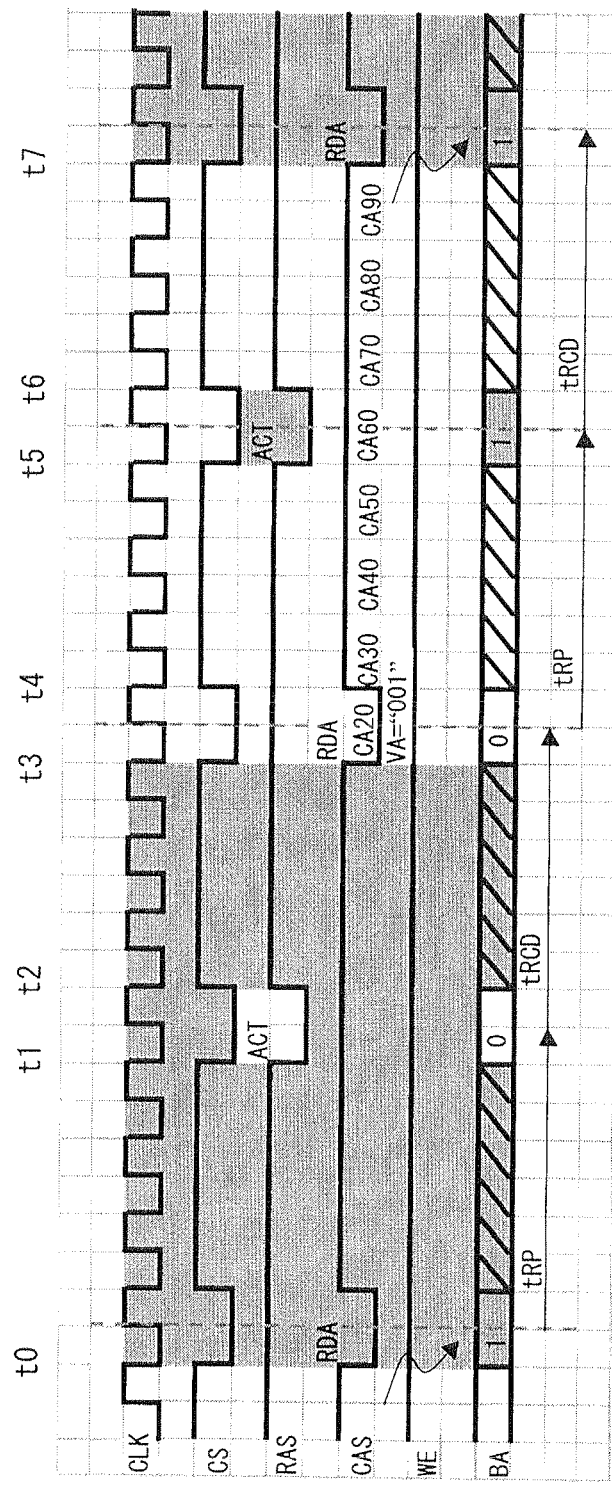
FIG. 27 is a timing chart in the case of scanning in the vertical direction for accessing.

FIG. 26 and FIG. 27 are timing charts in the case of scanning in the vertical direction for accessing. FIG. 26 is a timing chart when the memory device does not have burst mode in the vertical direction. Just like the case of FIG. 18, when the pre-charge command PRE is input to the bank BA0 at time t0, the pre-charge operation is performed in the bank BA0 from time t1. During this time, the read operation is repeated in the bank BA1, responding to the read command RD. At time t3, when RAS pre-charge time tRP elapsed from 1 clock period after time t1, the active command ACT is input to the bank BA0. Therefore a read command is not issued to the bank BA1 during 1 clock period after time t3. Responding to this active command, active operation is performed in the bank BA0 based on a row address, which is not shown in FIG. 26. During this time, the read operation is repeated in the bank BA1, responding to the read command RD again.

At time t6 when the RASCAS delay time tRCD elapsed, the read command RD and the column address CA are continuously input to the bank BA0. The memory device is not in burst mode, but repeats the read operation to the eight memory unit areas disposed in the vertical direction, responding to the eight times of read commands RD and the eight types of column addresses CA20 to CA90, which are continuously input. In the case of the example in FIG. 26, the pre-charge command PRE is issued to the bank BA1 at time t5, and the active command ACT is issued to the bank BA1 at time t7. Therefore the read command RD is not issued to the bank BA0 during 1 clock period from time t7.

In this way, in the case of the example in FIG. 26, where the memory controller scans in the vertical direction for accessing, the column system command, that is the read command RD and the column address CA, must be issued eight times. The memory device cannot operate in burst mode, and continuous input of the read commands is interrupted by the bank interleave operation.

FIG. 27 is a timing chart when the memory device has the burst mode function in the vertical direction. If the read command RD and the first column address CA20 are input once by the operation of the column address control unit 41 in FIG. 25, the column address control unit continuously generates the internal column addresses CA20, CA30, CA40, CA50, CA60, CA70 and CA80, and performs read operation for the 32-bit data continuously eight times. In other words, if the active command ACT is input to the bank BA0 at time t1, the read command RDA, the first column address CA20 and the scanning direction control signal VA=001 are input at time t3 when the RASCAS delay time tRCD elapsed. Since the burst length BL is set to BL=8 in advance, the column address control unit continuously generates the internal column addresses CA20, CA30, CA40, CA50, CA60 CA70 and CA80, and 32 bits×8 times of read operation are executed. During this time, the active command ACT is issued to the bank BA1 at time t5, but the burst read operation in the bank BA0 is not disturbed.

In this way, since the memory device has the burst mode function in the vertical direction, the scanning access in the vertical direction, in the case of accessing a rectangular area having more memory unit areas in the vertical direction, can be performed efficiently.

Figure 28:
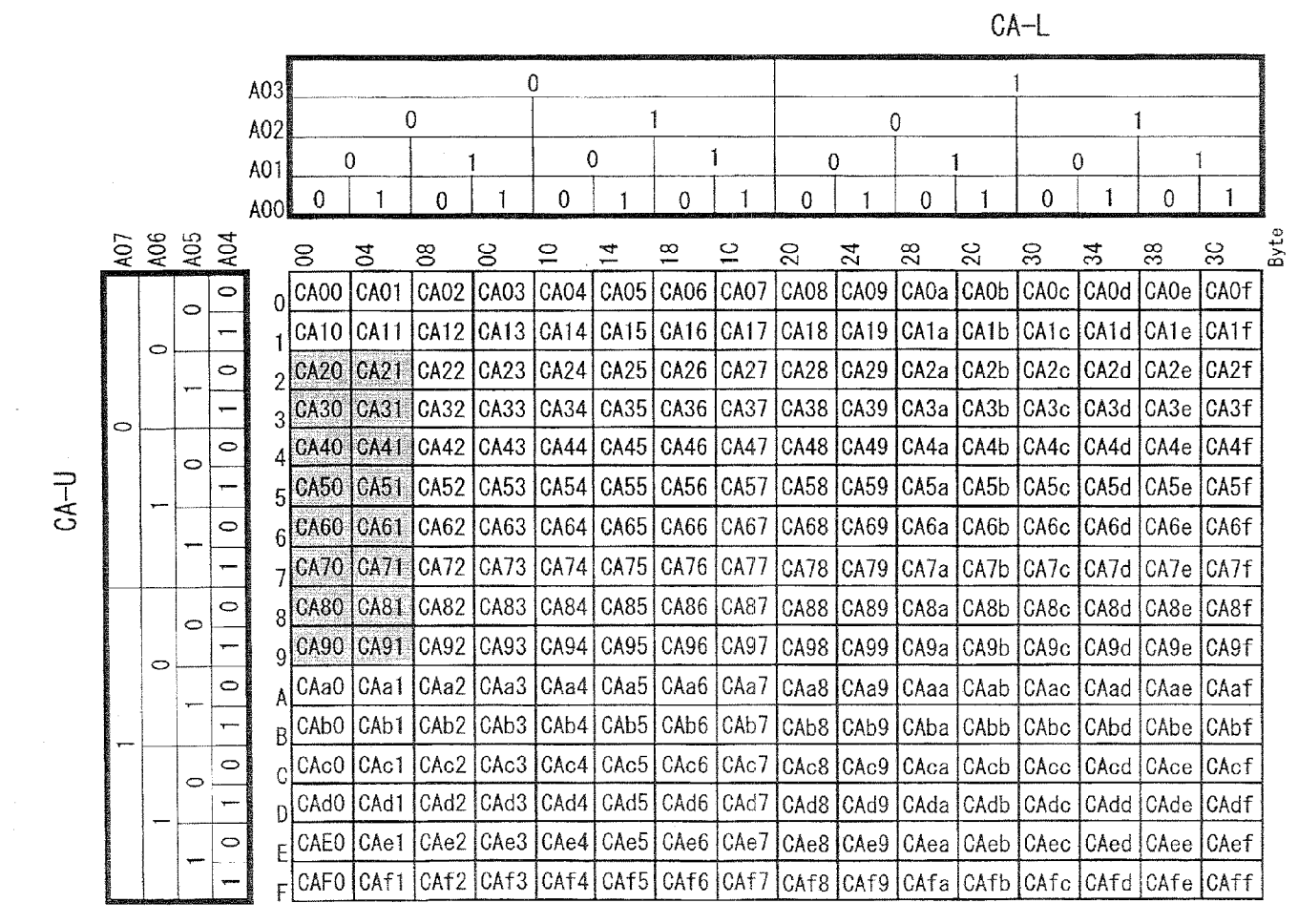

FIG. 28 shows another example of performing scanning access (burst access) in the vertical direction. In this example, four pixels of image data are stored in the memory unit area, and 8×8 pixels of a rectangular area are accessed. Therefore eight memory unit areas in the vertical direction in the column addresses CA20 to CA90 and eight memory unit areas in the vertical direction in the column addresses CA21 to CA91 must be accessed.

In a conventional SDRAM, burst access is possible only in the horizontal direction, so the burst length BL is set to BL=2, and image data in an 8×8 pixels of rectangular area is accessed by supplying the column system command RD or WR eight times, along with the column addresses CA20, CA30, CA40, CA50, CA60, CA70, CA80 and CA90.

In the case of the memory device which can perform burst access in the vertical direction according to the present embodiment, on the other hand, the image data in an 8×8 pixels of rectangular area can be accessed if the burst length BL is set to BL=8 and the column system command RD or WR is supplied to the memory device twice, along with the column addresses CA20 and CA21. Therefore a busy state of the bus between the memory controller and the memory device can be decreased.

[Special Scanning Accesses]

As special scanning accesses, a reduced burst access, a burst access of a rectangular area, and a forward and reverse access will be described.

[Reduced Burst Access]

FIG. 29 is a diagram depicting an access when motion prediction is performed. In this example, 8 bits of data are mapped in each pixel in the memory device of the DQ interface, of which word configuration is ×16 bits. In the motion prediction, it is assumed that ±4 pixels are searched in the vertical direction, and ±8 pixels are searched in the horizontal direction for 4×4 pixels of a rectangular (square) area 290 enclosed by a bold frame. In other words, in the case of a motion vector search, processing to compare the image data of the rectangular area 290 and the image data of the rectangle at the moving destination is performed nine times while the rectangular area 290 is moving in the column direction in the rectangular area 292, and nine times while the rectangular area 290 is moving in the row direction, a total of 81 times. If matched image data is detected, the direction from the rectangular area 290 to a detected rectangular area, becomes the motion vector.

Figure 31:
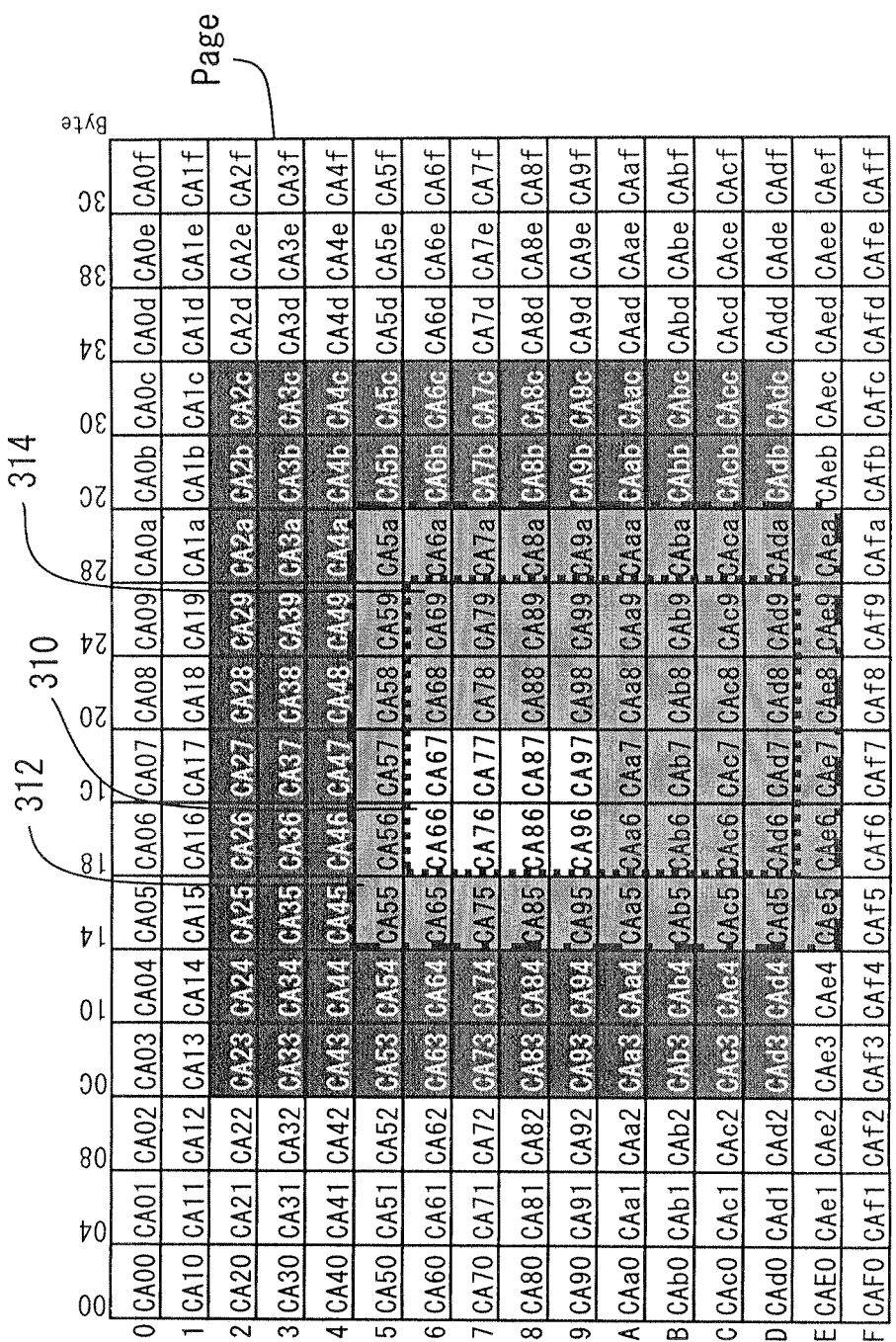
FIG. 31 is a diagram depicting other accesses when motion prediction is performed.

FIG. 30 and FIG. 31 are diagrams depicting other accesses when motion prediction is performed. In this example as well, 8 bits of data are mapped in each pixel in the memory device of the DQ interface, of which word configuration is ×16 bits. The motion vector is searched for 4×4 pixels of a rectangular area.

In the case of the access example in FIG. 30, an area generated by reducing 8×8 pixels of rectangular area 300 (rectangular area enclosed by CA46-CA49-CAb9-Cab6), which is a double size of the processing target rectangle, to ½ in the matrix directions, is searched with an area generated by reducing the rectangular area 302 (rectangular area enclosed by CA24-CA2d-Cadd-Cad4) to ½ in the matrix directions. For the first search, access and comparison processing are performed four times in the row direction, and three times in the column direction, a total of twelve times.

Then as FIG. 31 shows, it is assumed that the optimum position in the first search is the rectangular area 314 (area enclosed by CA66-CA69-Cad9-Cad6) of which upper left corner is the memory unit area in the column address CA66. In this case, in the second search, the 4×4 pixels of rectangular area 310 (area enclosed by CA66-CA67-CA97-CA96) is searched in the rectangular area 312 (area enclosed by CA55-CA5a-Caea-Cae5) which is one size larger than this rectangular area 314. In this search, ½ reduction is not performed. Also in this search, access and comparison processing are performed five times in the row direction, and seven times in the column direction, a total of 35 times. Since the access and comparison processing is performed twelve times in the first search in FIG. 30, the total in the first and second searches is 12+35=47 times. This count is about 58% of the 81 times in the case of FIG. 29.

The above mentioned two-step search algorithm is already known. If the two-step search algorithm is used, the memory controller cannot use burst read to access data reduced to ½ in FIG. 30, so the column system commands and the corresponding column addresses must be issued to the memory device eight times. It is also possible to access data, which is not reduced to ½, by burst read, and discard unnecessary data. However in both cases, access efficiency to the memory device drops considerably.

Figure 32:
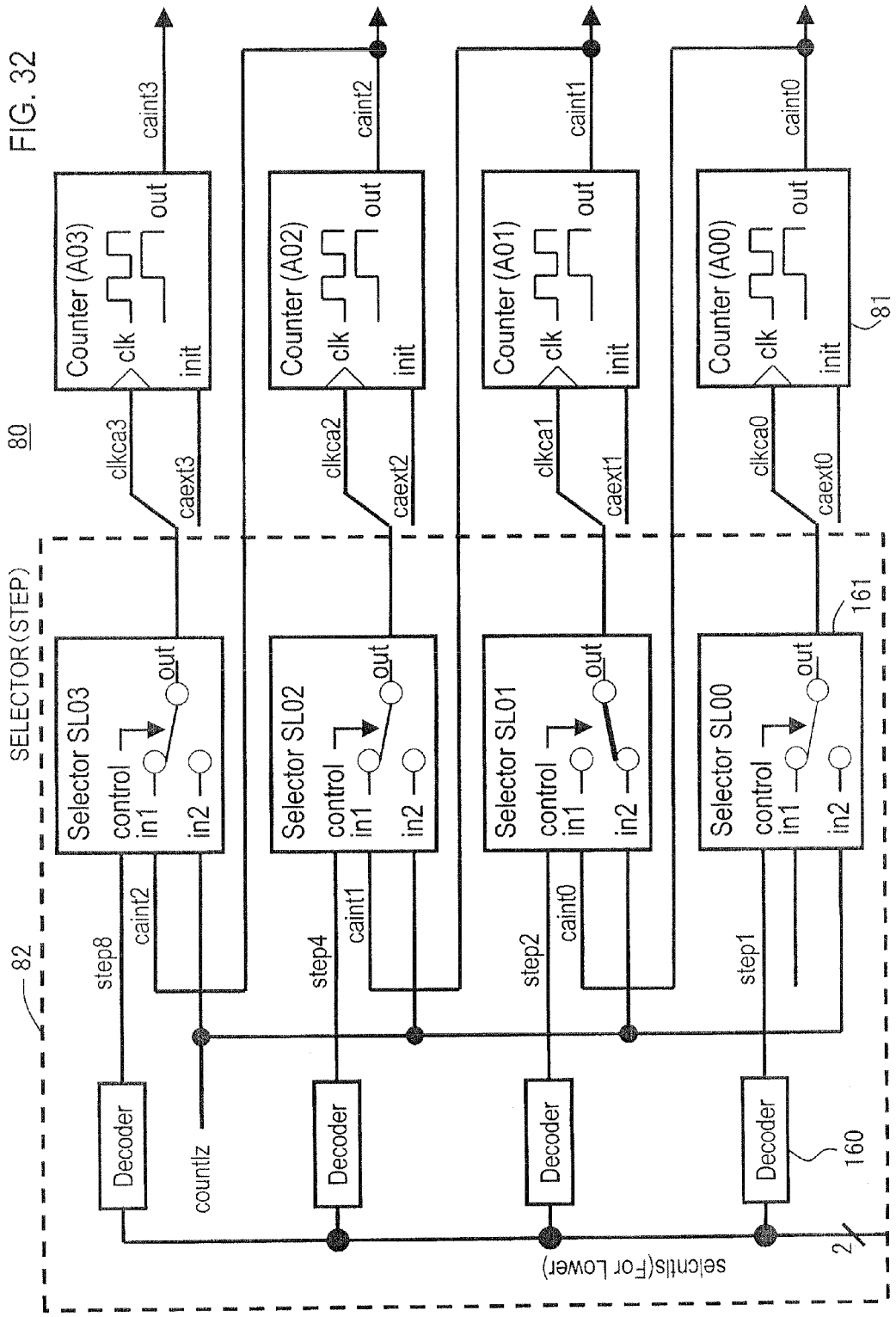
FIG. 32 is a block diagram depicting the column address control unit, which performs the first search of the two-step search algorithm.
Figure 33:
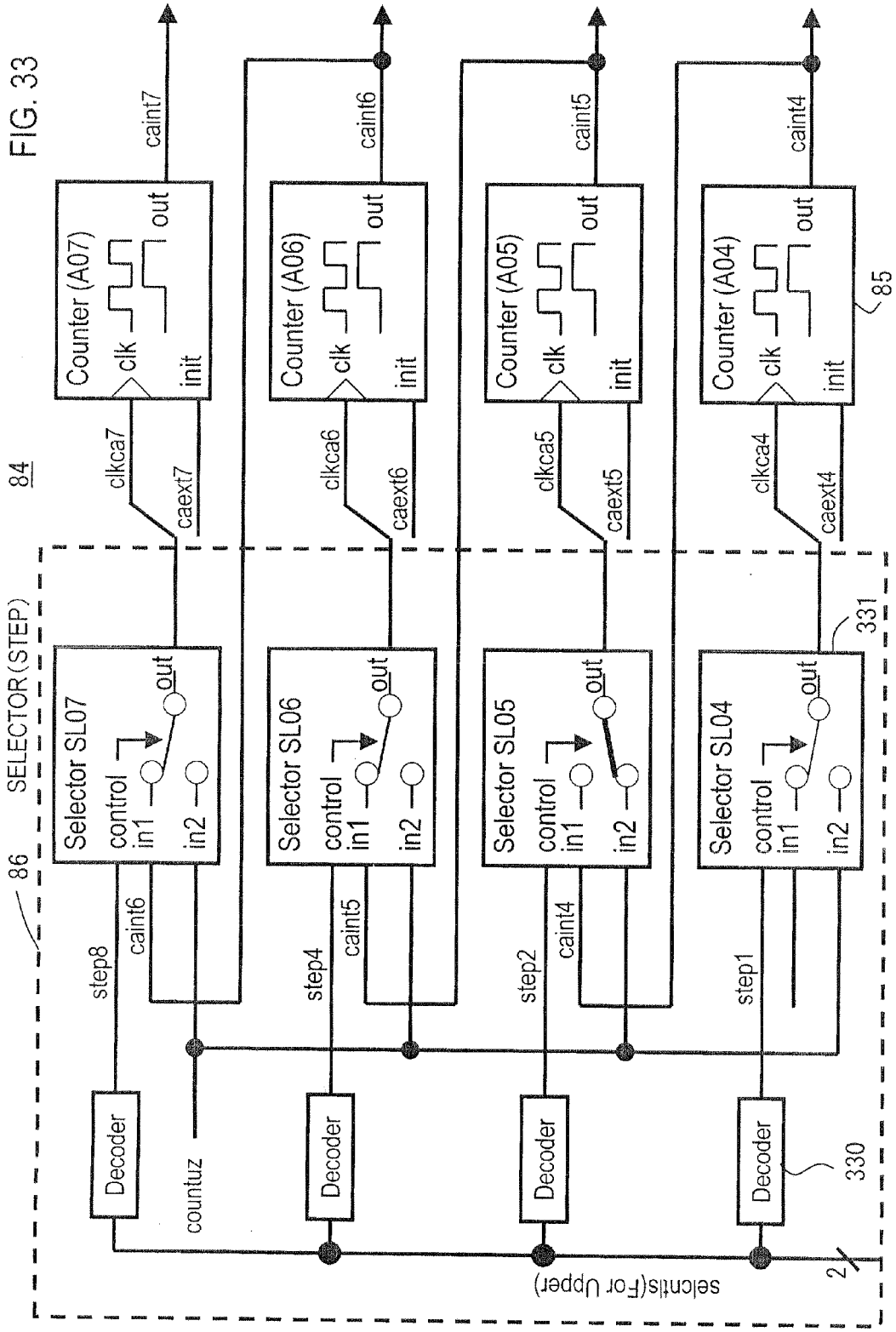
FIG. 33 is a block diagram depicting the column address control unit, which performs the first search of the two-step search algorithm.

FIG. 32 and FIG. 33 are block diagrams depicting the column address control unit, which performs the first search of the two-step search algorithm. FIG. 32 shows a part of the lower address generation unit 80, and FIG. 33 shows a part of the upper address generation unit 84.

The configuration of the column address control unit in the first search is similar to the configuration shown in FIG. 25. In other words, the address generation unit control circuit 88 supplies the clock CLK to the upper address generation unit 84 as the count control signal, and supplies the count end signal caintue of the upper address generation unit 84 side to the lower address generation unit 80 as the count control signal. Thereby the burst access to the rectangular area, which is longer in the vertical direction, can be performed efficiently. Furthermore, the step setting circuits 82 and 86 of the lower and upper address generation units set the step width in Step2. Thereby the count value can be incremented with step width 2, synchronizing with the count control signal, and burst access, to the memory unit areas reduced to ½, can be performed.

Now FIG. 32 and FIG. 33 will be described. As mentioned above, in the first search, the memory unit areas reduced to ½ must be accessed. So in the lower and upper address generation units 80 and 84, the selectors SL01 and SL05 select the count control signals cuntlz and countuz by the step control signal selcntls=Step2, and output the count control signals to the counter 81 and 85 as clocks clka1 and clkca5. Thereby the increment operation is performed in digits equal to or higher than A01 and A05 of the counter 81 and 85, synchronizing with the clock CLK in the burst mode. As a result, the lower and upper address generation units 80 and 84 increment the internal column addresses with increment (step count) 2. Therefore even in accessing a rectangular area reduced to ½, shown in FIG. 32, burst mode can be used. No clock is input to the input int1 of the selector SL00 of the lower address generation unit 80 in FIG. 32. In the same manner, no clock is input to the input int1 of the selector SL04 of the upper address generation unit 84 in FIG. 33. Therefore the initial setting values of the column addresses A00 and A04 are maintained in the A00 and A04 bits of the counter.

Figure 34:
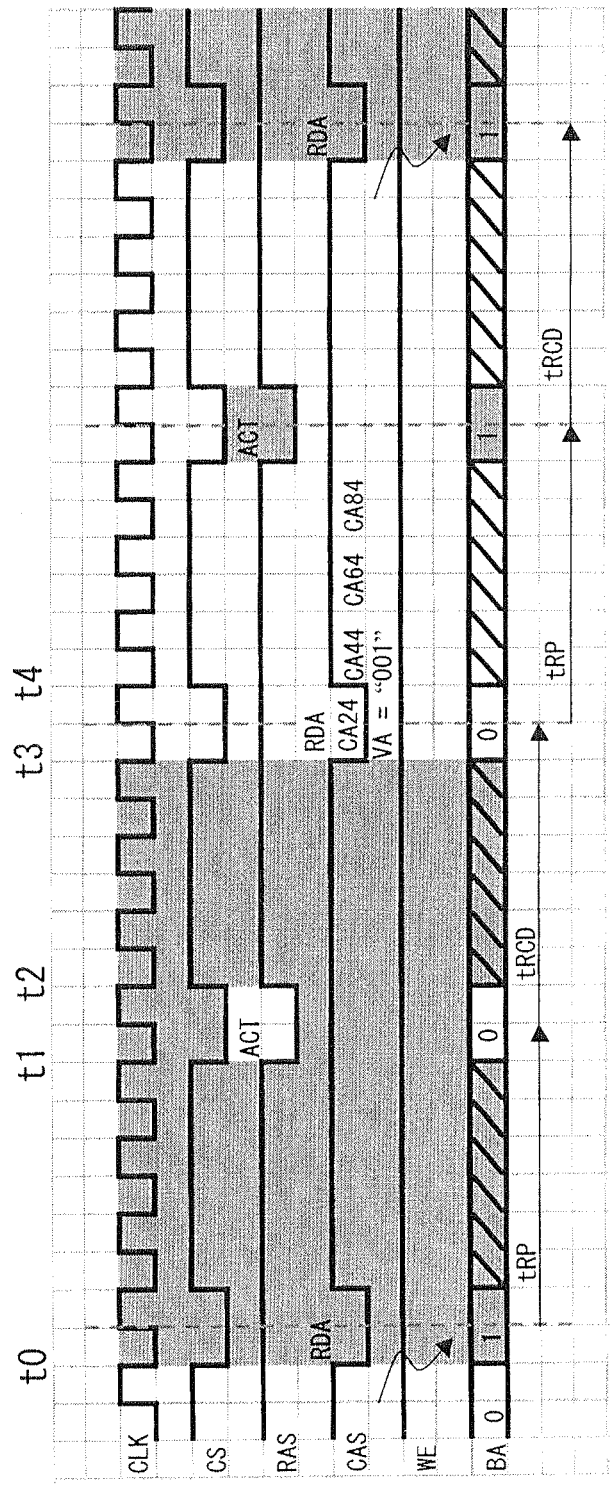
FIG. 34 is a timing chart of the memory device in the first search of the two-step search algorithm.

FIG. 34 is a timing chart of the memory device in the first search of the two-step search algorithm. As this timing chart shows, at time t3, the read command RDA is input to the memory device, along with the bank address BA0, column address CA24 and vector address VA=001. Responding to this, the column address control unit in the memory device sequentially generates the internal column addresses CA24, CA44, CA64 and CA84, and continuously accesses the memory unit areas of the column addresses CA24, CA44, CA64 and CA84 in FIG. 30.

As mentioned above, burst access to the memory unit areas reduced to ½ become possible by setting the selectors in the step setting circuits 82 and 86 to step Step2 by the step control signals selcntls and selcntus in the lower and upper address generation units 80 and 84. In the same manner, burst access to the memory unit areas after ¼ reduction or after ⅛ reduction possible if the selectors are set to the step Step4 or Step8. The above is the description on reduced burst access.

[Burst Access to Rectangular Area]

Now burst access to a rectangular area will be described. By setting the return width setting circuits 83 and 87 using the return width control signal selcntlw of the lower and upper address generation units of the present embodiment, arbitrary count end values can be set for the lower and upper address generation units. Thereby the address generation unit can repeatedly generate count values in an arbitrary range synchronizing with the clock CLK. Utilizing this, a rectangular area, which consists of memory unit areas having different column addresses in the matrix directions, can be burst-accessed by issuing a column system command and a first column address once. Because of the restriction in the counter operation, the return address of the column address in the rectangular area is CA=1, 3, 7 and F for both lower and upper addresses.

Figure 35:
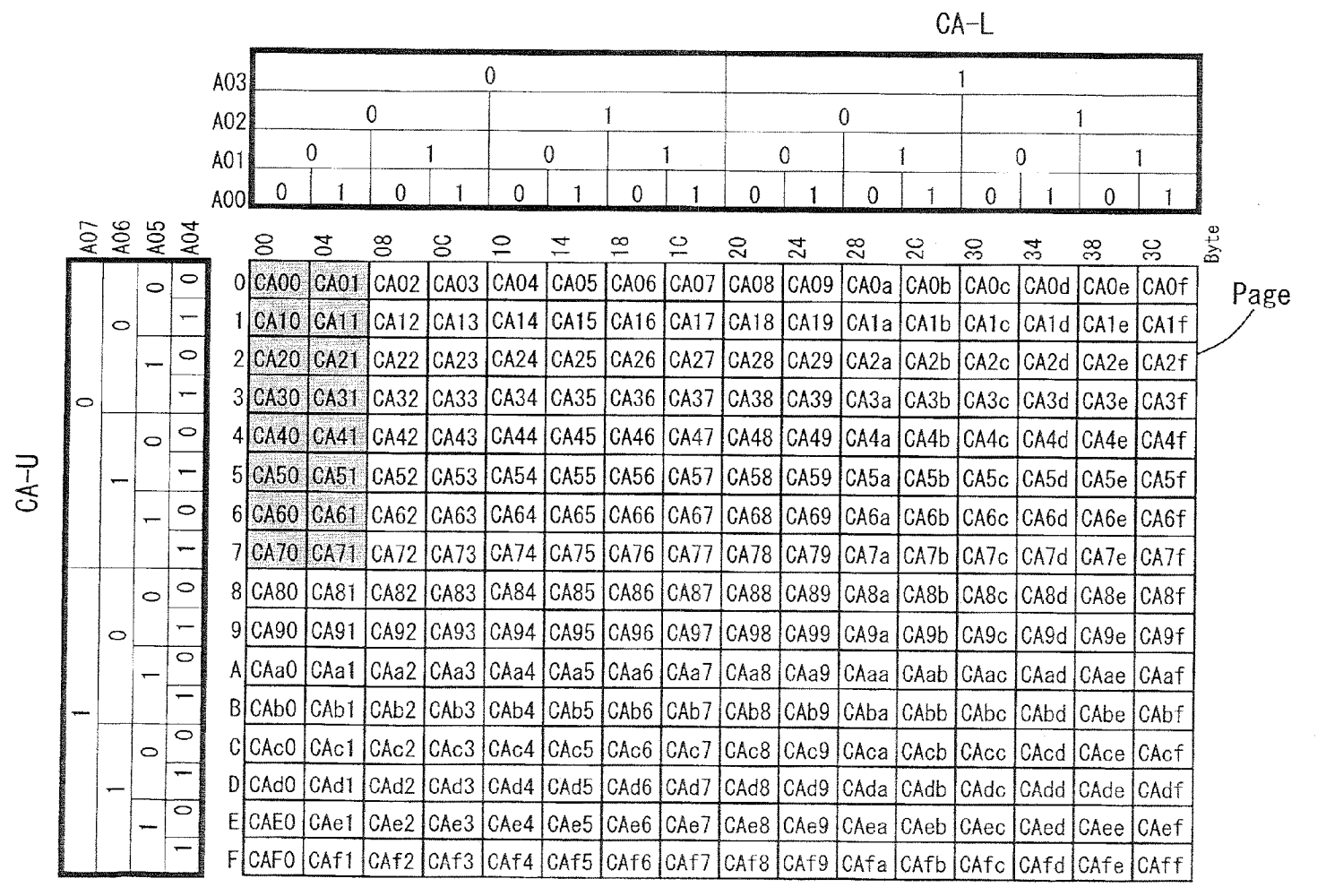

FIG. 35 is a diagram depicting a burst access to a rectangular area according to the present embodiment. It is assumed that the rectangular area enclosed by the column addresses CA00-CA01-CA71-CA70 in FIG. 35 is burst-accessed. In the case of a conventional burst access, the burst length BL is set to BL=2, and eight times of the column system command with the column addresses CA00, CA10, CA20, CA30, CA40, CA50, CA60 or CA70 are supplied to the memory device. If the scanning access in the vertical direction, described in FIG. 25 and FIG. 27, is possible, the burst length BL is set to BL=8, and the column system command with the column address CA00 or CA01 are supplied to the memory device twice.

In the case of burst access to the rectangular area in FIG. 35, on the other hand, if the column system command and the first column address CA00 of the rectangular area are supplied to the memory device once, then the memory device sequentially generates 16 internal column addresses internally, and burst-accesses the 16 memory unit areas. For this, the return width control signal selcntlw must be set in the column address control unit.

Figure 36:
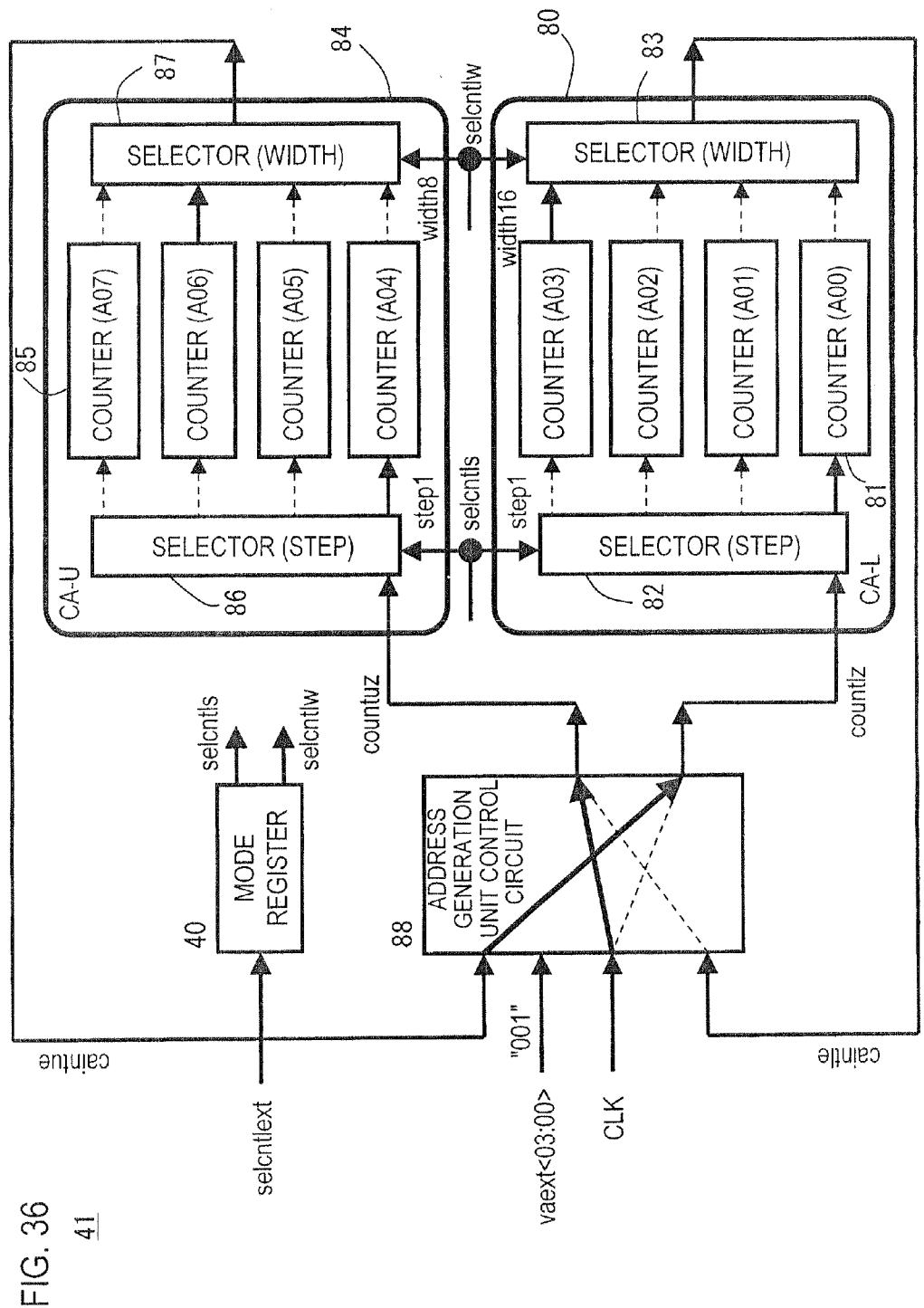
FIG. 36 is a block diagram depicting the column address control unit in the case of burst-accessing the rectangular area according to the present embodiment.

FIG. 36 is a block diagram depicting the column address control unit in the case of burst-accessing the rectangular area according to the present embodiment. In the column address control unit 41, the address generation unit 88 supplies the synchronization clock CLK to the count control signal countuz of the upper address generation unit control circuit 84, and supplies the count end signal (carry signal) caintue of the upper address generation unit 84 to the count control signal countlz of the lower address generation unit 80, so as to enable scanning access in the vertical direction. Then the step control signal selcntls is set in Step1 for both the lower and upper address generation units, and the return control signal selcontlw is set to Width16 and Width8 for the lower and upper address generation units respectively. And if the burst length BL is set to BL=16, the column address control unit sequentially generates the internal column addresses CA00, CA10, CA20, CA30, CA40, CA50, CA60 and CA70 based on the first column address CA00 by the increment operation of the upper address generation unit 84, and then outputs the carry signal of the counter A06 as the count end signal (carry signal) caintue, and inputs this signal to the counter A00 as the count control signal countlz of the lower address generation unit. Responding to this, the lower address generation unit 80 increments the lower address +1. The column address control unit also sequentially generates the internal column addresses CA01, CA11, CA21, CA31, CA41 CA51, CA61 and CA71 by the increment operation by the upper address generation unit 84 based on the column address CA01 incremented by the lower address generation unit side. Thereby the rectangular area can be accessed by the burst access with the burst length 16.

Figure 37:
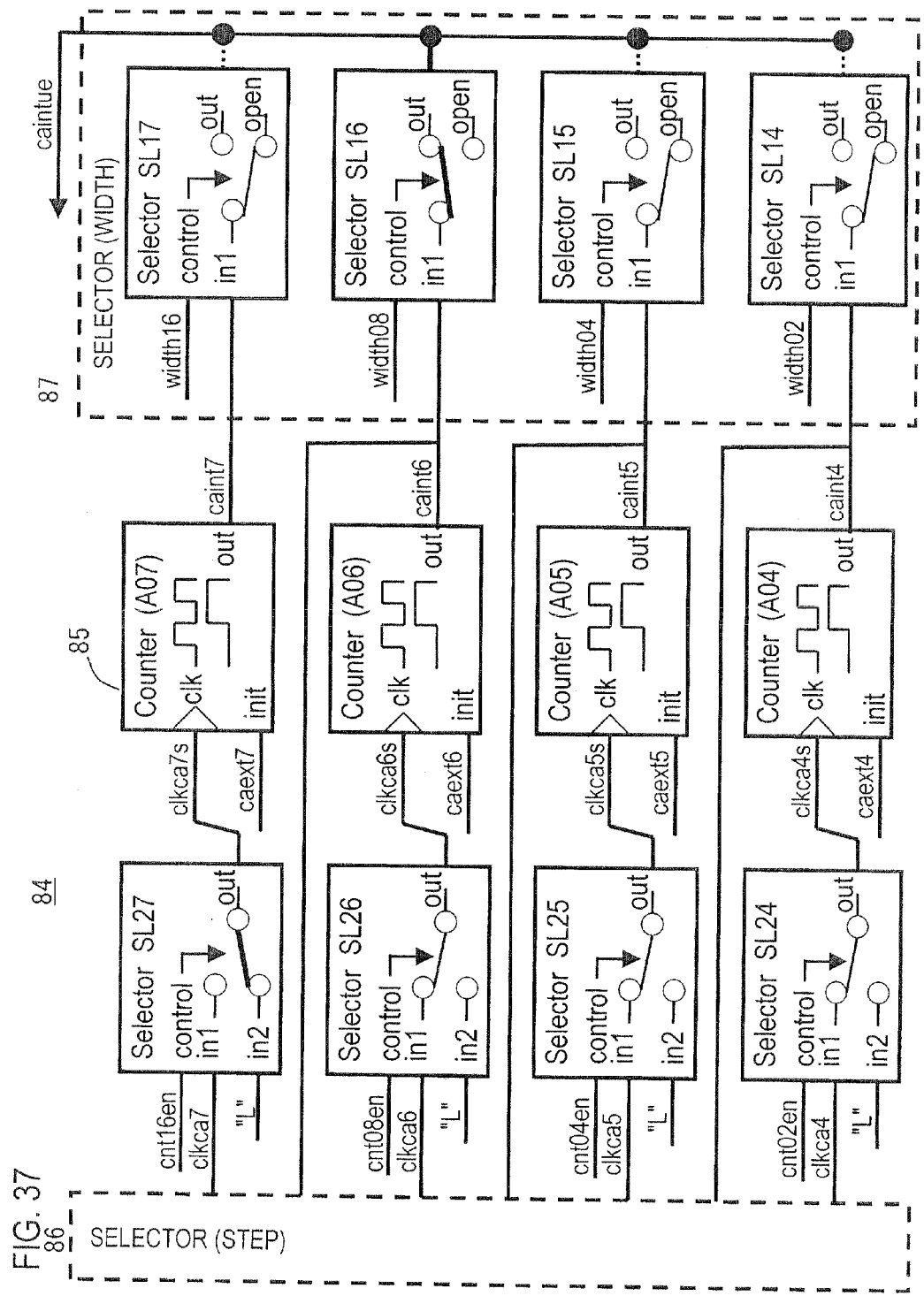
FIG. 37 is a block diagram depicting a part of the upper address generation unit in the case of burst-accessing the rectangular area.
Figure 38:
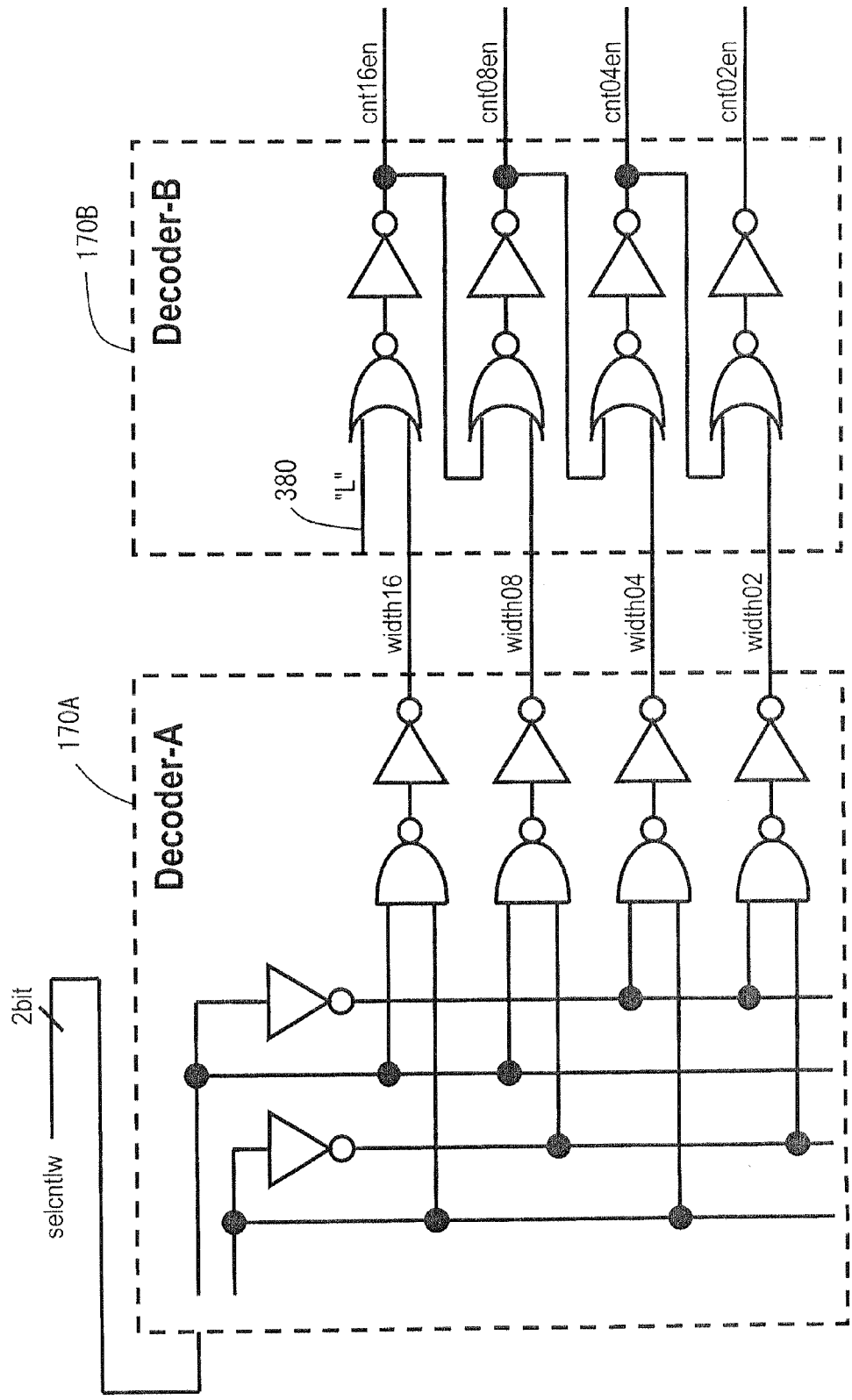
FIG. 38 is a block diagram depicting a part of the upper address generation unit in the case of burst-accessing the rectangular area.

FIG. 37 and FIG. 38 are block diagrams depicting a part of the upper address generation unit in the case of burst-accessing the rectangular area. As FIG. 37 shows, the upper address generation unit 84 has a 4-bit counter 85 between the step setting circuit 86 and the return width setting circuit 87. The return width setting circuit 87 has a selector group SL14 to SL17 and a selector group SL24 to SL27. As FIG. 38 shows, the upper address generation unit 84 has a first decoder 170A, which generates control signals width02 to 16 for controlling the selector group SL14 to SL17, and a second decoder 170B, which generates control signals cnt02*en* to cnt16*en* for controlling the selector group SL24 to SL27.

In the upper address generation unit 84 in FIG. 37, the decoder 170A controls only the return width width08 to the H level based on the return width control signal selcntlw, and only the selector SL16 selects the output caint6 of the counter A06, and outputs this as the count end signal caintue. In the same manner, responding to the return width width08=H, the decoder 170B in FIG. 38 controls the control signals cnt08*en*, cnt04*en* and cnt02*en* to H level, controls only the control signal cnt16*en* to L level, the selector SL27 selects the input int, and the other selectors SL26, SL25 and SL24 select the input in1. Thereby a 3-bit counter constituted by the counters A04, A05 and A06 is constructed, and the internal column addresses caint4 to 6 sequentially becomes 000-111. The most significant address caint7 is fixed to the initial value caext7. In other words, the decoder circuit 170B in FIG. 38 generates the control signals cnt02*en* to cnt16*en* according to the return width signals width02 to 16, since the control signal 380 is set to L level. In concrete terms, if width02, out of the return width signals width02 to 16, is width02=H, then cnt02*en*=H and the 1-bit counter is set. If width04=H, then cnt02*en* and cnt04*en*=H, and the 2-bit counter is set. If width 16=H, then cnt02*en*, cnt04*en*, cnt08*en* and cnt16*en*=H, and the 4-bit counter is set.

By this configuration, the column address control unit sequentially increments the upper column addresses from the first column address CA00, and if the internal column address reaches CA70, the upper internal column address is returned to 0000, and the upper column addresses are sequentially incremented again from the column address CA01 until reaching CA71. Thus 16 internal column addresses CA00 to CA70 and CA01 to CA71, corresponding to the burst length 16, are generated. By appropriately setting the return control signal like this, the lower column addresses or the upper column addresses can be returned with 2, 4, 8 or 16, and the internal column addresses required for burst-accessing a rectangular area can be generated.

If the count control signals are connected to the lower and upper address generation units in a standard manner in FIG. 36, then the rectangular area, which is longer in the horizontal direction, can be burst-accessed by issuing the column system command and the first column address once.

Figure 39:
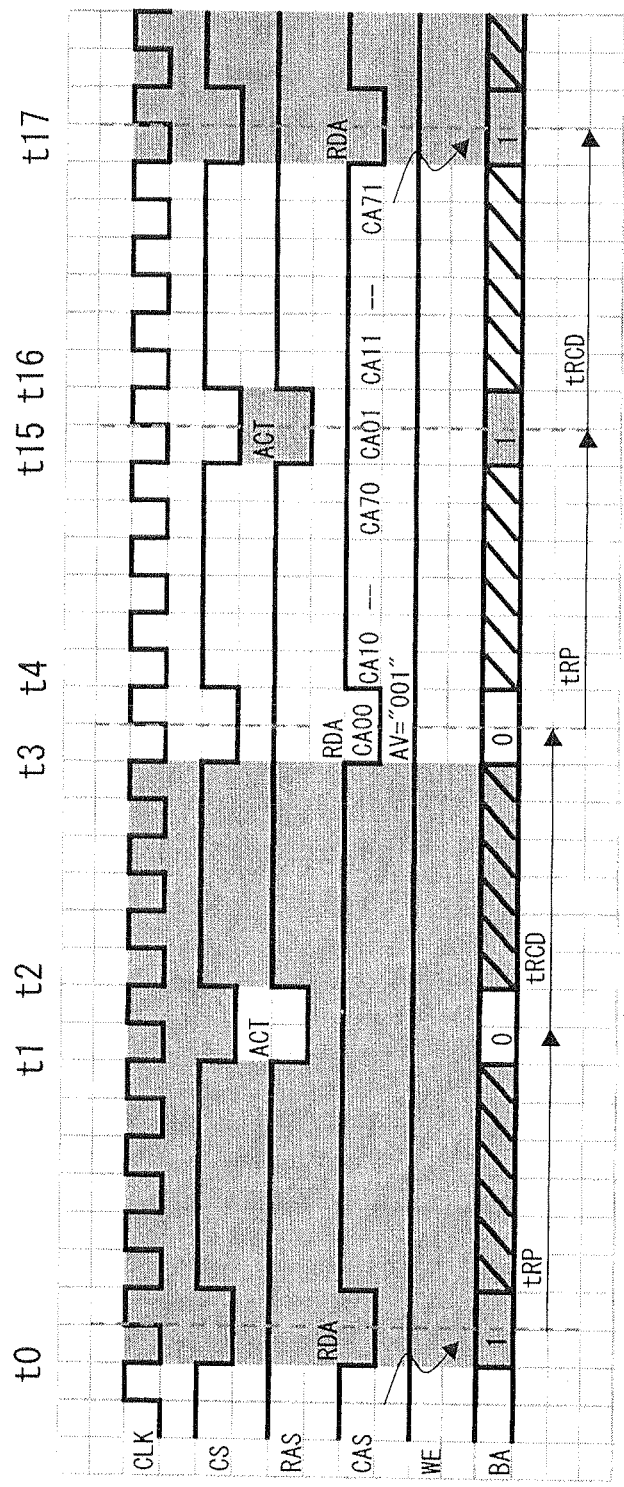
FIG. 39 is a timing chart of the memory device in the case of burst-accessing the rectangular area.

FIG. 39 is a timing chart of the memory device in the case of burst-accessing the rectangular area. FIG. 39 is a timing chart of the burst access similar to FIG. 27, and if the column address CA00 and vector address VA=001 are input along with the read command RDA at time t3, the column address control unit in the memory device sequentially generate the internal column addresses CA00, CA10 to CA70, CA01 and CA11 to CA71 at time t3 and later. As a result, the memory device burst-accesses the rectangular area with burst length 16 by inputting the column system command and the column address once.

[Forward and Reverse Access]

Figure 40:
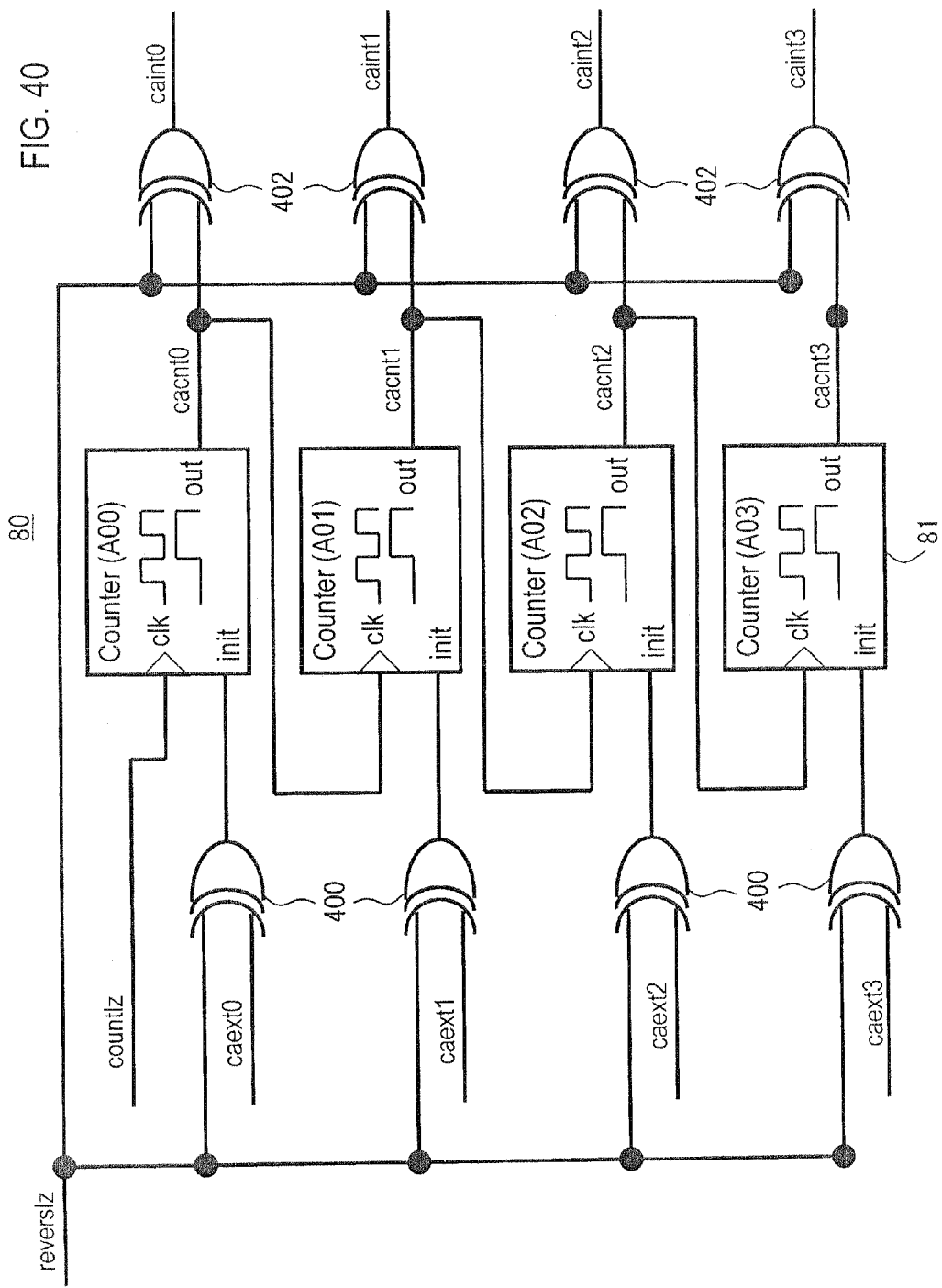
FIG. 40 is a block diagram depicting a part of the lower address generation unit in the case of reverse access.

FIG. 40 is a block diagram depicting a part of the lower address generation unit in the case of reverse access. FIG. 40 shows only the counter 81 of the lower address generation unit 80, and the step setting circuit and the return width setting circuit are omitted. An EOR gate group 400 is disposed in the former stage of the initial value input terminal init of the counter 81, and an EOR gate group 402 is disposed in the latter stage of the output terminal out. A reverse control signal reverslz is input to one of the input terminals of the ERO gate groups 400 and 402, and if the reverse control signal reverslz=H, the external column addresses caext0 to 3 are reversed by the EOR gate group 400, and are input to the counter 81, and the counter output is reversed by the EOR gate group 402, and is output as the internal column addresses caint0 to 3. If the reverse control signal reverslz=L then the EOR gate groups 400 and 402 output the other input signal without reverse.

In other words, if the reverse control signal reverslz=H, then 0000, which is the reversal of the external column address caext0 to 3=1111, for example, is set in the counter as the initial value, and the counter 81 sequentially increments from 0000 synchronizing with the count control signal countlz, and a 4-bit address generated by reversing the output value of the counter 81 is output as the internal column addresses caint0 to 3. Therefore when the external column addresses caext0 to 3=1111, the internal column addresses caint0 to 3 are counted down in the reverse direction 1111 to 0000 by the reversal control.

The address generation unit control circuit 88, which has the EOR gate groups 400 and 402, can set the count directions of the lower and upper address generation units to either forward or reverse. Therefore even if the direction of the vector address VA is in the reverse direction of the column addresses, the column address control unit can sequentially generate the internal column addresses in the reverse direction corresponding to the burst mode.

Figure 41:
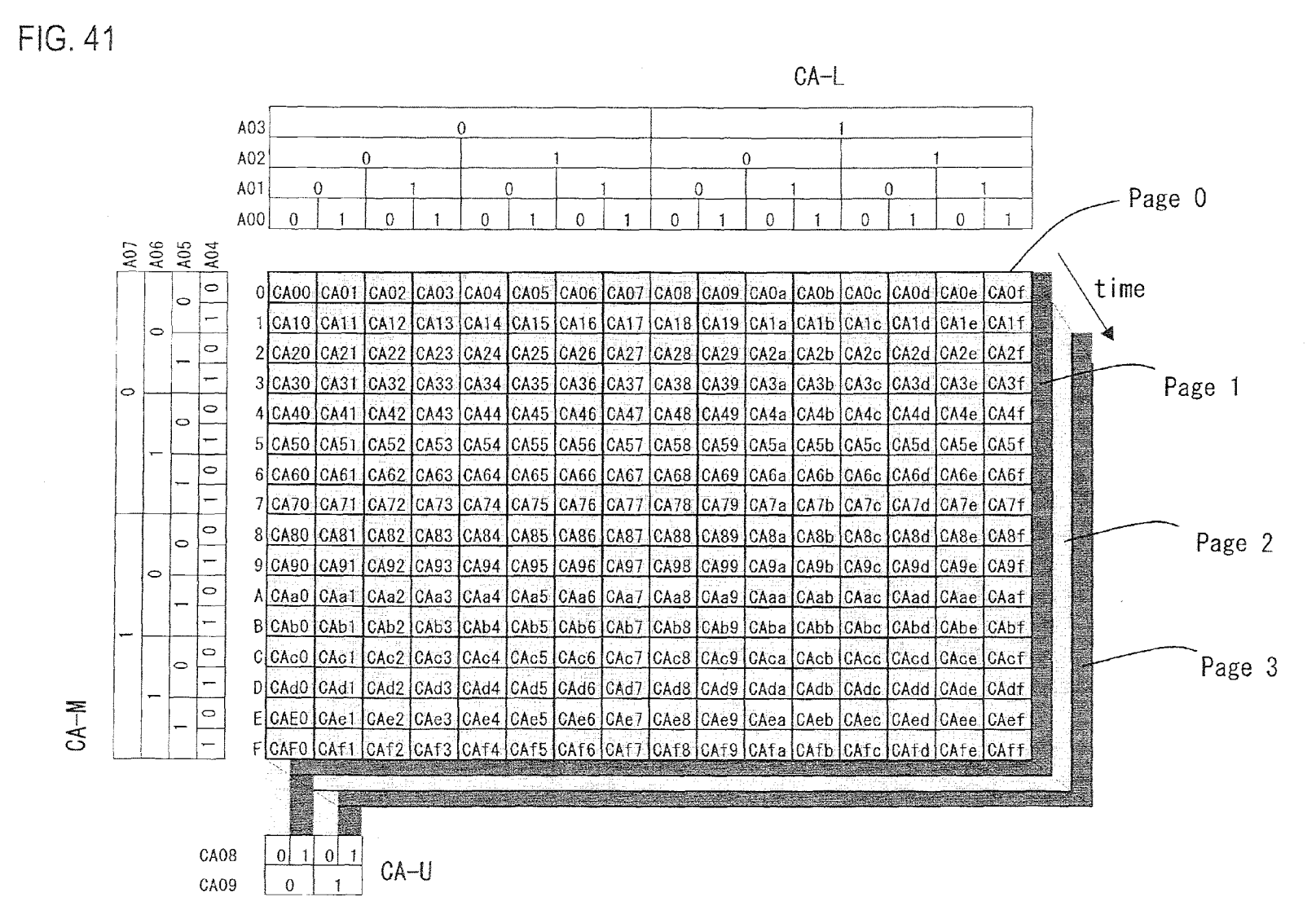

FIG. 41 is a diagram depicting an example of a memory map having a time axis. In the description on the above embodiment, the memory map that stores image data, which is two-dimensionally arrayed data, in one page area, as shown in FIG. 7 for example, was used. In this case, the column address control unit is constituted by parting the column addresses into low and upper portions, so as to enable scanning access in an arbitrary direction for a two-dimensional space, which has a horizontal direction and a vertical direction.

In the present embodiment, a number of partitions of the column address is not limited to two, but may be three or more. FIG. 41 is an example when the number of partitions of the column address is three. The lower column address CA-L (A00 to A03) and the medium column address CA-M (A04 to A07) are corresponded to the horizontal direction and the vertical direction of the two-dimensional array data, and the upper column address CA-U (A08 to A09) is corresponded to the time axis direction time. By parting the column address into three portions, the page areas Page0 to 3 in the two-dimensional array specified by the lower and medium column addresses are specified as four sets by the upper column addresses.

For example, in the case of compression of moving picture data, the data is not only compressed within a frame, but is also compressed in the time axis direction. Recently interpolation frame are added between the frames of a 60 frames/sec. original image data, so that images exhibit more beauty. In such a case, a memory device, which performs access not only in the horizontal and vertical directions of the screen, but also in the time axis direction at high-speed, is required. In this case, it is effective to map the rectangular parallelopiped space, which includes the time axis direction, in the memory when the image data is mapped to the page area of the memory. In other words, as FIG. 41 shows, CA08 and CA09 are added as addresses to specify the time axis direction, so that the column address control unit is constituted by three address generation units for the lower column addresses CA03 to CA00 which are allocated to the image in the horizontal direction, the medium column address CA07 to CA04 which are allocated to the image in the vertical direction, and the upper column addresses CA09 to CA08 which are allocated to the time axis direction. According to this column address control unit, an image can be burst-accessed in the time axis direction.

According to the above embodiments, two-dimensional array data, such as image data, can be burst-accessed in various directions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

I claim:

1. A memory device, comprising:
a memory cell array which has a plurality of memory unit areas selected by an address, and stores two-dimensional array data in the plurality of memory unit areas;
an internal address control unit which inputs an external address, and generates an internal address configured to select the memory unit area based on the external address; and
a decoder which decodes the internal address to select the memory unit area, wherein
the plurality of memory unit areas store data arrayed in a first direction out of the matrix of the two-dimensional array data, based on a lower bit group of the internal address, and store data arrayed in a second direction out of the matrix of the two-dimensional array data, based on an upper bit group of the internal address, and
the internal address control unit comprises a lower address generation unit configured to generate the lower bit group of the internal address, an upper address generation unit configured to generate the upper bit group of the internal address, and an address generation unit control circuit configured to control the operation of the lower address generation unit and the upper address generation unit based on a scanning direction control signal configured to control a scanning direction of the two-dimensional array data, and sequentially generates internal addresses corresponding to the scanning direction of the scanning direction control signal,
when the scanning direction control signal indicates the first direction, the address generation unit control circuit controls so that the lower address generation unit operates with priority to sequentially change lower addresses,
when the scanning direction control signal indicates the second direction, the address generation unit control circuit controls so that the upper address generation unit operates with priority to sequentially change upper addresses, and
when the scanning direction control signal indicates a diagonal direction which is different from the first and second directions, the address generation unit control circuit controls so that the lower and upper address generation units operates in parallel to sequentially change the lower and upper addresses in parallel.

2. The memory device according to claim 1, wherein the address has a row address and a column address, the memory cell array has a plurality of page areas which are selected by the row address, and each of the page areas has a plurality of memory unit areas which are selected by the column address, and
the internal address control unit generates an internal column address of the internal addresses.

3. The memory device according to claim 2, wherein
a page area selected by the row address performs active operation responding to an active command, and a read operation or write operation from or to the memory unit area corresponding to the column address is performed responding to a read command or write command which is supplied after the active command, and
in burst mode, the internal address control unit sequentially generates internal column addresses for the number of a burst length responding to the read command or the write command, and the read operation or the write operation is repeated in the memory unit area which is selected by the sequentially generated internal column address.

4. The memory device according to claim 3, wherein
when the scanning direction control signal indicates a diagonal direction, the address generation unit control circuit controls so that the lower address generation unit and the upper address generation unit operate in parallel, so as to sequentially generate upper internal column addresses and lower internal column addresses in parallel.

5. The memory device according to claim 4, wherein
the lower address generation unit and the upper address generation unit each have a counter circuit configured to change a count value responding to a counter control signal.

6. The memory device according to claim 5, wherein
the lower address generation unit and the upper address generation unit further comprise a lower step setting circuit and an upper step setting circuit, respectively, configured to input the counter control signal to one of the digits of the counter circuit according to the step control signal.

7. The memory device according to claim 6, wherein
the lower address generation unit and the upper address generation unit sequentially generate lower internal column addresses and upper internal column addresses corresponding to angle directions according to the scanning direction control signal and the step control signal.

8. The memory device according to claim 5, wherein
the lower address generation unit and the upper address generation unit further comprises a lower return width setting circuit and an upper return width setting circuit, respectively, configured to output an output signal of one of the digits of the counter circuit as a carry signal according to a return width control signal.

9. The memory device according to claim 5, wherein
in the counter circuit, a column address supplied from the outside is set as an initial value, and the lower and higher internal column addresses are sequentially generated by changing the count value responding to a count control signal by the number of the burst length.

10. The memory device according to claim 3, wherein
if the scanning direction data indicates the first or second direction, the address generation unit control circuit controls so that the lower address generation unit and the upper address generation unit operate in series,
if the scanning direction data indicates the first direction, the address generation unit control circuit controls so that the lower address generation unit sequentially generates lower internal column addresses responding to a clock, and the upper address generation unit sequentially generates upper internal column addresses responding to a carry signal which is generated by the lower address generation unit, and if the scanning direction data indicates the second direction, the address generation unit control circuit controls so that the upper address generation unit sequentially generates upper internal column addresses responding to the clock, and the lower address generation unit sequentially generates lower internal column addresses responding to the carry signal which is generated by the upper address generation unit.

11. The memory device according to claim 3, wherein the lower address generation unit and the upper address generation unit each have a counter circuit configured to change a count value responding to a counter control signal, and have a lower return width setting circuit and an upper return width setting circuit, respectively, configured to output an output signal for one of the digits of the counter circuit as a carry signal according to a return width control signal, and in the case of accessing a rectangular area which has a plurality of memory unit areas in two directions respectively, the lower or upper address generation unit repeats the generation of internal column addresses with a return width, which is set according to the return width control signal, responding to the read command or write command and an external column address.

12. The memory device according to claim 3, wherein the lower address generation unit and the upper address generation unit each have a counter circuit configured to change a count value responding to a counter control signal, and the lower address generation unit and the upper address generation unit have a gate group which, responding to a reverse control signal, reverses a count initial value and supplies the reversed count initial value to the counter circuit, and reverses a count value of the counter circuit and outputs the count value.

13. The memory device according to claim 1, based on the scanning direction control signal configured to control a plurality of scanning directions including at least the diagonal direction of the two-dimensional array data, the internal address control unit sequentially generates internal addresses corresponding to the scanning directions.

14. A memory controller configured to control a memory device including, a memory cell array which has a plurality of memory unit areas selected by an address, and stores two-dimensional array data in the plurality of memory unit areas;

an internal address control unit which inputs an external address, and generates an internal address configured to select the memory unit area based on the external address; and a decoder which decodes the internal address to select the memory unit area, wherein the plurality of memory unit areas store data arrayed in a first direction out of the matrix of the two-dimensional array data, based on a lower bit group of the internal address, and store data arrayed in a second direction out of the matrix of the two-dimensional array data, based on an upper bit group of the internal address, and the internal address control unit comprises a lower address generation unit configured to generate the lower bit group of the internal address, an upper address generation unit configured to generate the upper bit group of the internal address, and an address generation unit control circuit configured to control the operation of the lower address generation unit and the upper address generation unit based on a scanning direction control signal configured to control a scanning direction of the two-dimensional array data, and sequentially generates internal addresses corresponding to the scanning direction of the scanning direction control signal, when the scanning direction control signal indicates the first direction, the address generation unit control circuit controls so that the lower address generation unit operates with priority to sequentially change lower addresses, when the scanning direction control signal indicates the second direction, the address generation unit control circuit controls so that the upper address generation unit operates with priority to sequentially change upper addresses, and when the scanning direction control signal indicates a diagonal direction which is different from the first and second directions, the address generation unit control circuit controls so that the lower and upper address generation units operates in parallel to sequentially change the lower and upper addresses in parallel, the memory controller comprising:

a burst direction determination unit which inputs positional coordinates, vertical and horizontal lengths and inclination configured to specify an access target rectangular area, and generates the scanning direction control signal;

a command issuing unit which generates a control command and outputs the control command to the memory device; and an address issuing unit which generates the external address, and outputs the external address to the memory device, wherein the scanning direction control signal is output to the memory device.

15. The memory controller according to claim 14, wherein the burst direction determination unit generates the scanning direction control signal, in which a vertical or horizontal direction corresponding to the vertical or horizontal lengths whichever longer, is regarded as the scanning direction.

* * * * *